(12) United States Patent
Satou et al.

(10) Patent No.: US 8,192,898 B2
(45) Date of Patent: Jun. 5, 2012

(54) COMPOSITION FOR FLUORINE-CONTAINING VOLUME HOLOGRAPHIC DATA RECORDING MATERIAL AND FLUORINE-CONTAINING VOLUME HOLOGRAPHIC DATA RECORDING MEDIA MADE OF SAME

(75) Inventors: Kazuyuki Satou, Settsu (JP); Makoto Hanazawa, Settsu (JP); Kazuko Aoki, Settsu (JP)

(73) Assignee: Daikin Industries, Ltd., Osaka (JP)

( * ) Notice: Subject to any disclaimer, the term of this patent is extended or adjusted under 35 U.S.C. 154(b) by 304 days.

(21) Appl. No.: 12/593,893

(22) PCT Filed: Mar. 26, 2008

(86) PCT No.: PCT/JP2008/055715
§ 371 (c)(1),
(2), (4) Date: Sep. 29, 2009

(87) PCT Pub. No.: WO2008/123303
PCT Pub. Date: Oct. 16, 2008

(65) Prior Publication Data
US 2010/0112460 A1    May 6, 2010

Related U.S. Application Data

(60) Provisional application No. 60/981,266, filed on Oct. 19, 2007.

(30) Foreign Application Priority Data

Mar. 30, 2007   (JP) ................................ 2007-094001
Aug. 27, 2007   (JP) ................................ 2007-219604

(51) Int. Cl.
*G03H 1/02* (2006.01)

(52) U.S. Cl. .......... 430/1; 430/2; 430/281.1; 430/280.1; 359/3

(58) Field of Classification Search .................. None
See application file for complete search history.

(56) References Cited

U.S. PATENT DOCUMENTS

| | | | | | |
|---|---|---|---|---|---|
| 4,963,471 | A | * | 10/1990 | Trout et al. | ................ 430/282.1 |
| 5,470,662 | A | * | 11/1995 | Weber et al. | ................ 428/421 |
| 5,712,355 | A | * | 1/1998 | Jones | ........................ 526/254 |
| 5,776,634 | A | | 7/1998 | Ohkuma et al. | |

(Continued)

FOREIGN PATENT DOCUMENTS

EP   1 026 546 A1   8/2000

(Continued)

*Primary Examiner* — Martin Angebranndt
(74) *Attorney, Agent, or Firm* — Sughrue Mion, PLLC

(57) ABSTRACT

The present invention provides a fluorine-containing volume holographic data recording material making it unnecessary to provide a step of eliminating a specific solvent even in the case of a thick film, and having high hologram performance and good dynamic range. There is provided a composition comprising a base polymer (a), a liquid monomer (b) and a photo-initiator (c), wherein the base polymer (a) is an amorphous polymer comprising a fluorine-containing monomer as a structural unit and having a fluorine content of 26 to 80% by mass, the liquid monomer (b) comprises at least one liquid monomer (b1) initiating polymerization by means of activated species generated from the photo-initiator (c), the photo-initiator (c) is a compound causing the liquid monomer (b1) to initiate polymerization by exposure to light having excellent coherence and, and a refractive index of the liquid monomer (b) is higher than an average refractive index of a mixture of the base polymer (a) and the photo-initiator (c).

9 Claims, 6 Drawing Sheets

U.S. PATENT DOCUMENTS

| | | |
|---|---|---|
| 5,869,210 A | 2/1999 | Ohkuma et al. |
| 6,103,454 A | 8/2000 | Dhar et al. |
| 6,482,551 B1 | 11/2002 | Dhar et al. |
| 2003/0157414 A1 | 8/2003 | Dhal et al. |
| 2004/0047060 A1* | 3/2004 | Araki et al. ............... 359/883 |
| 2004/0186216 A1* | 9/2004 | Satoh et al. ............... 524/502 |
| 2005/0004253 A1* | 1/2005 | Araki et al. ............... 522/178 |
| 2005/0265685 A1 | 12/2005 | Ohashi et al. |
| 2006/0008652 A1* | 1/2006 | Araki et al. ............... 428/421 |
| 2007/0184353 A1 | 8/2007 | Satou et al. |
| 2008/0108767 A1* | 5/2008 | Sato et al. ............... 526/240 |
| 2010/0119957 A1* | 5/2010 | Satou et al. ............... 430/2 |

FOREIGN PATENT DOCUMENTS

| | | |
|---|---|---|
| JP | 05-181271 A | 7/1993 |
| JP | 08-272284 A1 | 10/1996 |
| JP | 11-007230 A | 1/1999 |
| JP | 11-352303 A | 12/1999 |
| JP | 2000-172154 A | 6/2000 |
| JP | 2001-523842 A | 11/2001 |
| JP | 2005-097371 * | 4/2005 |
| JP | 2006-002132 A | 1/2006 |
| WO | 2004/016689 A1 | 2/2004 |
| WO | 2005/078532 A1 | 8/2005 |

* cited by examiner

COMPOSITION FOR FLUORINE-CONTAINING VOLUME HOLOGRAPHIC DATA RECORDING MATERIAL AND FLUORINE-CONTAINING VOLUME HOLOGRAPHIC DATA RECORDING MEDIA MADE OF SAME

CROSS REFERENCE TO RELATED APPLICATION

This application claims benefit under 35 U.S.C. §119(e) of U.S. Provisional Application No. 60/981,266 filed Oct. 19, 2007.

TECHNICAL FIELD

The present invention relates to a composition for fluorine-containing volume holographic data recording material comprising a fluorine-containing polymer as a base polymer and being excellent in refractive index modulation characteristics and to a fluorine-containing volume holographic data recording medium made of the composition.

BACKGROUND ART

Volume of distribution of digital data contents is increasing by leaps and bounds as a result of recent spreading of internet system and starting of ground wave digital broadcasting service mainly offering high vision image programs. Volume of digital data has reached 1,644 peta-byte in 2006 on a worldwide scale and are increasing at a rate of 30% per annum, and 92% thereof is accumulated in digital devices. In the optical disc industry, "heat assist", "pattern media" and "vertical magnet recording system" are proposed in addition to "holographic system" as technology for data storage exceeding 100 tera-byte/$cm^2$. However, since an important point for practical use is "height of transfer rate", holographic optical memory is expected as a candidate of a next-generation optical disk.

In the next-generation recording media, page type memory system, especially holographic recording has been proposed as a system replacing conventional memory devices and recently the spotlight of attention is focused upon it since it is a system having high memory capacity and enabling random access and high speed transfer. This holographic recording is explained in detail in some references (for example, refer to Hans J. Coufal, et al. "Holographic Data Storage (Springer Series in Optical Sciences, Vol. 76" Springer-Verlag GmbH & Co. KG, August (2000)).

In this holographic recording system, for example, there are proposed a recording method using a holographic recording medium having transparent substrates arranged at both sides of a holographic recording layer (for example, refer to U.S. Pat. No. 5,719,691) and a recording method using a holographic recording medium having a holographic recording layer provided with a reflection surface at one side thereof (for example, refer to JP2002-123949A).

The basic theory of such holographic recording media is to record data by holographic exposure to change a refractive index of the inside of a holographic recording layer of the media and to reconstruct a change in refractive index in the media, thus reconstructing the data For this holographic recording layer, there are proposed various materials such as a material using an inorganic material (for example, refer to G.B Patent No. 9,929,953), a compound undergoing structural isomerization by means of light (for example, refer to JP10-340479A) and a material utilizing diffusion polymerization of a photo-polymer (for example, refer to U.S. Pat. No. 4,942,112).

In volume holographic material generally using a photo-polymer undergoing photo-polymerization, its holographic recording mechanism is such that upon incidence of interference light in a material, a polymerization initiator is activated in an area receiving high intensity of light, thereby initiating photo-polymerization. In the area receiving high intensity of light, monomers are consumed by the polymerization, and on the contrary, monomers in an area receiving low intensity of light are diffused and transferred toward the area receiving high intensity of light. As a result, a difference in monomer density is said to be generated by a difference in intensity of light, thus resulting in a difference in refractive index and forming a hologram (for example, refer to W. S. Colburn, K. H. Hains: Appl. Opt., 10, 1636 (1971)).

For example, photo-polymers comprising a thermoplastic binder resin, a photo-radically polymerizable monomer and a photo-initiator were proposed by Du Pont and a part of them has been put into practical use.

In these photo-polymers, a hologram is formed by a difference in refractive index between the low refractive index binder resin and the high refractive index photo-polymerizable monomer having aromatic ring, and as a result, hologram performance such as high diffraction efficiency is exhibited.

However, while monomers easily move at exposure of interference light and degree of refractive index modulation is increased, there arises a problem with heat resistance and mechanical properties since a thermoplastic resin having low glass transition temperature is used, and a solvent need be used in order to decrease viscosity of the composition at coating on a substrate. Accordingly, the solvent must be completely removed after the coating, and there is a limit in a thickness of a photo-sensitive film. The thickness is up to about 100 μm.

When the film is thick, in the case of inferior compatibility of the binder polymer with the monomer, there is significant limit in practical use due to remarkable light scattering property and large polymerization shrinkage, which is a problem to be solved.

D. J. Lougnot introduced an example of the use of a monomer mixture on volume hologram material in "Photopolymer Recording Materials for Holography Some recent developments", SPIE, pp. 10-22 (1993). One of the monomers is a tetra-functional monomer and is high in reactivity, and is polymerized at pre-curing step to form a matrix.

In "Photopolymer Recording Materials for Holography Some recent developments", SPIE, pp. 10-22 (1993), pre-curing is conducted by direct photo-absorption using deep-UV exposure because of difficulty in preparation due to lack of a photo-initiator necessary for hologram recording. As a result, the obtained holographic medium is formed from a matrix host comprising a photo-reactive polymer and a photo-initiator. A reported maximum thickness of a hologram film is 100 μm.

On the other hand, Japanese Patent No. 3330854 discloses a polyfunctional oligomer/monomer mixture having reactivity of the same level and comprising a polyfunctional oligomer having a polyether trunk chain and a molecular weight of not less than 1,000 for the purposes of forming a thick film without using a solvent and decreasing light scattering property.

The hologram matrix is polymerized in-situ, but is formed by crosslinking the polyfunctional oligomer by setting pre-curing conditions so that a part of mono-functional photo-reactive monomers should remain unreacted, which differs from conventional method. Accordingly, a photo-initiator necessary for hologram recording and 80% of monomers are consumed beforehand at a pre-curing step, thereby leading to a demerit that monomers necessary for actual recording are lacking. Also, there are demerits that a speed of diffusion and transfer of monomers in three-dimensional polymer matrix formed in the pre-curing step is slow and sensitivity thereof is inferior. For that reason, a minimum distance of shift hologram multiplexed recording in the optical data recording medium is up to 3 μm.

When using a fluorine-containing material for a base polymer, in general, commercially available fluorine-containing materials have demerits that lowering of refractive index by introduction of fluorine to the base polymer which is a primary purpose is insufficient due to lowering of compatibility as fluorine content is increased; a lot of monomers cannot be contained; and inferior recording sensitivity and high polymerization shrinkage are caused because of light scattering property due to inferior compatibility and also because the materials have no crosslinkable gel structure. This is described, for example, in Japanese Patent No. 2625028 as that "When fluorine is present in a binder, a refractive index of the polymer is lowered, thereby imparting refractive index modulation property to a film and hologram subjected to image recording. Degree of refractive index modulation increases as the fluorine content increases, but the fluorine content is limited in order not to make the film opaque. Accordingly, the representative fluorine content is within a range from about 3% to about 25% though an effect of fluorine content can be achieved even when the fluorine content is as low as 1%".

There are known other fluorine-containing polymers (Japanese Patent No. 3370762, JP8-241026A and JP8-272284A), but those polymers have similar demerits. Also, since a specific solvent is used for those polymers when forming a hologram film, a thick recording film cannot be obtained.

Example of using no specific solvent is referred to in JP2003-302726A, in which a fluorine-containing oligomer/monomer mixture having perfluoroether chain is disclosed. However, a speed of diffusion and transfer of monomers in a matrix is slow, and recording sensitivity is lacking.

Accordingly, inherent functions of fluorine are not exhibited.

DISCLOSURE OF INVENTION

In the case of a fluorine-containing amorphous polymer being compatible with each hologram components without using a specific solvent and having a crosslinkable gel structure of low refractive index, a viscous photo-sensitive solution being convenient for preparing not only a thin film but also a thick film without using a specific solvent can be formed and conventional problems can be solved. As a result, even in the case of a thick film, only by coating the solution or interposing it between substrates, a step for removing a specific solvent is unnecessary, and a composition for fluorine-containing volume holographic data recording material and fluorine-containing volume holographic data recording medium having high hologram performance and satisfactory dynamic range can be obtained.

In addition, since it is easy to make the fluorine content of material higher than that of conventional materials, a difference in refractive index after photo-recording can be increased and as a result, recording sensitivity can be greatly improved. Further, by the improvement in recording sensitivity, an amount of spatial shift distance (crosstalk) can be made smaller and as compared with conventional recording materials, it is possible to conduct high density recording of as large as 10 times in linear direction and about several hundred times in in-plane recording. As a result, recording and reconstruction can be carried out even when an amount of spatial shift distance on the optical recording medium is 0.3 μm while an amount of spatial shift distance for conventional recording is 3 μm.

In order to achieve such objects, the present inventors have made intensive studies and as a result, have found that it is possible to obtain an ideal composition for fluorine-containing volume holographic data recording material being compatible with each component even without using a solvent, being free from opaqueness even when increasing a fluorine content and lowering a refractive index of a base polymer, having high recording sensitivity and enabling high density recording.

The present invention relates to a composition which is used for fluorine-containing volume holographic data recording material for recording interference fringes generated by interference of light having excellent coherence as fringes having different refractive indexes and comprises a base polymer (a), a liquid monomer (b) and a photo-initiator (c), wherein the base polymer (a) is an amorphous polymer comprising a fluorine-containing monomer as a structural unit and having a fluorine content of 26 to 80% by mass, the liquid monomer (b) comprises at least one liquid monomer (b1) initiating polymerization by means of active species generated from the photo-initiator (c), the photo-initiator (c) is a compound causing the liquid monomer (b1) to initiating polymerization by exposure to light having excellent coherence and, and a refractive index of the liquid monomer (b) is higher than an average refractive index of a mixture of the base polymer (a) and the photo-initiator (c).

It is preferable that the base polymer (a) is a polymer having cure site.

It is preferable that the base polymer (a) comprises a curable fluorine-containing polymer represented by the formula (1):

in which the structural unit M1 is a structural unit derived from a fluorine-containing ethylenic monomer and represented by the formula (2):

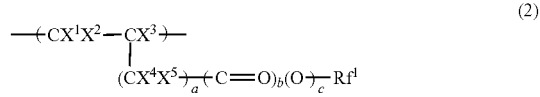

wherein $X^1$ and $X^2$ are the same or different and each is H or F; $X^3$ is H, F, $CH_3$ or $CF_3$; $X^4$ and $X^5$ are the same or different and each is H, F or $CF_3$; $Rf^1$ is an organic group in which 1 to 3 $Y^1$s ($Y^1$ is a monovalent organic group having 0 to 10 carbon atoms and hydroxyl group, a monovalent organic group having 2 to 10 carbon atoms and an ethylenic carbon-carbon double bond at its end or a monovalent organic group having 2 to 100 carbon atoms and 1 to 5 crosslinkable cyclic ether structures in which hydrogen atom may be replaced by fluorine atom) are bonded to a fluorine-containing alkyl group having 1 to 40 carbon atoms or a fluorine-containing alkyl group having 2 to 100 carbon atoms and ether bond; a is 0 or an integer of from 1 to 3; b and c are the same or different and each is 0 or 1, the structural unit A1 is a structural unit derived from a monomer copolymerizable with the fluorine-containing ethylenic monomer represented by the formula (2), the structural unit M1 is contained in an amount of from 0.1 to 100% by mole and the structural unit A1 is contained in an amount of from 0 to 99.9% by mole, and a number average molecular weight of the polymer is larger than 10,000 and not more than 1,000,000.

It is preferable that the base polymer (a) comprises a curable fluorine-containing polymer represented by the formula (3):

  (3)

in which the structural unit M1 is the same structural unit as in the above-mentioned formula (2), the structural unit A2 is a structural unit represented by the formula (4):

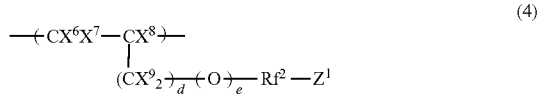  (4)

wherein $X^6$, $X^7$ and $X^8$ are the same or different and each is H or F; $X^9$ is H, F or $CF_3$; d is 0 or an integer of 1 to 2; e is 0 or 1; $Rf^2$ is a fluorine-containing alkylene group having 1 to 40 carbon atoms or a fluorine-containing alkylene group having 2 to 100 carbon atoms and ether bond; $Z^1$ is —OH, —$CH_2$OH, —COOH, carboxylic acid derivative, —$SO_3$H, sulfonic acid derivative, epoxy group, cyano group, oxetanyl group, unsaturated ester group or amino group, the structural unit A3 is a structural unit represented by the formula (5):

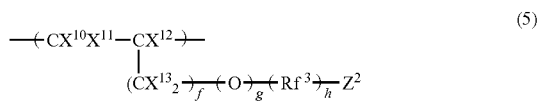  (5)

wherein $X^{10}$, $X^{11}$ and $X^{13}$ are the same or different and each is H or F; $X^{12}$ is H, F or $CF_3$; f, g and h are the same or different and each is 0 or 1; $Z^2$ is H, F or Cl; $Rf^3$ is a fluorine-containing alkylene group having 1 to 20 carbon atoms or a fluorine-containing alkylene group having 2 to 100 carbon atoms and ether bond, the structural unit M1 is contained in an amount of from 0 to 90% by mole, the structural unit A2 is contained in an amount of from 0 to 100% by mole and the structural unit A3 is contained in an amount of from 0 to 99.9% by mole, the total amount of the structural unit M1 and the structural unit A2 is from 0.1 to 100% by mole and a number average molecular weight of the polymer is larger than 10,000 and not more than 1,000,000.

It is preferable that the base polymer (a) comprises a curable fluorine-containing polymer represented by the formula (6):

  (6)

in which the structural unit M2 is a structural unit derived from a fluorine-containing ethylenic monomer and represented by the formula (7):

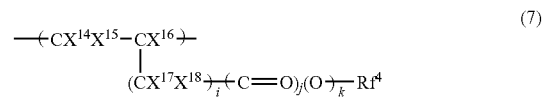  (7)

wherein $X^{14}$ and $X^{15}$ are the same or different and each is H or F; $X^{16}$ is H, F, $CH_3$ or $CF_3$; $X^{17}$ and $X^{18}$ are the same or different and each is H, F or $CF_3$; $Rf^4$ is an organic group in which 1 to 3 $Y^2$s ($Y^2$ is an organic group having 3 to 10 carbon atoms and represented by the formula (8):

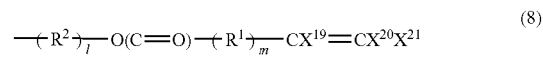  (8)

wherein $R^1$ and $R^2$ are the same or different and each is a divalent organic group which has 1 to 7 carbon atoms and may be replaced by fluorine atom; $X^{19}$ is H, F, $CH_3$ or $CF_3$; $X^{20}$ and $X^{21}$ are the same or different and each is H or F; l and m are the same or different and each is 0 or 1, an organic group having 2 to 100 carbon atoms and 1 to 5 crosslinkable cyclic ether structures represented by the formula (9):

  (9)

wherein $X^{22}$ and $X^{23}$ are the same or different and each is H, F, an alkyl group having 1 to 6 carbon atoms or a fluorine-containing alkyl group having 1 to 6 carbon atoms, an organic group having 3 to 100 carbon atoms and 1 to 5 crosslinkable cyclic ether structures represented by the formula (10):

  (10)

wherein Q is a monovalent or divalent organic group of monocyclic, polycyclic or heterocyclic structure having 3 to 100 carbon atoms, in which hydrogen atoms may be replaced by the above-mentioned $X^{22}$ or $X^{23}$, an organic group having 3 to 100 carbon atoms and 1 to 5 crosslinkable cyclic ether structures represented by the formula (11):

  (11)

wherein $X^{24}$ to $X^{28}$ are the same or different and each is H, F, an alkyl group having 1 to 6 carbon atoms or a fluorine-containing alkyl group having 1 to 6 carbon atoms, or an organic group having 3 to 100 carbon atoms and 1 to 5 crosslinkable cyclic ether structures represented by the formula (12):

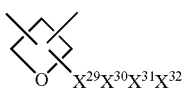

wherein $X^{29}$ to $X^{32}$ are the same or different and each is H, F, an alkyl group having 1 to 6 carbon atoms or a fluorine-containing alkyl group having 1 to 6 carbon atoms) are bonded to a fluorine-containing alkyl group having 1 to 40 carbon atoms or a fluorine-containing alkyl group having 2 to 100 carbon atoms and ether bond; i is 0 or an integer of 1 to 3; j and k are the same or different and each is 0 or 1, the structural unit A4 is a structural unit derived from a monomer copolymerizable with the fluorine-containing ethylenic monomer represented by the formula (7), the structural unit M2 is contained in an amount of from 0.1 to 100% by mole and the structural unit A4 is contained in an amount of from 0 to 99.9% by mole, and a number average molecular weight of the polymer is larger than 10,000 and not more than 1,000,000.

It is preferable that the liquid monomer (b) comprises two or more monomers and at least one of them is a liquid monomer having a polyether structure.

It is preferable that the liquid monomer (b) comprises two or more monomers and at least one of them is a polyfunctional monomer.

It is preferable that the base polymer (a) is a polymer having cure site in its side chain and the composition comprises a polyfunctional unsaturated compound undergoing crosslinking reaction with the above-mentioned cure site by means of heat.

It is preferable that the composition further comprises a dye sensitizer (e).

The present invention further relates to a fluorine-containing volume holographic data recording medium having an optical data recording layer between the first substrate and the second substrate, wherein the optical data recording layer has a thickness of not less than 188 μm and is formed using the above-mentioned fluorine-containing volume holographic data recording material.

BEST MODE FOR CARRYING OUT THE INVENTION

Figure 1:
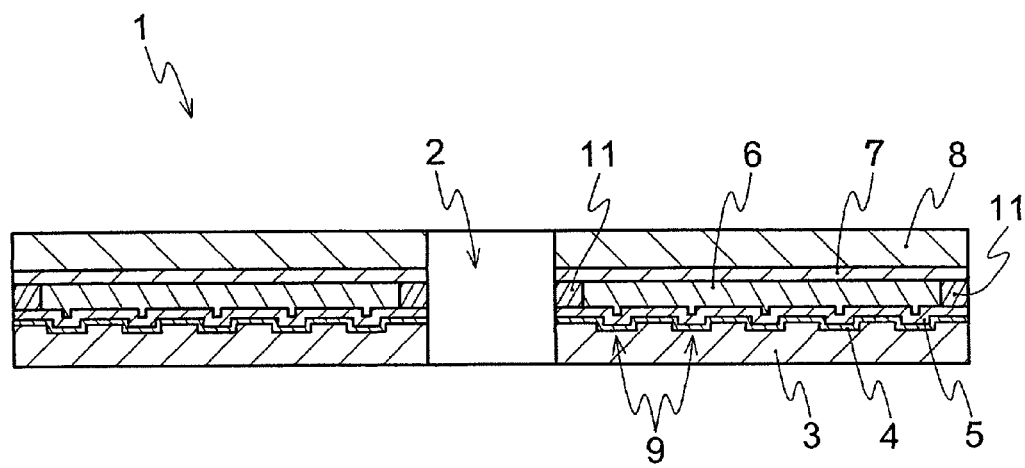
FIG. 1 is a cross-sectional view diagrammatically illustrating the optical disc according to the first embodiment of the present invention.

The composition of the present invention is used for fluorine-containing volume holographic data recording material for recording interference fringes generated by interference of light having excellent coherence as fringes having different refractive indexes and comprises a base polymer (a), a liquid monomer (b) and a photo-initiator (c).

Example of light having excellent coherence is light obtained by passing monochromatic light such as laser beam and sodium lamp light through a pin hole, and laser beam is preferred since its coherence is very high from the viewpoint of space and time.

The base polymer (a) comprises a structural unit of a fluorine-containing monomer since a difference in refractive index from other monomer can be made large. Further, the base polymer (a) is an amorphous polymer since its compatibility with other monomer, photo-initiator and dye sensitizer is good even when its fluorine content is high in the absence of a solvent and dynamic range M/# and recording sensitivity can be improved, and therefore, the base polymer differs from polytetrafluoroethylene (PTFE) and polyvinylidene fluoride (PVdF).

The fluorine content of base polymer (a) is from 26 to 80% by mass, preferably 30 to 65% by mass. When the fluorine content of base polymer (a) is lower, there is a problem that difference in a refractive index becomes small and diffraction efficiency, dynamic range M/# and recording sensitivity are lacking, and when the fluorine content of base polymer (a) is larger, there is a problem that a uniform interference fringes cannot be formed and phase separation of each hologram composition and light scattering occur, thereby generating recording noise.

The base polymer (a) may be a polymer having cure site or a polymer having no cure site, and from the viewpoint of improvement in recording sensitivity and good archival recording property and light resistance, a polymer having cure site is preferred.

Example of the preferred base polymer (a) is a curable fluorine-containing polymer represented by the formula (1):

(1)

in which the structural unit M1 is a structural unit derived from a fluorine-containing ethylenic monomer and represented by the formula (2):

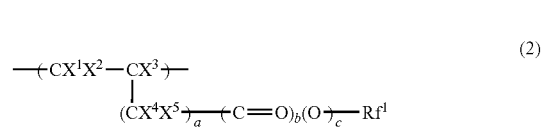

(2)

wherein $X^1$ and $X^2$ are the same or different and each is H or F; $X^3$ is H, F, $CH_3$ or $CF_3$; $X^4$ and $X^5$ are the same or different and each is H, F or $CF_3$; $Rf^1$ is an organic group in which 1 to 3 $Y^1$s ($Y^1$ is a monovalent organic group having 0 to 10 carbon atoms and hydroxyl group at its end, a monovalent organic group having 2 to 10 carbon atoms and an ethylenic carbon-carbon double bond at its end or a monovalent organic group having 2 to 100 carbon atoms and 1 to 5 crosslinkable cyclic ether structures in which hydrogen atom may be replaced by fluorine atom) are bonded to a fluorine-containing alkyl group having 1 to 40 carbon atoms or a fluorine-containing alkyl group having 2 to 100 carbon atoms and ether bond; a is 0 or an integer of from 1 to 3; b and c are the same or different and each is 0 or 1, the structural unit A1 is a structural unit derived from a monomer copolymerizable with the fluorine-containing ethylenic monomer represented by the formula (2), the structural unit M1 is contained in an amount of from 0.1 to 100% by mole and the structural unit A1 is contained in an amount of from 0 to 99.9% by mole, and a number average molecular weight of the polymer is larger than 10,000 and not more than 1,000,000.

The structural unit M1 is a structural unit derived from a fluorine-containing ethylenic monomer represented by the formula (13):

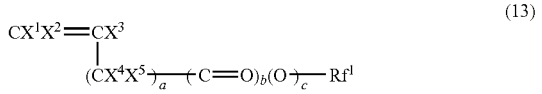

(13)

wherein $X^1$ to $X^5$, $Rf^1$ and a to c are as defined in the formula (2).

Namely, the base polymer is a homopolymer of the above-mentioned fluorine-containing ethylenic monomer having, in its side chain, hydroxyl group, or ethylenic carbon-carbon double bond being curable by reaction or a copolymer comprising the fluorine-containing ethylenic monomer as essential component.

It is preferable that at least one $Y^1$ is bonded to an end of $Rf^1$.

In the base polymer represented by the formula (1), the structural unit M1 is preferably M1-1, and M1-1 is a structural unit represented by the formula (14):

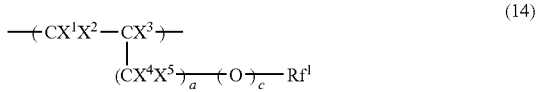

(14)

wherein $X^1$ to $X^5$, $Rf^1$, a and c are as defined in the formula (2).

M1-1 is a structural unit derived from a fluorine-containing ethylenic monomer represented by the formula (15):

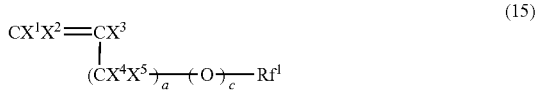

(15)

wherein $X^1$ to $X^5$, $Rf^1$, a and c are as defined in the formula (2).

In the fluorine-containing unsaturated compound represented by the formula (15), there is a fluorine-containing unsaturated compound represented by the formula (16):

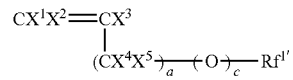

(16)

wherein $X^1$ to $X^5$, a and c are as defined in the formula (2); $Rf^{1'}$ is an organic group in which 1 to 3 $Y^3$s ($Y^3$ is a monovalent organic group having 0 to 10 carbon atoms and hydroxyl group at its end or a monovalent organic group having 2 to 10 carbon atoms and an ethylenic carbon-carbon double bond at its end) are bonded to a fluorine-containing alkyl group having 1 to 40 carbon atoms or a fluorine-containing alkyl group having 2 to 100 carbon atoms and ether bond, in which $Y^3$ is an organic group represented by the formula (17):

(17)

wherein $Y^4$ is an alkenyl group or fluorine-containing alkenyl group having hydroxyl group or ethylenic carbon-carbon double bond at its end and 2 to 5 carbon atoms; n is 0 or 1.

The polymer comprising the above-mentioned structural unit M1-1 is preferred since a refractive index is especially low and a refractive index can be made low even in the case of a homopolymer of the M1-1 and a polymer containing an increased amount of the structural unit M1-1.

Further, example of more preferred M1-1 is a structural unit M1-2, and the structural unit M1-2 is a structural unit represented by the formula (18):

(18)

wherein $Rf^1$ is as defined in the formula (2).

The structural unit M1-2 is a structural unit derived from a fluorine-containing ethylenic monomer represented by the formula (19):

(19)

wherein $Rf^1$ is as defined in the formula (2). In the fluorine-containing unsaturated compound represented by the formula (19), there is a fluorine-containing unsaturated compound represented by the formula (20):

(20)

wherein $Rf^{1'}$ is as defined in the formula (16).

Namely, the structural unit M1-2 is a structural unit of fluorine-containing allyl ether having hydroxyl group or ethylenic carbon-carbon double bond at its end and is preferred since not only a refractive index can be made low but also polymerizability is good, especially homopolymerizability and copolymerizability with a fluorine-containing ethylenic monomer are good.

Another preferred example of M1 is a structural unit M1-3, and the structural unit M1-3 is a structural unit represented by the formula (21):

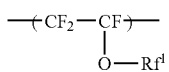
(21)

wherein $Rf^1$ is as defined in the formula (2).

The structural unit M1-3 is a structural unit derived from a fluorine-containing ethylenic monomer represented by the formula (22):

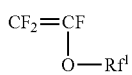
(22)

wherein $Rf^1$ is as defined in the formula (2). In the fluorine-containing unsaturated compound represented by the formula (22), there is a fluorine-containing unsaturated compound represented by the formula (23):

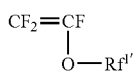
(23)

wherein $Rf^{1'}$ is as defined in the formula (16).

The structural unit M1-3 is a structural unit of fluorine-containing vinyl ether having hydroxyl group or ethylenic carbon-carbon double bond at its end and is preferred since not only a refractive index can be made low but also copolymerizability with a fluorine-containing ethylenic monomer is good.

In the base polymer (a) represented by the formula (1), $Y^1$ contained in the structural units M1, M1-1, M1-2 and M1-3 is a monovalent organic group having hydroxyl group at its end and 0 to 10 carbon atoms or an organic group having ethylenic carbon-carbon double bond at its end and 2 to 10 carbon atoms.

Namely, the hydroxyl group in $Y^1$ has ability of causing urethane reaction, epoxidation reaction and hydroxylation reaction, and the carbon-carbon double bond has ability of causing polycondensation reaction, cyclization reaction and addition reaction, and a cured (crosslinked) article can be given thereby. Specifically, for example, a cured (crosslinked) article can be given by contacting with isocyanates, radicals, cations or amides through polymerization reaction, condensation reaction or addition reaction occurs between the molecules of the curable fluorine-containing polymer of the present invention or between the curable fluorine-containing polymer and the curing (crosslinking) agent to be added as case demands.

In the curable fluorine-containing polymer represented by the formula (1), $Y^1$ is preferably represented by the formula (24):

$$—(O)_o—(C=O)_p—Y^5 \quad (24)$$

wherein $Y^5$ is an alkenyl group or fluorine-containing alkenyl group having hydroxyl group or ethylenic carbon-carbon double bond at its end and 2 to 5 carbon atoms; o and p are the same or different and each is 0 or 1, and $Y^5$ is preferably represented by the formula (25):

$$—CX^{33}=CX^{34}X^{35} \quad (25)$$

wherein $X^{33}$ is H, F, $CH_3$ or $CF_3$; $X^{34}$ and $X^{35}$ are the same or different and each is H or F, or the formula (26):

—OH, and is preferred since high curing reactivity is exhibited by contact with isocyanate, radical, cation or amide.

Preferred examples of $Y^4$ in the base polymers (a) represented by the formulas (17), (20) and (23) are the same as those of the above-mentioned $Y^5$.

Preferred examples of $Y^4$ and $Y^5$ are —CH=$CH_2$, —CF=$CH_2$, —C($CH_3$)=$CH_2$, —CF=$CF_2$, —C($CF_3$)=$CH_2$, —CH=CHF, —$CH_2$—OCOCH=$CH_2$, —$CH_2$—OH and the like.

Preferred examples of $Y^1$ and $Y^3$ are those represented by the formula (26):

$$—OCOCX^{33}=CX^{34}X^{35} \quad (26)$$

wherein $X^{33}$ to $X^{35}$ are as defined in the formula (25), the formula: —$CH_2$—OCOCH=$CH_2$ and the like, and those are preferred since curing reactivity by contact with radical is higher and a cured article can be obtained easily by photo-curing.

More preferred examples of $Y^1$ and $Y^3$ are —OCOCH=$CH_2$, —OCOC($CH_3$)=$CH_2$, —OCOCF=$CH_2$, —OCOC($CF_3$)=$CH_2$, —OCOCF=$CF_2$, —$CH_2$—OCOCH=$CH_2$ and the like.

Examples of other $Y^1$ are —CH=$CH_2$, —$CH_2$CH=$CH_2$, —OCH$_2$CH=$CH_2$, —OCH=$CH_2$, —OCF=$CF_2$, —COOCH=$CH_2$, —COOCH$_2$CH=$CH_2$, —CH(OH) $CH_2$OCOCX$^{36}$=$CH_2$ ($X^{36}$: H, F or $CH_3$), —CH (OCOCX$^{37}$=$CH_2$)$CH_2$OCOCX$^{38}$=$CH_2$ ($X^{37}$, $X^{38}$: H, F or $CH_3$), —CH(OH)$CH_2$OCH$_2$CH=$CH_2$, —CH (OCH$_2$CH=$CH_2$)$CH_2$OCH$_2$CH=$CH_2$, —$CH_2$—OCOCH=$CH_2$ and the like.

Examples of other $Y^3$ are —COCH=$CH_2$, —CH(OH) $CH_2$OCOCX$^{39}$=$CH_2$ ($X^{39}$: H, F or $CH_3$), —CH (OCOCX$^{40}$=$CH_2$)$CH_2$OCOCX$^{41}$=$CH_2$ ($X^{40}$, $X^{41}$: H, F or $CH_3$) and the like.

Particularly, those having a structure of —OCOCF=$CH_2$, —$CH_2$—OCOCH=$CH_2$ or —$CH_2$—OH are preferred since a refractive index can be made low and further, curing (crosslinking) reactivity is especially high, thus enabling a cured article to be obtained efficiently.

In the composition for fluorine-containing volume holographic data recording material of the present invention, the curable fluorine-containing polymer, in which the end of side chain of the base polymer (c) is acryl-modified with α-fluoroacrylate or acryl isocyanate, has a mechanism of trapping radicals derived from the photo-initiator, thereby making it possible to inhibit dark reaction at optical recording.

In the base polymer (a) represented by the formula (1), preferred examples of organic groups eliminating the groups of $Rf^1$, $Rf^{1'}$, $Y^1$, $Y^3$, $Y^4$ and $Y^5$ are fluorine-containing alkylene groups having 1 to 40 carbon atoms or fluorine-containing alkylene groups having 2 to 100 carbon atoms and ether bond especially when the number of functional groups $Y^1$, $Y^3$ and $Y^5$ is one. These organic groups have fluorine atom bonded to carbon atom, and generally are fluorine-containing alkylene groups or fluorine-containing alkylene groups having ether bond, in which fluorine atom and hydrogen atom or chlorine atom are bonded to carbon atom. Organic groups having larger number of fluorine atoms (having high fluorine content) is preferred, and the fluorine content is not less than 50%, preferably not less than 70% based on the molecular weight excluding oxygen atoms of the organic group excluding functional group, and perfluoroalkylene groups or perfluoroalkylene groups having ether bond are more preferred.

These organic groups are preferred since a refractive index of the curable fluorine-containing polymer can be made low, and can be maintained low even when a degree of curing (crosslinking density) is increased especially for the purpose of making hardness of a cured article higher.

Too large number of carbon atoms is not preferred because in the case of a fluorine-containing alkylene group, compatibility with hologram components is lowered and transparency of hologram is lowered, and also in the case of a fluorine-containing alkylene group having ether bond, hardness and mechanical properties of the polymer itself and a cured article are lowered. The number of carbon atoms of fluorine-containing alkylene group is preferably from 1 to 20, more preferably from 1 to 10. The number of carbon atoms of fluorine-containing alkylene group having ether bond is preferably from 2 to 30, more preferably from 2 to 20.

Preferred examples thereof are:

$$-(CF_2)_r-(CH_2)_s-, \quad -(CF_2CF)_r-(CH_2)_s-, \quad -(CH_2CF_2)_r-(CH_2)_s-, \quad (CH_2)_sC(CF_3)_2,$$
$$\underset{CF_3}{|}$$

$(CF_2)_sC(CF_3)_2$ (r: 1 to 10, s: 0 to 5), $\quad -(CF_2CF_2)_q-(CF_2CF)_r-(CH_2)_s-, \quad -(CF_2CF_2)_q-(CH_2CF_2)_r-(CH_2)_s-,$
$$\underset{CF_3}{|}$$

$-(CH_2CF_2)_q-(CF_2CF)_r-(CH_2)_s-, \quad -(CFCF_2O)_t-(CF_2O)_u-(CX^{44}_2CF_2CF_2O)_v-(CX^{45})_w-(CF)_x-(CH_2)_y-,$
$\underset{CF_3}{|} \qquad\qquad \underset{X^{42}}{|} \qquad\qquad\qquad\qquad\qquad\qquad\qquad \underset{X^{43}}{|}$ (q: 1 to 10, r: 1 to 10, s: 0 to 5), $-(CF_2CFO)_t-(CF_2O)_u-(CF_2CF_2CX^{10'}_2O)_v-CF_2(CF)_x-(CH_2)_y-$
$\underset{X^{42}}{|} \qquad\qquad\qquad\qquad\qquad\qquad \underset{X^{43}}{|}$ ($X^{42}$ and $X^{43}$: F or $CF_3$; $X^{44}$ and $X^{45}$: H or F; t+u+v: an integer of 1 to 30; w: 0 or 1; x and y: 0 or 1).

The structure of the structural unit M1 constituting the base polymer (a) used in the present invention and examples of the base polymer (a) are explained below.

Examples of preferred monomer providing the structural unit M1-2 are $CH_2=CFCF_2OCF(CF_3)Y^1$, $CH_2=CFCF_2OCF(CF_3)CH_2Y^1$, $CH_2=CFCF_2OCF(CF_3)CH_2OY^1$, $CH_2=CFCF_2O(CF(CF_3)CF_2O)_zCF(CF_3)Y^1$, $CH_2=CFCF_2O(CF(CF_3)CF_2O)_zCF(CF_3)CH_2Y^1$, $CH_2=CFCF_2O(CF(CF_3)CF_2O)_zCF(CF_3)CH_2OCH_2CHY^1CH_2Y^1$, $CH_2=CFCF_2O(CF_2CF_2O)_zCF_2Y^1$, $CH_2=CFCF_2O(CF_2CF_2O)_zCF_2CH_2Y^1$, $CH_2=CFCF_2O(CF_2CF_2CF_2O)_zCF_2CF_2Y^1$, $CH_2=CFCF_2O(CF_2CF_2CF_2O)_zCF_2CF_2CH_2Y^1$, $CH_2=CFCF_2O(CH_2CF_2CF_2O)_zCH_2CF_2Y^1$, $CH_2=CFCF_2O(CH_2CF_2CF_2O)_zCH_2CF_2CH_2Y^1$, $CH_2=CFCF_2O(CF_2CF_2)_zY^1$, $CH_2=CFCF_2O(CF_2CF(CF_3))_zCH_2Y^1$, and the like (z: an integer of 1 to 30), and more specifically there are $CH_2=CFCF_2O(CF(CF_3)CF_2O)_zCF(CF_3)CH_2OCOCX^{46}=CH_2$, $CH_2=CFCF_2O(CF(CF_3)CF_2O)_zCF(CF_3)CH_2OCH_2CH(OCOCX^{46}=CH_2)CH_2OCOCX^{46}=CH_2$, $CH_2=CFCF_2O(CF(CF_3)CF_2O)_zCF(CF_3)CH_2OCH=CH_2$, $CH_2=CFCF_2O(CF(CF_3)CF_2O)_zCF(CF_3)CH_2OCH_2CH(OCH=CH_2)OCH=CH_2$, $CH_2=CFCF_2O(CF(CF_3)CF_2O)_zCF=CF_2$, $CH_2=CFCF_2O(CF(CF_3)CF_2O)_zCF(CF_3)COOCH=CH_2$, $CH_2=CFCF_2O(CF(CF_3)CF_2O)_zCF(CF_3)CH_2OCH_2CH=CH_2$, $CH_2=CFCF_2O(CF(CF_3)CF_2O)_zCF(CF_3)CH_2OCH_2CH(OCH_2CH=CH_2)CH_2OCH_2CH=CH_2$, $CH_2=CFCF_2O(CF(CF_3)CF_2O)_zCF(CF_3)CRf^5Rf^6OCOCX^{46}=CH_2$, $CH_2=CFCF_2O(CF(CF_3)CF_2O)_zC(CH_2CH=CH_2)_2OCOCX^{46}=CH_2$, and the like, wherein $X^{46}$: H, $CH_3$, F or $CF_3$, $Rf^5$ and $Rf^6$: perfluoroalkyl group having 1 to 5 carbon atoms, z: 0 or an integer of 1 to 30.

Preferred examples of the base polymer (a) represented by the formula (20) are the same as the examples of the above-mentioned monomers providing the structural unit M1-2, in which $Y^1$ is replaced by $Y^3$.

More specifically, examples thereof are $CH_2=CFCF_2O(CF(CF_3)CF_2O)_zCF(CF_3)CH_2OCOCX^{46}=CH_2$, $CH_2=CFCF_2O(CF(CF_3)CF_2O)_zCF(CF_3)CH_2OCH_2CH(OCOCX^{46}=CH_2)CH_2OCOCX^{46}=CH_2$, $CH_2=CFCF_2O(CF(CF_3)CF_2O)_zCF(CF_3)CRf^5Rf^6OCOCX^{46}=CH_2$, $CH_2=CFCF_2O(CF(CF_3)CF_2O)_zCF(CF_3)C(CH_2CH=CH_2)_2OCOCX^{46}=CH_2$, and the like ($X^{46}$, $Rf^5$, $Rf^6$ z: as defined above).

Preferred examples of the monomer providing the structural unit M1-3 are $CF_2=CFOCF_2CF_2Y^1$, $CF_2=CFOCF_2CF_2CH_2Y^1$, $CF_2=CFOCF_2CF_2CH_2OCH_2CHCH_2Y^1$, $CF_2=CFOCF_2CF_2CH_2OCH_2CHY^1CH_2-Y^1$, $CF_2=CFO(CF_2CF(CF_3))_\alpha Y^1$, $CF_2=CFO(CF_2CF(CF_3)O)_\alpha CF_2CF_2CH_2Y^1$, $CF_2=CFO(CF_2CF(CF_3)O)_\alpha CF_2CF_2CH_2OCH_2CHY^1CH_2Y^1$ ($\alpha$: 1 to 30), $CF_2=CFO(CF_2)_3Y^1$, $CF_2=CFO(CF_2)_3CH_2Y^1$, $CF_2=CFOCF_2CF_2OCF_2Y^1$, $CF_2=CFOCF_2CF_2OCF_2CH_2Y^1$, $CF_2=CFOCF_2CF_2OCF_2CH_2OCH_2CHY^1CH_2Y^1$, $CF_2=CFOCF_2CF_2CH_2OCF_2CF_2Y^1$, $CF_2=CFOCF_2CF_2CH_2OCF_2CF_2CH_2Y^1$, and the like.

More specifically, there are

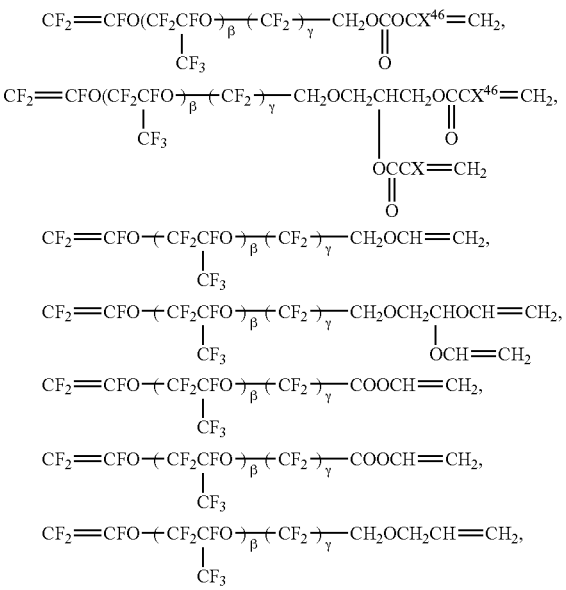

-continued $$CF_2=CFO+CF_2CFO)_\beta(CF_2)_\gamma-CH_2OCH_2CHCH_2OCH_2CH=CH_2,$$
$$\underset{CF_3}{|} \quad \underset{OCH_2CH=CH_2}{|}$$

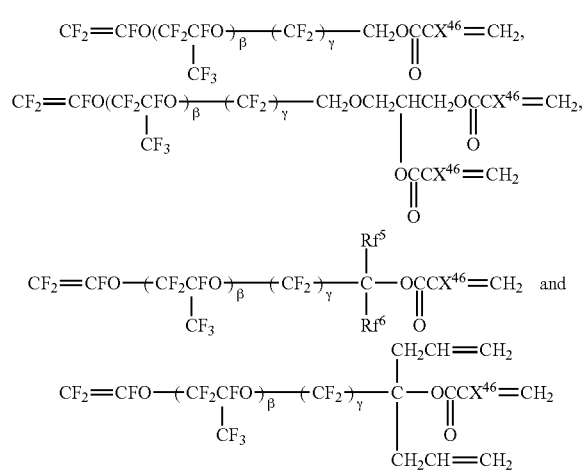

wherein $Rf^5$, $Rf^6$ and $X^{46}$: as defined above; β: 0 to 30; γ: 1 to 3).

Preferred examples of the base polymer (a) of the formula (23) are the same as the examples of the above-mentioned monomers providing the structural unit M1-3, in which $Y^1$ is replaced by $Y^3$.

More specifically, examples thereof are

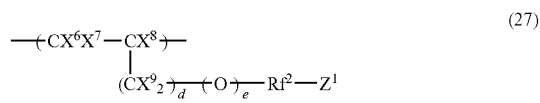

wherein $X^{46}$, $Rf^5$, $Rf^6$, β and γ are as defined above.

Preferred examples of monomers constituting the structural unit M1 of the curable fluorine-containing polymer of the present invention other than M1-2 and M1-3 are $CF_2=CFCF_2ORf^7Y^1$, $CF_2=CFCF_2ORf^7CH_2CHCH_2Y^1$, $CF_2=CFRf^7Y^1$, $CF_2=CFRf^7CH_2CHCH_2Y^1$, $CH_2=CHRf^7Y^1$, $CH_2=CHRf^7CH_2CHCH_2Y^1$, $CH_2=CHORf^7Y^1$, $CH_2=CHORf^7CH_2CHCH_2Y^1$, and the like ($Rf^7$: perfluoroalkyl group having 1 to 5 carbon atoms).

More specifically there are $CF_2=CFCF_2OCF_2CF_2CF_2Y^1$, $CF_2=CFCF_2OCF_2CF_2CF_2CH_2Y^1$, $CF_2=CFCF_2OCF_2CF(CF_3)Y^1$, $CF_2=CFCF_2OCF_2CF(CF_3)CH_2Y^1$, $CF_2=CFCF_2OCF_2CFCH_2OCH_2CHCH_2Y^1$, $CF_2=CFCF_2Y^1$, $CF_2=CFCF_2CH_2Y^1$, $CF_2=CFCF_2CH_2OCH_2CHCH_2Y^1$, $CH_2=CHCF_2CF_2CH_2CH_2Y^1$, $CH_2=CHCF_2CF_2Y^1$, $CH_2=CHCF_2CF_2CH_2Y^1$, $CH_2=CHCF_2CF_2CF_2CF_2Y^1$, $CH_2=CHCF_2CF_2CF_2CF_2CH_2Y^1$, $CH_2=CHCF_2CF_2CF_2CF_2CH_2OCH_2CHY^1CH_2Y^1$, $CH_2=CHOCH_2CF_2CF_2Y^1$, $CH_2=CHOCH_2CF_2CF_2CH_2Y^1$, and the like.

In the base polymer (a) of the formula (16) of the present invention, preferred examples of the fluorine-containing unsaturated compound other than the compounds of the formula (20) and the formula (23) are the same as those of the above-exemplified monomers providing the structural unit M1 other than the structural units M1-2 and M1-3, in which $Y^1$ is replaced by $Y^3$.

In the base polymer (a) represented by the formula (1), the structural unit A1 is an optional component, and is not limited particularly as far as it is a monomer being copolymerizable with the structural units M1, M1-1, M1-2 and M1-3. The structural unit A1 may be properly selected depending on the targeted base polymer (a).

Examples thereof are the following structural units.

(1) Structural Unit (A1-1) Derived From Fluorine-Containing Ethylenic Monomer Having Functional Group This structural unit is preferred since hologram recording sensitivity can be improved and archival recording property and light fastness of the recorded data can be imparted while maintaining a low refractive index of the base polymer (a) and also since functions such as crosslinkability can be imparted. Preferred structural unit of the fluorine-containing ethylenic monomer having functional group is a structural unit represented by the formula (27):

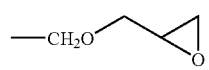

wherein $X^6$, $X^7$ and $X^8$ are the same or different and each is H or F; $X^9$ is H, F or $CF_3$; d is 0 or an integer of 1 or 2; e is 0 or 1; $Rf^2$ is a fluorine-containing alkylene group having 1 to 40 carbon atoms or a fluorine-containing alkylene group having 2 to 100 carbon atoms and ether bond; $Z^1$ is —OH, —$CH_2OH$, —COOH, carboxylic acid derivative, —$SO_3H$, sulfonic acid derivative, epoxy group, for example, cyano group, oxetanyl group, unsaturated ester group, amino group, the formula:

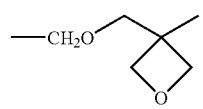

or the formula:

$$-CH_2O\diagup\hspace{-0.5em}\square\hspace{-0.5em}\diagdown O$$

and particularly preferred is a structural unit represented by the formula (28):

wherein $Rf^2$ and $Z^1$ are as defined in the formula (27).

More specifically, preferred examples thereof are structural units derived from fluorine-containing ethylenic monomers such as perfluoro-(1,1,9,9-tetrahydro-2,5-bistrifluoromethyl-3,6-dioxanonenol ($CH_2=CFCF_2OCF(CF_3)CF_2OCF(CF_3)CH_2OH$), $CH_2=CFCF_2O(CF(CF_3)CF_2O)_2CF(CF_3)CH_2OH$, $CH_2=CFCF_2O(CF(CF_3)CF_2O)_3CF(CF_3)$ $CH_2OH$, $CH_2=CFCF_2OCF(CF_3)CF_2OCF(CF_3)COOH$, $CH_2=CFCF_2O(CF(CF_3)CF_2O)_2CF(CF_3)COOH$, $CH_2=CFCF_2O(CF(CF_3)CF_2O)_3CF(CF_3)COOH$, $CH_2=CFCF_2OCF(CF_3)CF_2OCF(CF_3)CN$, $CH_2=CFCF_2O(CF(CF_3)CF_2O)_2CF(CF_3)CN$, $CH_2=CFCF_2O(CF(CF_3)CF_2O)_3CF(CF_3)CN$, $CH_2=CFCF_2OCF(CF_3)CF_2OCF(CF_3)H$, $CH_2=CFCF_2O(CF(CF_3)CF_2O)_2CF(CF_3)H$, $CH_2=CFCF_2O(CF(CF_3)CF_2O)_3CF(CF_3)H$, $CH_2=CFCF_2OCF(CF_3)CF_2OCF(CF_3)CH_2COOCH_3$, $CH_2=CFCF_2O(CF(CF_3)CF_2O)_2CF(CF_3)CH_2COOCH_3$, $CH_2=CFCF_2O(CF(CF_3)CF_2O)_3CF(CF_3)CH_2COOCH_3$, $CH_2=CFCF_2OCF(CF_3)CF_2OCF(CF_3)CH_2OCH_2CHOCH_2$, $CH_2=CFCF_2O(CF(CF_3)CF_2O)_2CF(CF_3)CH_2OCH_2CHOCH_2$, $CH_2=CFCF_2O(CF(CF_3)CF_2O)_3CF(CF_3)CH_2OCH_2CHOCH_2$, $CH_2=CFCF_2OCF(CF_3)Z^1$, $CH_2=CFCF_2OCF(CF_3)CF_2OCF(CF_3)Z^1$, $CH_2=CFCF_2O(CF(CF_3)CF_2O)_2CF(CF_3)Z^1$, $CH_2=CFCF_2OCH_2CF_2Z^1$, $CH_2=CFCF_2OCH_2CF_2CF_2OCF(CF_3)Z^1$, $CH_2=CFCF_2OCF_2CF_2OCF_2Z^1$, and $CH_2=CFCF_2O(CF_2CF_2O)_2CF_2Z^1$.

Also, preferred example is a structural unit represented by the formula (29):

(29)

wherein $Rf^2$ and $Z^1$ are as defined in the formula (27), and more specifically, examples thereof are structural units derived from monomers such as $CF_2=CFOCF_2CF(CF_3)OCF_2CF_2CH_2Z^1$, $CF_2=CFO(CF_2)_3Z^1$, $CF_2=CFO(CF_2)_3CH_2Z^1$, $CF_2=CFOCF_2CF_2OCF_2Z^1$, $CF_2=CFOCF_2CF_2OCF_2CH_2Z^1$, $CF_2=CFOCF_2CF_2CH_2OCF_2CF_2Z^1$, $CF_2=CFOCF_2CF_2CH_2OCF_2CF_2CH_2Z^1$, $CF_2=CFOCF_2CF(CF_3)OCF_2CF_2CH_2Z^1$, $CF_2=CFO(CF_2)_3Z^1$, $CF_2=CFO(CF_2)_3CH_2Z^1$, $CF_2=CFOCF_2CF_2OCF_2Z^1$, $CF_2=CFOCF_2CF_2OCF_2CH_2Z^1$, $CF_2=CFOCF_2CF_2CH_2OCF_2CF_2Z^1$, and $CF_2=CFOCF_2CF_2CH_2OCF_2CF_2CH_2Z^1$.

Examples of other fluorine-containing ethylenic monomers having functional group are $CF_2=CFCF_2ORf^1Z^1$, $CF_2=CFRf^1Z^1$, $CH_2=CHRf^1Z^1$, $CH_2=CHORf^1Z^1$, and the like ($Rf^1$ is as defined in the formula (2), and more specifically, there are $CF_2=CFCF_2OCF_2CF_2CF_2Z^1$, $CF_2=CFCF_2OCF_2CF_2CF_2CH_2Z^1$, $CF_2=CFCF_2OCF_2CF(CF_3)Z^1$, $CF_2=CFCF_2OCF_2CF(CF_3)CH_2Z^1$, $CF_2=CFCF_2Z^1$, $CF_2=CFCF_2CH_2Z^1$, $CH_2=CHCF_2CF_2CH_2CH_2Z^1$, $CH_2=CHCF_2CF_2Z^1$, $CH_2=CHCF_2CF_2CH_2Z^1$, $CH_2=CHCF_2CF_2CF_2Z^1$, $CH_2=CHCF_2CF_2CF_2CF_2CH_2Z^1$, $CH_2=CHOCH_2CF_2CF_2Z^1$, $CH_2=CHOCH_2CF_2CF_2CH_2Z^1$, and the like.

(2) Structural Unit (A1-2) Derived From Fluorine-Containing Ethylenic Monomer Having No Functional Group This structural unit is preferred since a low refractive index of the base polymer (a) can be maintained and further, hologram recording sensitivity can be improved and light fastness can be imparted. This structural unit is also preferred since viscosity characteristics and glass transition temperature of the base polymer (a) can be adjusted by selecting a monomer, and especially glass transition temperature can be made high by copolymerization with the structural unit M1.

The structural unit of the fluorine-containing ethylenic monomer is preferably one represented by the formula (30):

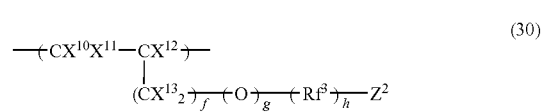

(30)

wherein $X^{10}$, $X^{11}$ and $X^{13}$ are the same or different and each is H or F; $X^{12}$ is H, F or $CF_3$; f, g and h are the same or different and each is 0 or 1; $Z^2$ is H, F or Cl; $Rf^3$ is a fluorine-containing alkylene group having 1 to 20 carbon atoms or a fluorine-containing alkylene group having 2 to 100 carbon atoms and ether bond.

Preferred examples thereof are structural units derived from monomers such as $CF_2=CF_2$, $CF_2=CH_2$, $CF_2=CFCl$, $CF_2=CFCF_3$, $CF_2=C(CF_3)_2$, $CF_2=CFO(CF_2)_\delta F$ ($\delta$: an integer of 1 to 5), $CH_2=C(CF_3)_2$, $CF_2=CFH$, $CF_2=CCl_2$, $CF_2=CFOCF_2CF(CF_3)OC_3F_7$, $CH_2=CFCF_2O(CF(CF_3)CF_2O)_\in CFHCF_3$ ($\in$: 0 to 10), $CH_2=CF(CF_2)_\in Z^2$ ($Z^2$ is as defined in the formula (30), $\in$: 1 to 10), $CH_2=CHOCH_2(CF_2)_\in Z^2$ ($Z^2$ is as defined in the formula (30), $\in$: 1 to 10) and $CH_2=CHOCH_2(CF_2)_\in Z^2$ ($Z^2$ is as defined in the formula (30), $\in$: 1 to 10).

(3) Fluorine-Containing Aliphatic Cyclic Structural Unit (A1-3)

Introduction of this structural unit is preferred since transparency can be increased, a refractive index can be lowered more, a fluorine-containing polymer having further higher glass transition temperature can be obtained, and higher recording sensitivity of hologram can be expected.

The fluorine-containing aliphatic cyclic structural unit is preferably a structural unit represented by the formula (31):

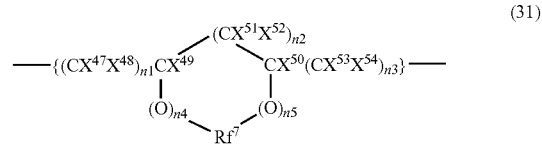

(31)

wherein $X^{47}$, $X^{48}$, $X^{51}$, $X^{52}$, $X^{53}$ and $X^{54}$ are the same or different and each is H or F; $X^{49}$ and $X^{50}$ are the same or different and each is H, F, Cl or $CF_3$; $Rf^7$ is a fluorine-containing alkylene group having 1 to 10 carbon atoms or a fluorine-containing alkylene group having 2 to 10 carbon atoms and ether bond; n2 is 0 or an integer of 1 to 3; n1, n3, n4 and n5 are the same or different and each is 0 or 1.

For example, there is a structural unit represented by the formula (32):

(32)

wherein $Rf^7$, $X^{49}$ and $X^{50}$ are as defined above.

Specifically, there are:

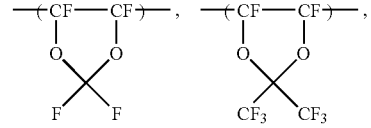

-continued

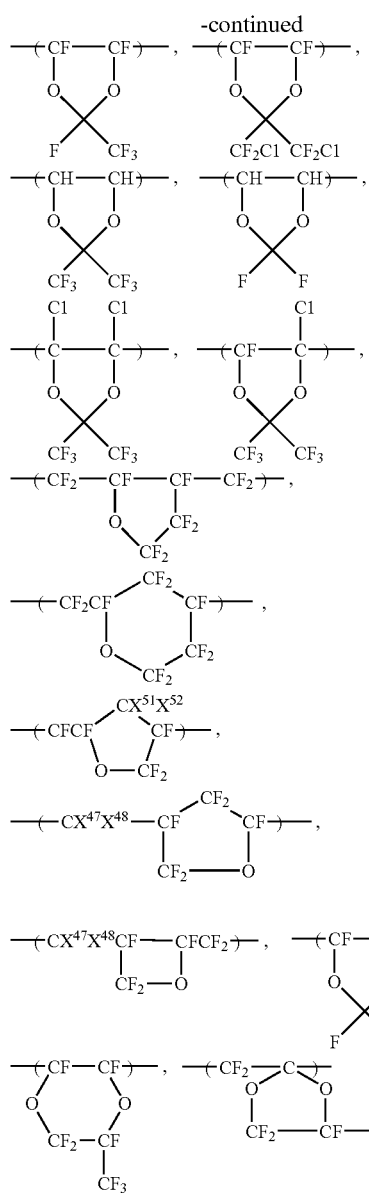

and the like.

(4) Structural Unit Derived From Non-Fluorine-Containing Ethylenic Monomer

A structural unit derived from a non-fluorine-containing ethylenic monomer may be introduced to an extent not to impair a refractive index of the fluorine-containing base polymer (not to increase a refractive index).

The introduction of this structural unit is preferred since compatibility with other monomers is further improved and compatibility with photo-initiator, dye, additives, for example, sensitizer, plasticizer, thermal stabilizer, brightening agent, ultraviolet absorber, polymerization inhibitor, chain transfer agent, bleaching agent, and a crosslinking agent to be added as case demands is improved.

Examples of the non-fluorine-containing ethylenic monomer are

α-Olefins:

Ethylene, propylene, butene, vinyl chloride, vinylidene chloride, etc.

Vinyl Ether or Vinyl Ester Monomers:
$CH_2$=CHOR, $CH_2$=CHOCOR, (R: hydrocarbon group having 1 to 20 carbon atoms), etc.

Allyl Monomers:
$CH_2$=CHCH$_2$Cl, $CH_2$=CHCH$_2$OH, $CH_2$=CHCH$_2$COOH, $CH_2$=CHCH$_2$Br, etc.

Allyl Ether Monomers:
$CH_2$=CHCH$_2$OR (R: hydrocarbon group having 1 to 20 carbon atoms), $CH_2$=CHCH$_2$OCH$_2$CH$_2$COOH,

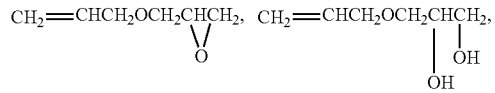

etc.

Acrylic or Methacrylic Monomers:
Acrylic acids, methacrylic acids, acrylic esters, methacrylic acid esters, maleic anhydride, maleic acid, maleic acid esters, etc.

(5) Structural Units Derived From Alicyclic Monomers

A structural unit of an alicyclic monomer may be introduced as a component copolymerizable with the structural unit M1, more preferably as the third component in addition to the structural unit M1 and the structural unit of the above-mentioned fluorine-containing ethylenic monomer or non-fluorine-containing ethylenic monomer ((3) or (4) above), thereby making a glass transition temperature and viscosity high.

Examples of the alicyclic monomer are norbornene derivatives represented by:

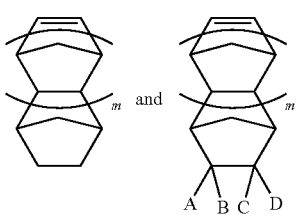

wherein m is 0 or an integer of from 1 to 3; A, B, C and D are the same or different and each is H, F, Cl, COOH, CH$_2$OH or a perfluoroalkyl group having 1 to 5 carbon atoms, and alicyclic monomers such as:

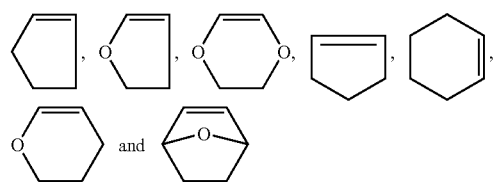

and derivatives thereof in which a substituent is introduced.

In the base polymer (a), various combinations and proportions of the structural unit M1 (M1-1, M1-2 or M1-3) and the structural unit A1 can be selected from the above-mentioned examples depending on intended applications, physical properties (especially glass transition temperature, viscosity, etc.), functions (recording sensitivity, light fastness and transparency) and the like.

The base polymer (a) contains the structural unit M1 (M1-1, M1-2 or M1-3) as an essential component and is characterized in that the structural unit M1 itself has functions of maintaining a low refractive index and imparting transparency and functions of being capable of imparting a difference in a refractive index, transparency, recording sensitivity and light fastness to the fluorine-containing volume holographic data recording medium by the hologram recording. Accordingly, even if the crosslinkable fluorine-containing polymer which is the base polymer of the present invention contains a larger amount of the structural unit M1 or in the extreme case, even if the polymer consists of the structural unit M1 (100% by mole), the above-mentioned physical properties can be maintained. Further, a holographic data recording medium having a high curing (crosslinking) density, high recording sensitivity and excellent light fastness and archival recording property can be obtained.

Further, in the case of the copolymer comprising the structural unit M1 of the present invention and the structural unit A1 of a monomer copolymerizable therewith, when the structural unit A1 is selected from the above-mentioned examples, there can be obtained the polymer providing a holographic data recording medium having higher viscosity (high glass transition temperature) and satisfactory transparency.

In the copolymer comprising the structural unit M1 and the structural unit A1, the proportion of the structural unit M1 is not less than 0.1% by mole based on the whole monomers constituting the base polymer (a). The proportion is not less than 2.0% by mole, preferably not less than 5% by mole, more preferably not less than 10% by mole in order to obtain the holographic data recording medium having high viscosity, high recording sensitivity, excellent light fastness and good archival recording property by curing (crosslinking).

Also, in the present invention, since transparency is required, it is preferable that the base polymer is a crosslinkable fluorine-containing polymer having a combination and proportion of the structural unit M1 and the structural unit A1 so as to enable an amorphous polymer to be provided.

Particularly, preferred embodiment of the fluorine-containing polymer for the fluorine-containing volume holographic data recording composition having high recording sensitivity and aiming at high density recording is one represented by the formula (3):

  (3)

The structural unit M1 in the formula (3) is the above-mentioned structural unit having, in its side chain, hydroxyl group or ethylenic carbon-carbon double bond, and the preferred examples of the formulas (M1-1), (M1-2) and (M1-3) raised supra can be applied thereto.

The structural unit A2 is a structural unit derived from a fluorine-containing ethylenic monomer having functional group in its side chain, and is specifically a structural unit represented by the formula (4):

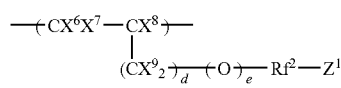  (4)

wherein $X^6$, $X^7$ and $X^8$ are the same or different and each is H or F; $X^9$ is H, F or $CF_3$; d is 0 or an integer of 1 or 2; e is 0 or 1; $Rf^2$ is a fluorine-containing alkylene group having 1 to 40 carbon atoms or a fluorine-containing alkylene group having 2 to 100 carbon atoms and ether bond; $Z^1$ is —OH, —$CH_2OH$, —COOH, carboxylic acid derivative, —$SO_3H$, sulfonic acid derivative, epoxy group, cyano group, oxetanyl group, unsaturated ester group or amino group, and the above-mentioned examples of the structural unit A1 derived from a fluorine-containing ethylenic monomer having functional group can be preferably applied thereto.

The structural unit A3 is a structural unit derived from a fluorine-containing ethylenic monomer having no functional group, and specifically a preferred structural unit is one represented by the formula (5):

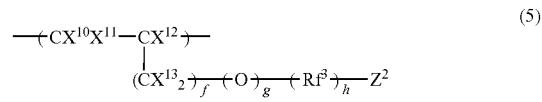  (5)

wherein $X^{10}$, $X^{11}$ and $X^{13}$ are the same or different and each is H or F; $X^{12}$ is H, F or $CF_3$; f, g and h are the same or different and each is 0 or 1; $Z^2$ is H, F or Cl; $Rf^3$ is a fluorine-containing alkylene group having 1 to 20 carbon atoms or a fluorine-containing alkylene group having 2 to 100 carbon atoms and ether bond.

The proportions of the structural units M1, A2 and A3 are preferably M1=0 to 90% by mole, A2=0 to 100% by mole and A3=0 to 99.9% by mole, and M1+M2 is preferably 0.1 to 100% by mole. When the proportion of the structural unit M1 is too small, there is a tendency that shrinkage after the hologram recording is increased and light fastness becomes insufficient. When the proportion of A2 is too small, there is a tendency that compatibility with each compound in the hologram composition and recording sensitivity are insufficient. When the proportion of A3 is too small, there is a tendency that transparency is insufficient.

In the base polymer (a) comprising these structural units M1, A2 and A3, the cure site of the structural unit M1 can impart high recording sensitivity, high density recording and light fastness to the optical data recording medium. Also, compatibility with each compound in the hologram composition and recording sensitivity can be imparted by the functional group of the structural unit A2. Further, more satisfactory transparency can be imparted to the volume holographic data recording composition and medium by the structural unit A3.

The number average molecular weight of the base polymer (a) can be selected within a range larger than 10,000 and not more than 1,000,000, and is selected preferably within a range from 50,000 to 500,000, especially preferably within a range from 70,000 to 200,000.

When the molecular weight is too low, even after the hologram recording, viscosity is low, interference fringes become irregular, shrinkage of interference fringes is liable to occur and especially archival recording property is lacking. When the molecular weight is too large, compatibility with each compound in the hologram composition and recording sensitivity are lowered, and film forming property and leveling property are liable to be lowered especially at forming a disc.

The refractive index of the base polymer (a) can be given depending on kind and amount of the structural unit M1 and kind of the copolymerizing structural unit A1 to be used as case demand, and the refractive index of the base polymer (a) itself (before the hologram recording) is preferably not more than 1.45, further preferably not more than 1.40, especially preferably not more than 1.38. Though the refractive index varies with kind of a substrate, when the low refractive index mentioned above is maintained and curing (crosslinking) can be carried out, the polymer can be a preferred base polymer for volume holographic data recording composition and medium.

Other example of the base polymer (a) to be used in the present invention is one represented by the formula (6):

  (6)

In the base polymer (a) represented by the formula (6), preferred examples of the structural unit M2 are the same as the examples of the structural unit M1 explained supra, in which the moiety $Y^1$ having carbon-carbon double bond is replaced by a moiety $Y^6$ having OH group, an organic group having 2 to 100 carbon atoms and 1 to 5 crosslinkable cyclic ether structures represented by the formula (9):

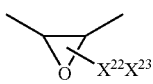  (9)

wherein $X^{22}$ and $X^{23}$ are the same or different and each is H, F, an alkyl group having 1 to 6 carbon atoms or a fluorine-containing alkyl group having 1 to 6 carbon atoms,
an organic group having 3 to 100 carbon atoms and 1 to 5 crosslinkable cyclic ether structures represented by the formula (10):

  (10)

wherein Q is a monovalent or divalent organic group of monocyclic, polycyclic or heterocyclic structure having 3 to 100 carbon atoms, in which hydrogen atoms may be replaced by the above-mentioned $X^{22}$ or $X^{23}$,
an organic group having 3 to 100 carbon atoms and 1 to 5 crosslinkable cyclic ether structures represented by the formula (11):

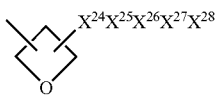  (11)

wherein $X^{24}$ to $X^{28}$ are the same or different and each is H, F, an alkyl group having 1 to 6 carbon atoms or a fluorine-containing alkyl group having 1 to 6 carbon atoms, or
an organic group having 3 to 100 carbon atoms and 1 to 5 crosslinkable cyclic ether structures represented by the formula (12):

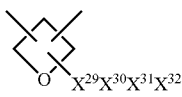  (12)

wherein $X^{29}$ to $X^{32}$ are the same or different and each is H, F, an alkyl group having 1 to 6 carbon atoms or a fluorine-containing alkyl group having 1 to 6 carbon atoms. Examples of the structural unit A4 to be used preferably are the same as the structural units A1, A2 and A3 explained supra.

In the present invention, in addition to the polymers exemplified supra, a polymer having cure site can be used as the base polymer (a) and further, the composition for the fluorine-containing volume holographic data recording material of the present invention can comprise a polyfunctional unsaturated compound (d) undergoing crosslinking reaction with the cure site by means of heat.

With respect to a combination of the base polymer (a) having a cure site and the polyfunctional unsaturated compound (d), there can be optionally selected and used at least one of combinations such as a compound having isocyanate group with a compound having hydroxyl group, a compound having isocyanate group with a compound having amino group, a compound having carbodiimide group with a compound having carboxyl group, a compound having unsaturated ester group with a compound having amino group, a compound having unsaturated ester group with a compound having mercaptan group, a compound having vinyl group with a compound having silicon hydride group and a compound having cation type reaction group with a compound having cation type reaction group, can be properly selected. Further, among the above-mentioned combinations, a combination of the polyfunctional unsaturated compound (d) having isocyanate group with the base polymer (a) having hydroxyl group is more preferred since polymerization or crosslinking can be carried out under moderate conditions.

The polyfunctional unsaturated compound (d) having isocyanate group can be used in the present invention without limitation, and the polyfunctional unsaturated compound (d) having two or more isocyanate groups in its molecule is more preferred in order to store recorded holograms sufficiently and improve recording sensitivity after making a fluorine-containing volume holographic data recording medium. Examples of such a compound having isocyanate groups are 1,8-diisocyanate-4-isocyanatemethyl-octane, 2-isocyanate-ethyl-2,6-diisocyanate caproate, benzene-1,3,5-triisocyanate, 1-methylbenzene-2,4,6-triisocyanate, 1,3,5-trimethylbenzene-2,4,6-triisocyanate, diphenylmethane-2,4,4'-triisocyanate, triphenylmethane-4,4',4"-triisocyanate, bis(isocyanatetolyl)phenylmethane, dimethylene diisocyanate, tetramethylene diisocyanate, hexamethylene diisocyanate, 2,2-dimethylpentane diisocyanate, 2,2,4-trimethylpentane diisocyanate, decane diisocyanate, ω,ω'-diisocyanate-1,3-dimethylbenzene, ω,ω'-diisocyanate-1,2-dimethylcyclohexane diisocyanate, ω,ω-diisocyanate-1,4-diethylbenzene, isophorone diisocyanate, 1-methylcyclohexyl-2,4-diisocyanate, ω,ω'-diisocyanate-1,5-dimethylnaphthalene, ω,ω'-diisocyanate-n-propylbiphenyl, 1,3-phenylene diisocyanate, 1-methylbenzene-2,4-diisocyanate, 1,3-dimethylbenzene-2,6-diisocyanate, naphthalene-1,4-diisocyanate, 1,1'-dinaphthyl-2,2'-diisocyanate, biphenyl-2,4'-diisocyanate, 3,3'-dimethylbiphenyl-4,4'-diisocyanate, diphenylmethane-4,4'-diisocyanate, 2,2'-dimethyldiphenylmethane-4,4'-diisocyanate, dicyclohexylmethane-4,4'-diisocyanate, 3,3'-dimethoxydiphenylmethane-4,4'-diisocyanate, 4,4'-diethoxydiphenylmethane-4,4'-diisocyanate, tolylene diisocyanate, 1,5-naphthylenediisocyanate, cyclohexylmethane-4,4'-diisocyanate, xylylene diisocyanate, and tetramethylenexylylene diisocyanate. Further, there are adducts of dimers and trimers of the above-mentioned isocyanate compounds (for example, adduct of 2 moles of hexamethylene diisocyanate, adduct of 3 moles of hexamethylene diisocyanate, adduct of 2 moles of 2,4-tolylene diisocyanate, and adduct of 3 moles of 2,4-tolylene diisocyanate), adducts comprising two or more different isocyanates selected from the above-mentioned isocyanates, and adducts (for example, adduct of tolylene diisocyanate and trimethylolpropane, and adduct of hexamethylene diisocyanate and trimethylolpropane) of those isocyanates and divalent or trivalent polyalcohols (for example, diethylene glycol, polyethylene glycol, dipropylene glycol, polypropylene glycol, polytetramethylene glycol and trimethylolpropane). These isocyanate compounds may be used alone or may be used in combination of two or more thereof.

The volume holographic data recording medium having a laminated recording layer comprising the composition for volume holographic data recording material is wholly subjected to recording and is possibly left in a state of the data being stored, under various temperature conditions under fluorescent light, near a window, etc. like the case of CD and DVD. Therefore, it is preferable that coloration of the recording layer is inhibited under various environmental conditions. In order to inhibit coloration, aliphatic isocyanate compounds are more preferred among compounds having isocyanate group.

In the present invention, when using a compound having isocyanate group, a binder may be formed by self-crosslinking of a compound having isocyanate group, but in order to carry out formation of a binder under moderate conditions, it is preferable to form a binder by crosslinking reaction of an isocyanate compound with a compound having, in its molecule, a functional group reactable with the isocyanate group of the isocyanate compound mentioned above in detail. Examples of such a compound reactable with an isocyanate compound are a compound having hydroxyl group in its molecule, a compound having a primary or secondary amino group and a compound having enamine form. However, when the fluorine-containing volume holographic data recording medium having a laminated recording layer comprising the composition for fluorine-containing volume holographic data recording material of the present invention is used in a state of the data being stored, in order to inhibit coloration of the fluorine-containing volume holographic data recording medium, among the above-mentioned compounds, a base polymer (a) having hydroxyl group is preferred as a compound reactable with an isocyanate compound, and further, a base polymer (a) having at least one alcoholic hydroxyl group in its molecule is more preferred.

For example, a structural unit represented by the formula (33):

wherein $Rf^2$ is as defined in the formula (27), is preferred for such a base polymer (a) having at least one alcoholic hydroxyl group in its molecule.

More specifically, preferred examples of such a structural unit are structural units derived from fluorine-containing ethylenic monomers such as $CH_2=CFCF_2OCF(CF_3)OH$, $CH_2=CFCF_2OCF(CF_3)CF_2OCF(CF_3)OH$, $CH_2=CFCF_2O(CF(CF_3)CF_2O)_2CF(CF_3)OH$, $CH_2=CFCF_2OCH_2CF_2OH$, $CH_2=CFCF_2OCH_2CF_2CF_2OCF(CF_3)OH$, $CH_2=CFCF_2OCF_2CF_2OCF_2OH$, $CH_2=CFCF_2O(CF_2CF_2O)_2CF_2OH$, $CH_2=CFCF_2OCF(CF_3)CH_2OH$, $CH_2=CFCF_2OCF(CF_3)CF_2OCF(CF_3)CH_2OH$, and $CH_2=CFCF_2O(CF(CF_3)CF_2O)_2CF(CF_3)CH_2OH$.

In addition, there can be preferably exemplified a structural unit represented by the formula (34):

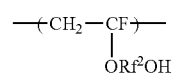

wherein $Rf^2$ is as defined in the formula (27), and more specifically, examples of such a structural unit are structural units derived from monomers such as $CF_2=CFOCF_2CF(CF_3)OCF_2CF_2CH_2OH$, $CF_2=CFO(CF_2)_3OH$, $CF_2=CFO(CF_2)_3CH_2OH$, $CF_2=CFOCF_2CF_2OCF_2OH$, $CF_2=CFOCF_2CF_2OCF_2CH_2OH$, $CF_2=CFOCF_2CF_2CH_2OCF_2CF_2OH$, $CF_2=CFOCF_2CF_2CH_2OCF_2CF_2CH_2OH$, $CF_2=CFOCF_2CF(CF_3)OCF_2CF_2CH_2OH$, $CF_2=CFO(CF_2)_3OH$, $CF_2=CFO(CF_2)_3CH_2OH$, $CF_2=CFOCF_2CF_2OCF_2OH$, $CF_2=CFOCF_2CF_2OCF_2CH_2OH$, $CF_2=CFOCF_2CF_2CH_2OCF_2CF_2OH$, and $CF_2=CFOCF_2CF_2CH_2OCF_2CF_2CH_2OH$.

Examples of other fluorine-containing ethylenic monomer having functional group are $CF_2=CFCF_2ORf^1OH$, $CF_2=CFRf^1OH$, $CH_2=CHRf^1OH$, $CH_2=CHORf^1OH$, and the like ($Rf^1$ is as defined in the formula (2)), and more specifically, there are $CF_2=CFCF_2OCF_2CF_2CF_2OH$, $CF_2=CFCF_2OCF_2CF_2CF_2CH_2OH$, $CF_2=CFCF_2OCF_2CF(CF_3)OH$, $CF_2=CFCF_2OCF_2CF(CF_3)CH_2OH$, $CF_2=CFCF_2OH$, $CF_2=CFCF_2CH_2OH$, $CH_2=CHCF_2CF_2CH_2CH_2OH$, $CH_2=CHCF_2CF_2OH$, $CH_2=CHCF_2CF_2CH_2OH$, $CH_2=CHCF_2CF_2CF_2CF_2OH$, $CH_2=CHCF_2CF_2CF_2CH_2OH$, $CH_2=CHOCH_2CF_2CF_2OH$, $CH_2=CHOCH_2CF_2CF_2CH_2OH$, and the like.

Among the base polymers (a) explained above in detail, $CH_2=CFCF_2OCF(CF_3)CH_2OH$, $CH_2=CFCF_2OCF(CF_3)CF_2OCF(CF_3)CH_2OH$ and $CH_2=CFCF_2O(CF(CF_3)CF_2O)_2CF(CF_3)CH_2OH$ are preferred.

In the composition for fluorine-containing volume holographic data recording material of the present invention, the refractive index of the base polymer (a) is preferably 1.350 to 1.385, more preferably 1.360 to 1.370 from the viewpoint of increasing a difference of a refractive index and improving recording sensitivity and recording density.

In the composition for fluorine-containing volume holographic data recording material of the present invention, the amount of base polymer (a) is preferably 20 to 80% by mass, more preferably 25 to 60% by mass from the viewpoint of improvement in recording sensitivity, dynamic range and recording density and further from the viewpoint of light fastness.

The liquid monomer (b) used in the present invention is one comprising at least one liquid monomer (b1) initiating polymerization by means of activated species generated from the photo-initiator (c) explained infra.

Examples of such a liquid monomer (b1) are compounds having fluoroacryloyl group. Examples of preferred compounds having fluoroacryloyl group are compounds represented by:

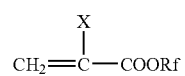

wherein X is H, $CH_3$ or F; Rf is a fluorine-containing alkyl group having 2 to 40 carbon atoms or a fluorine-containing alkyl group having 2 to 100 carbon atoms and ether bond.

Specifically, there are

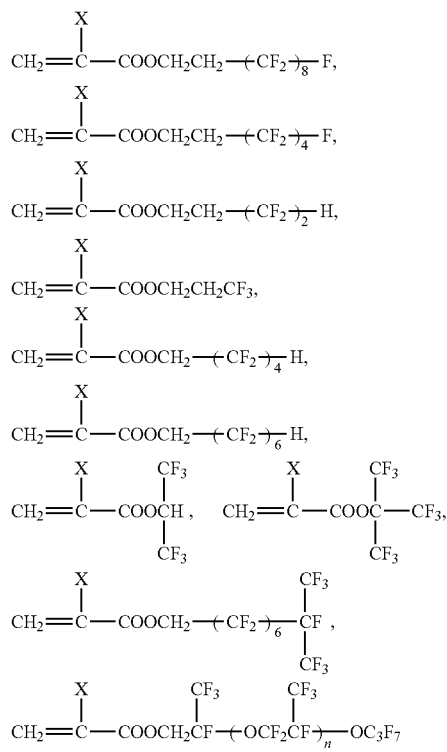

and the like (n: 1 to 5).

Examples of preferred other compounds are fluorine-containing polyalcohols represented by the general formulas such as:

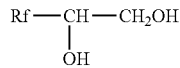

(Rf is a fluorine-containing alkyl group having 1 to 40 carbon atoms),

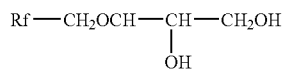

(Rf is a fluorine-containing alkyl group having 1 to 40 carbon atoms),

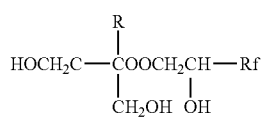

(Rf is a fluorine-containing alkyl group having 1 to 40 carbon atoms or a fluorine-containing alkyl group having 1 to 40 carbon atoms and ether bond, R is H or an alkyl group having 1 to 3 carbon atoms),

(Rf' is a fluorine-containing alkyl group having 1 to 40 carbon atoms or a fluorine-containing alkylene group having 1 to 40 carbon atoms and ether bond),

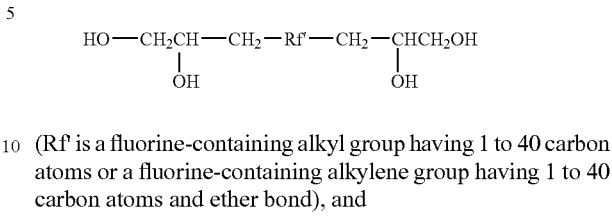

(Rf' is a fluorine-containing alkyl group having 1 to 40 carbon atoms or a fluorine-containing alkylene group having 1 to 40 carbon atoms and ether bond), and

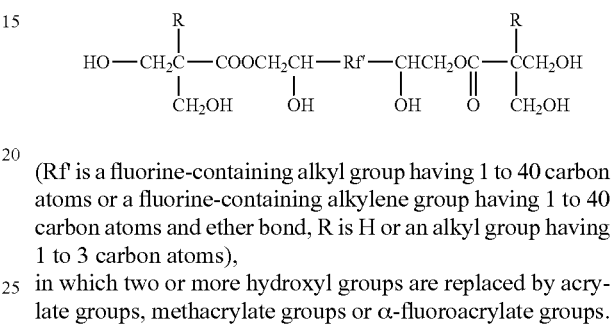

(Rf' is a fluorine-containing alkyl group having 1 to 40 carbon atoms or a fluorine-containing alkylene group having 1 to 40 carbon atoms and ether bond, R is H or an alkyl group having 1 to 3 carbon atoms),
in which two or more hydroxyl groups are replaced by acrylate groups, methacrylate groups or α-fluoroacrylate groups.

In addition, there are other compounds such as styrene, α-methylstyrene, 2-bromostyrene, vinyl acetate, methyl vinyl ketone, acrylonitrile, N-vinylcarbazole, N-vinylpyrrolidone, acrylate, methyl acrylate, n-butyl acrylate, lauryl acrylate, 2-ethyl hexyl acrylate, dicyclopentanyl acrylate, phenyl acrylate, o-biphenyl acrylate, 2-naphthyl acrylate, ethylene oxide phenol acrylate, phenoxydiethylene glycol acrylate, phenoxy-polyethylene glycol acrylate, nonyl phenol ethylene oxide acrylate, bisphenol A ethylene oxide diacrylate, ethylene oxide tetrabromo bisphenol A diacrylate, ethylene oxide bisphenol A diacrylate, propylene oxide bisphenol A diacrylate, propoxylated ethoxylated bisphenol A diacrylate, dimethylol-tricyclodecane diacrylate, propylene oxide trimethylolpropane triacrylate, urethane acrylate, ∈-caprolactonic acid tris-(2-acryloxyethyl)isocyanurate, methoxypolyethylene glycol acrylate, polypropylene glycol 400 diacrylate, octoxypolyethylene glycol-polypropylene glycol monoacrylate, trimethylolpropane triacrylate, tribromophenyl acrylate, ethylene oxide tribromophenyl acrylate, phenyl phenol glycidyl ether acrylate, 2-methyl-2adamantyl acrylate, 3-hydroxy-1-adamantyl acrylate, 1-adamantyl acrylate, phenyl ethyl acrylate, 2-phenyl ethyl acrylate, 2-phenoxy ethyl acrylate, 2-(9-carbazolyl)ethyl acrylate, methyl phenoxy ethyl acrylate, triphenyl methyl thioacrylate, 2-(p-chlorophenoxy) ethyl acrylate, nonyl phenoxy ethyl acrylate, phenol ethoxylate monoacrylate, p-chlorophenyl acrylate, 2-(1-naphthyloxy)ethyl acrylate, 2,4,6-tribromophenyl acrylate, isobornyl acrylate, hydroxyl ethyl acrylate, 2-hydroxy-3-phenoxypropyl acrylate, 2,3-dibromopropyl acrylate, 2-(tricyclo[5,2,102.6]dibromodecylthio)ethyl acrylate, tetramethylene glycol diacrylate, ethylene glycol diacrylate, diethylene dithioglycol diacrylate, triethylene glycol diacrylate, tetraethylene glycol diacrylate, polyethylene glycol diacrylate, phenoxypolyethylene glycol acrylate, propylene glycol diacrylate, methoxypropylene glycol acrylate, 1,3-butanediol diacrylate, neopentyl glycol diacrylate, hexanediol diacrylate, 1,4-cyclohexanediol diacrylate, trimethylolpropane triacrylate, trimethylolethane triacrylate, pentaerythritol diacrylate, pentaerythritol triacrylate, pentaerythritol tetraacrylate, dipentaerythritol diacrylate, dipentaerythritol triacrylate, dipentaerythritol tetraacrylate, dipentaerythritol hexaacrylate, sorbitol triacrylate, sorbitol tetraacrylate, sorbitol pentaacrylate, sorbitol hexaacrylate, 2-ethylhexyl carbitol acrylate, S-(1-naphthylmethyl)thioacrylate, β-acryloxyethyl hydrogen phthalate, ethoxylated bisphenol A diacrylate, itaconic acid, maleic acid, N-acryloyl morpholine, methyl α-cyano acrylate, vinyl-2-chloroethyl ether, vinyl-n-butyl ether, triethylene glycol divinyl ether, trimethylolethane trivinyl ether, 1,4-cyclohexane dimethanol divinyl ether, trimethylolpropane tri(acryloyloxypropyl)ether, (2-acryloxyethyl)ether of bisphenol A, bis(4-acryloxydiethoxyphenyl)methane, bis(4-acryloxyethoxy-3,5-dibromophenyl)methane, 2,2-bis(4-acryloxyethoxyphenyl)propane, 2,2-bis(4-acryloxydiethoxyphenyl)propane, 2,2-bis(4-acryloxyethoxy-3,5-dibromophenyl)propane, 2,3-naphthalenedicarboxylic acid (acryloxyethyl)monoester, 2,3-naphthalindicarboxylic acid (2-acryloxyethyl)(3-acryloxypropyl-2-hydroxy)diester, 4,5-phenanthrenedicarboxylic acid (2-acryloxyethyl)(3-acryloxypropyl-2-hydroxy)diester, diphenic acid (2-methacryloxyethyl)monoester, diphenic acid (2-acryloxyethyl)(3-acryloxypropyl-2-hydroxy)diester, 1,3-bis[2-acryloxy-3-(2,4,6-tribromophenoxy)propoxy]benzene, bis(4-acryloxyethoxyphenyl)sulfone, bis(4-acryloxydiethoxyphenyl)sulfone, bis(4-acryloxypropoxyphenyl)sulfone, bis(4-acryloxyethoxy-3,5-dibromophenyl)sulfone, 4,4'-bis(β-acryloyloxyethylthio) diphenylsulfone, 9,9-bis(4-acryloxydipropoxyphenyl) fluorene, 9,9-bis(4-acryloxyethoxy-3,5-dimethyl)fluorene, 9,9-bis(4-acryloxytriethoxyphenyl)fluorene, 9,9-bis(4-acryloxyethoxy-3-methylphenyl)fluorene, 9,9-bis(4-acryloxyethoxy-3-ethylphenyl)fluorene, 9,9-bis(4-acryloxydiethoxyphenyl)fluorene, 2,4-bis(β-acryloyloxyethylthio) diphenylketone, 4,4'-bis(β-acryloyloxyethylthio) diphenylketone, 4,4'-bis(β-acryloyloxyethylthio) diphenylketone, tri(acryloyloxyethyl)isocyanurate, acrylamide, methylenebisacrylamide, diacetone acrylamide, cyclohexene oxide, dendrimer (second generation) acrylate, and compounds obtained by replacing acrylate of the above-mentioned compounds by methacrylate.

Other examples of the liquid monomer (b1) are those having an organic group having 2 to 100 carbon atoms and 1 to 5 crosslinkable cyclic ether structures represented by the formula (9):

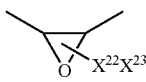

(9)

wherein $X^{22}$ and $X^{23}$ are the same or different and each is H, F, an alkyl group having 1 to 6 carbon atoms or a fluorine-containing alkyl group having 1 to 6 carbon atoms, or
an organic group having 3 to 100 carbon atoms and 1 to 5 crosslinkable cyclic ether structures represented by the formula (10):

(10)

wherein Q is a monovalent or divalent organic group of monocyclic, polycyclic or heterocyclic structure having 3 to 100 carbon atoms, in which hydrogen atoms may be replaced by the above-mentioned $X^{22}$ or $X^{23}$. Further, there can be used those having an organic group having 3 to 100 carbon atoms and 1 to 5 crosslinkable cyclic ether structures represented by the formula (11):

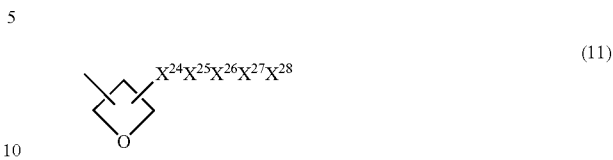

(11)

wherein $X^{24}$ to $X^{28}$ are the same or different and each is H, F, an alkyl group having 1 to 6 carbon atoms or a fluorine-containing alkyl group having 1 to 6 carbon atoms, or
an organic group having 3 to 100 carbon atoms and 1 to 5 crosslinkable cyclic ether structures represented by the formula (12):

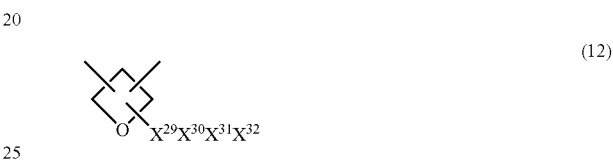

(12)

wherein $X^{29}$ to $X^{32}$ are the same or different and each is H, F, an alkyl group having 1 to 6 carbon atoms or a fluorine-containing alkyl group having 1 to 6 carbon atoms. Further, examples thereof are oligomers represented by:

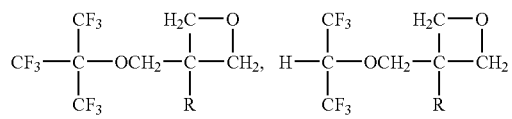

(R is H or $CH_3$),

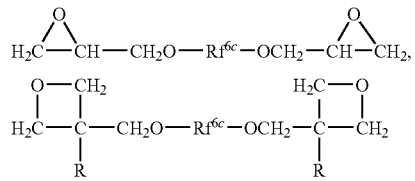

(R is H or $CH_3$; $R^{6c}$ is a divalent or more fluorine-containing organic group having 1 to 200 carbon atoms),

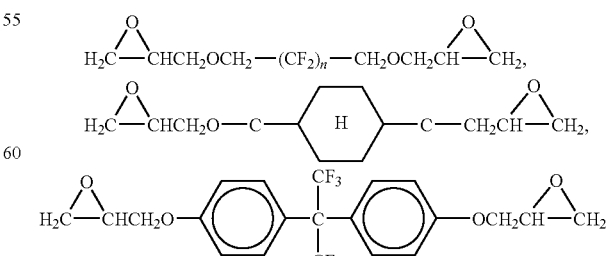

(n is an integer of 1 to 8),

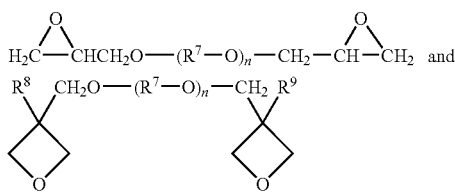

($R^7$ is a divalent organic group having 3 to 20 carbon atoms; $R^8$ and $R^9$ are the same or different and each is H or $C_3$; n is an integer of 2 to 100).

Other examples are allyl glycidyl ether, vinyl glycidyl ether, p-tert-butyl phenyl glycidyl ether, adipic acid diglycidyl ester, di-2,3-epoxycyclopentyl ether, ethyleneglycol-bis(3,4-epoxycyclohexane carboxylate), polyethylene glycol diglycidyl ether, dibromoneopentyl glycol diglycidyl ether, 1,6-hexanediol diglycidyl ether, polyalkylene glycol diglycidyl ether, trimethylolpropane diglycidyl ether, diglycerol polyglycidyl ether, diglycerol triglycidyl ether, pentaerythritol polyglycidyl ether, sorbitol polyglycidyl ether, trimethylolpropane polyglycidyl ether, 1,6-dimethylolperfluorohexane diglycidyl ether, phenyl glycidyl ether, resorcin diglycidyl ether, glycerin triglycidyl ether, diglycidylhexahydrophthalate, orthophthalic acid diglycidyl ester, dibromophenyl glycidyl ether, bisphenol A diglycidyl ether, 4,4'-bis(2,3-epoxypropoxyperfluoroisopropyl)diphenyl ether, 3,4-epoxycyclohexylmethyl-3',4'-epoxycyclohexane carboxylate, 2-(3,4-epoxycyclohexyl)-3',4'-epoxy-1,3-dioxane-5-spirocyclohexane, 4',5'-epoxy-2'-methylcyclohexylmethyl-4,5-epoxy-2-methylcyclohexane carboxylate, bi-(3,4-epoxycyclohexylmethyl)adipate, 1,2,5,6-diepoxy-4,7-methanoperhydroindene, 1,2-ethylenedioxy-bis(3,4-epoxycyclohexylmethane), 3,4-epoxycyclohexyloxirane, 1,4-bis(2,3-epoxypropoxyperfluoroisopropyl)cyclohexane, and 1,2,7,8-diepoxyoctane.

The liquid monomer (b1) is not limited to those exemplified above, and both of radically polymerizable compounds and cationically polymerizable compounds can be used. Preferred as a radically polymerizable compound are those having α-fluoroacryloyl group or acryloyl group from the viewpoint of recording sensitivity and dynamic range. Preferred as a cationically polymerizable compound are those having an organic group represented by the formula (9) or the formula (10) from the viewpoint of shrinkage percentage and storage stability.

From the viewpoint of light fastness and storage stability, polyfunctional monomers are preferred as the liquid monomer (b1).

In the composition for fluorine-containing volume holographic data recording material of the present invention, the molecular weight of the liquid monomer (b1) is preferably not less than 50, more preferably not less than 100 from the viewpoint of recording sensitivity, shrinkage percentage and dynamic range. In addition, the molecular weight of the liquid monomer (b1) is preferably not more than 3,000, more preferably not more than 2,000, further preferably not more than 1,000.

In the composition for fluorine-containing volume holographic data recording material of the present invention, the refractive index of the liquid monomer (b1) is preferably 1.40 to 1.70, more preferably 1.45 to 1.68 from the viewpoint of difference in refractive index, recording sensitivity and dynamic range.

In order to increase a degree of refractive index modulation of the obtained volume hologram, it is necessary that the refractive index of the liquid monomer (b1) is higher than an average refractive index of the mixture of the base polymer (a), the photo-initiator (c) explained infra and the plasticizer (b2) if necessary.

In the composition for fluorine-containing volume holographic data recording material of the present invention, the amount of liquid monomer (b1) is preferably 30 to 90% by mass, more preferably 45 to 80% by mass from the viewpoint of recording sensitivity, recording stability and dynamic range.

Further, the liquid monomer (b1) is not limited to single use of the exemplified monomers, and two or more thereof can be selected and used in combination.

Examples of a combination of the liquid monomers (b1) are a combination of a liquid monomer having α-fluoroacryloyl group or acryloyl group and a liquid monomer having methacryloyl group or vinyl group, a combination of a liquid monomer having an organic group represented by the formula (9) or the formula (10) and a liquid monomer having an organic group represented by the formula (11) or the formula (12) and a combination of a liquid monomer having α-fluoroacryloyl group or acryloyl group or a liquid monomer having methacryloyl group or vinyl group and a liquid monomer having an organic group represented by the formula (9), the formula (10), the formula (11) or the formula (12). Especially from the viewpoint of exhibiting recording sensitivity, shrinkage percentage and dynamic range compatibly, a combination of a liquid monomer having α-fluoroacryloyl group or acryloyl group and a liquid monomer having methacryloyl group or vinyl group and a combination of a liquid monomer having an organic group represented by the formula (9) or the formula (10) and a liquid monomer having an organic group represented by the formula (11) or the formula (12) are preferred.

In addition to the above-mentioned liquid monomer (b1), it is usually preferable to use the plasticizer (b2) together as the liquid monomer (b) from the viewpoint of improvement in recording sensitivity and dynamic range.

Examples of the plasticizer (b2) are inactive compounds such as phthalic acid esters represented by dimethyl terephthalate, diethyl terephthalate, dimethyl phthalate and dioctyl phthalate; aliphatic dibasic acid esters represented by dimethyl adipate, diethyl adipate, dibutyl adipate, dimethyl sebacate, diethyl sebacate, dibutyl sebacate and diethyl succinate; orthophosphoric acid esters represented by trimethyl phosphate, triethyl phosphate, triphenyl phosphate and tricresyl phosphate; acetic acid esters represented by glyceryl triacetate and 2-ethyl hexyl acetate; and phosphorous esters represented by triphenyl phosphite and dibutylhydrogen phosphite; and 2-ethoxyethyl acetate.

Also, there can be used alkylene glycol alkyl ethers represented by the following formula (35):

$$R^3(CH_2CH_2O)_\zeta R^4 \qquad (35)$$

wherein $R^3$ and $R^4$ are the same or different and each is an alkyl group having 1 to 5 carbon atoms, hydroxyl group or an acetyl group; $\zeta$ is an integer of 1 to 5.

Representative examples of usable alkylene glycol alkyl ether are ethylene glycol dimethyl ether, ethylene glycol diethyl ether, ethylene glycol dipropyl ether, ethylene glycol monomethyl ether, ethylene glycol monoethyl ether, ethylene glycol monopropyl ether, diethylene glycol dimethyl ether, diethylene glycol diethyl ether, diethylene glycol dipropyl ether, diethylene glycol monomethyl ether, diethylene glycol monoethyl ether, diethylene glycol monopropyl ether, triethylene glycol dimethyl ether, triethylene glycol diethyl ether, triethylene glycol dipropyl ether, triethylene glycol monomethyl ether, triethylene glycol monoethyl ether, triethylene glycol monopropyl ether, cellosolve acetate, ethylene glycol diacetyl ether, ethylene glycol monoacetyl ether, diethylene glycol diacetyl ether, diethylene glycol monoacetyl ether, triethylene glycol diacetyl ether and triethylene glycol monoacetyl ether.

Also, silicone oil or polyethylene glycol having a weight average molecular weight of not more than 10,000 can be used.

It is preferable to select the plasticizer (b2) having a refractive index as close to the refractive index of the base polymer (a) as possible.

The compounds exemplified above may be used alone as the plasticizer (b2) or may be used in combination of two or more thereof. The plasticizer (b2) is not limited to those exemplified above, and especially from the viewpoint of recording sensitivity and shrinkage percentage, 2-ethoxyethyl acetate, diethyl sebacate and diethyl adipate are preferred.

In the composition for fluorine-containing volume holographic data recording material of the present invention, the molecular weight of the plasticizer (b2) is preferably 100 to 1,000, more preferably 200 to 800 from the viewpoint of viscosity of the composition, recording sensitivity, shrinkage percentage and further dynamic range.

In the composition for fluorine-containing volume holographic data recording material of the present invention, the refractive index of the plasticizer (b2) is preferably 1.40 to 1.50, more preferably 1.42 to 1.45 from the viewpoint of recording sensitivity and dynamic range.

In the composition for fluorine-containing volume holographic data recording material of the present invention, the amount of plasticizer (b2) is preferably 10 to 80% by mass, more preferably 20 to 60% by mass from the viewpoint of viscosity of the composition, recording sensitivity, shrinkage percentage and dynamic range.

The photo-initiator (c) to be used in the present invention is a compound which is sensitized with light having excellent coherence, thereby initiating polymerization of the liquid monomer (b1).

Examples of a suitable photo-initiator (c) are those generating radicals by absorbing laser beams such as He—Ne (wavelength: 633 nm), Ar (wavelength: 515, 488 nm), Nd-YAG or Nd:YVO4 (wavelength: 532 nm), He—Cd (wavelength: 442 nm), AlGaN or InGaN (wavelength: 405±5 nm) and frequency-tripled YAG lasers (wavelength: 355 nm).

Nonlimiting examples of a photoradical initiator usable as the photo-initiator (c) are known initiators described in U.S. Pat. No. 4,766,055, U.S. Pat. No. 4,868,092, U.S. Pat. No. 4,965,171, JP54-151024A, JP58-15503A, JP58-29803A, JP59-189340A, JP60-76735A, JP1-28715A, and "PROCEEDINGS OF CONFERENCE ON RADIATION CURING ASIA" (pp. 461-477, 1988). Examples of a photoradical initiator usable as the photo-initiator (c) are diaryl iodonium salts, 2,4,6-substituted-1,3,5-triazines and organic peroxides described in JP58-29803A and JP1-287105A. When high photosensitivity is demanded, the use of diaryl iodonium salts is especially preferred.

Examples of the above-mentioned diaryl iodonium salts are chlorides, bromides, tetrafluoroborate, hexafluorophosphate, hexafluoroarsenate, hexafluoroantimonate, trifluoromethane sulfonate and 9,10-dimethoxyanthracene-2-sulfonate of diphenyl iodonium, 4,4'-dichlorodiphenyl iodonium, 4,4'-dimethoxydiphenyl iodonium, 4,4'-ditertiary-butyldiphenyl iodonium and 3,3'-dinitrodiphenyl iodonium.

Examples of 2,4,6-substituted-1,3,5-triazines are 2-methyl-4,6-bis(trichloromethyl)-1,3,5-triazine, 2,4,6-tris(trichloromethyl)-1,3,5-triazine, 2-phenyl-4,6-bis(trichloromethyl)-1,3,5-triazine, 2,4-bis(trichloromethyl)-6-(p-methoxyphenylvinyl)-1,3,5-triazine, 2-(4'-methoxy-1'-naphthyl)-4,6-bis(trichloromethyl)-1,3,5-triazine, benzoic acid-4-[4,6-bis(trichloromethyl)-1,3,5-triadin-2-yl]-methylester, benzoic acid-4-[4,6-bis(trichloromethyl)-1,3,5-triadin-2-yl], 1,3,5-triazine-2,4-bis(trichloromethyl)-6-[4-(trifluoromethyl)phenyl], 1,3,5-triazine-2-(4-methoxyphenyl)-4,6-bis(trichloromethyl), 1,3,5-triazine-2-[4-(methylthio)phenyl]-4,6-bis(trichloromethyl), and N-1606 which is a photo-initiator available from ADEKA.

Examples of organic peroxides are 3,3',4,4'-tetra(tert-butylperoxycarbonyl)benzophenone, a mixture of "3,3-bis-methoxycarbonyl-4,4-bis-tert-butylperoxycarbonylbenzophenone, 3,4-bismethoxycarbonyl-4,3-bis-tert-butylperoxycarbonylbenzophenone and 4,4-bismethoxycarbonyl-3,3-bis-tert-butylperoxycarbonylbenzophenone, di-tert-butylperoxyisophthalate and benzophenone.

A photo-cationic polymerization initiator which can be used as the photo-initiator (c) is an initiator which is subject to photo-sensitization to light to generate Brφnsted acid or Lewis acid which acts to polymerize the above-mentioned cationically polymerizable compound. Examples of such photo-cationic polymerization initiator are those described, for example, in "UV Curing; SCIENCE AND TECHNOLOGY" (pp. 23 to 76, edited by S. Peter Pappas, A TECHNOLOGY MARKETING PUBLICATION) and "Comments Inorg. Chem." (B. Klingert, M. Riediker and A. Roloff, vol. 7, No. 3, pp. 109 to 138 (1988). These compounds may be used alone or in a combination of two or more thereof.

Examples of a preferred photo-cationic polymerization initiator which can be used as the photo-initiator (c) are initiators containing diaryl iodonium salts and triarylsulfonium salts.

Examples of preferred diaryl iodonium salts as the photo-initiator are tetrafluoroborate, hexafluorophosphate, hexafluoroarsenate, hexafluoroantimonate, trifluoromethane sulfonate and 9,10-dimethoxyanthracene-2-sulfonate of iodonium described above as a photoradical polymerization initiator.

Examples of preferred triarylsulfonium salts are tetrafluoroborate, hexafluorophosphate, hexafluoroarsenate, hexafluoroantimonate, trifluoromethane sulfonate and 9,10-dimethoxyanthracene-2-sulfonate of sulfoniums such as triphenylsulfonium, 4-tertiary butyl triphenylsulfonium, tris(4-methylphenyl)sulfonium, tris(4-methoxylphenyl)sulfonium and 4-thiophenyl triphenylsulfonium. These compounds may be used alone or in a combination of two or more thereof.

It is possible to partly polymerize at least either the cationically polymerizable liquid monomer (b1) or the radically polymerizable liquid monomer (b1) by sensitization with light used for pre-exposure having a wavelength being different from a wavelength of light to be used for two-beam interference method. The photo-initiator (c) to be used at that time is an initiator which is sensitized with light having a wavelength being different from a wavelength of laser beam to be used in the above-mentioned two-beam interference method and acts as a photo-radical polymerization initiator and/or a photo-cationic polymerization initiator on at least either the cationically polymerizable liquid monomer (b1) or the radically polymerizable liquid monomer (b1). By an action of this photo-initiator in the pre-exposure, at least either the cationically polymerizable liquid monomer (b1) or the radically polymerizable liquid monomer (b1) is partially polymerized. Here, "partially polymerized" means that at least either the cationically polymerizable liquid monomer (b1) or the radically polymerizable liquid monomer (b1) is polymerized in a state that unreacted cationically polymerizable liquid monomer (b1) and/or radically polymerizable liquid monomer (b1) remains un-polymerized. Specifically, there are the following cases:

the case where the cationically polymerizable liquid monomer (b1) is substantially completely polymerized, and the radically polymerizable liquid monomer (b1) is not polymerized or is partially polymerized, the case where the radically polymerizable liquid monomer (b1) is substantially completely polymerized, and the cationically polymerizable liquid monomer (b1) is not polymerized or is partially polymerized, the case where only a part of the cationically polymerizable liquid monomer (b1) is polymerized, and the radically polymerizable liquid monomer (31) is not polymerized, the case where only a part of the radically polymerizable liquid monomer (b1) is polymerized, and the cationically polymerizable liquid monomer (b1) is not polymerized, and the case where both of the cationically polymerizable liquid monomer (b1) and the radically polymerizable liquid monomer (b1) are partially polymerized.

By such polymerization in the pre-exposure, the photo-sensitive composition is cured to such an extent as to maintain its solidity without flowing out when a photo-sensitizing layer comprising a photo-sensitive composition is placed horizontally. Preferably a polymerizable compound to be polymerized by the pre-exposure is different from a polymerizable compound to be polymerized by the two-beam interference method to be conducted later, and in this case, more satisfactory recording of interference fringes can be exhibited.

Among these photo-initiators (c), examples of a compound which is subject to sensitization with light to be used for the pre-exposure and acts as a photoradical polymerization initiator are the above-mentioned photo-initiators and in addition, titanocene compound, monoacylphosphine oxide, bisacylphosphine oxide, and a combination of bisacylphosphine oxide and α-hydroxyketone.

Among the photo-initiators (c), examples of a compound which is subject to sensitization with light to be used for the pre-exposure and acts as a photocationic polymerization initiator are iron arene complex, and the like. These photo-initiators (c) may be used alone or may be used in combination of two or more thereof. These are compounds having an absorption maximum wavelength mainly within a region from near ultraviolet light to visible light.

With respect to titanocene compounds, all of known titanocene compounds can be used. For example, there are titanocene compounds described in JP59-152396A, JP61-151197A, JP63-41484A, JP2-249A and JP2-4705A. Examples thereof are bis(cyclopentadienyl)-di-chloro-titanium, bis(cyclopentadienyl)-di-phenyl-titanium, bis(cyclopentadienyl)-bis(2,3,4,5,6-pentafluorophenyl)titanium, bis(cyclopentadienyl)-bis(2,6-difluorophenyl)titanium, bis(methylcyclopentadienyl)-bis(2,3,4,5,6-pentafluorophenyl)titanium, bis(methylcyclopentadienyl)-bis(2,6-difluorophenyl)titanium, bis(cyclopentadienyl)-bis[2,6-difluoro-3-(2-(1-pyl-1-yl)ethyl)phenyl]titanium, bis(cyclopentadienyl)-bis[2,6-difluoro-3-((1-pyl-1-yl)methyl)phenyl]titanium, bis(methylcyclopentadienyl)-bis[2,6-difluoro-3-((1-pyl-1-yl)methyl)phenyl]titanium, bis(cyclopentadienyl)-bis[2,6-difluoro-3-((2,5-dimethyl-1-pyl-1-yl)methyl)phenyl]titanium, bis(2,4-cyclopentadien-1-yl)-bis-(2,4-difluoro-3-(1H-pyrrole-1-yl)-phenyl)titanium, bis(cyclopentadienyl)-bis[2,6-difluoro-3-((3-trimethylsilyl-2,5-dimethyl-1-pyl-1-yl)methyl)phenyl]titanium, bis(cyclopentadienyl)-bis[2,6-difluoro-3-((2,5-bis(morpholinomethyl)-1-pyl-1-yl)methyl)phenyl]titanium, bis(cyclopentadienyl)-bis[2,6-difluoro-4-((2,5-dimethyl-1-pyl-1-yl)methyl)phenyl]titanium, bis(cyclopentadienyl)-bis[2,6-difluoro-3-methyl-4-(2-(1-pyl-1-yl)ethyl)phenyl]titanium, bis(cyclopentadienyl)-bis[2,6-difluoro-3-(1-methyl-2-(1-pyl-1-yl)ethyl)phenyl]titanium, bis(cyclopentadienyl)-bis[2,6-difluoro-3-(6-(9-carbazole-9-yl)hexyl)phenyl]titanium, bis(cyclopentadienyl)-bis[2,6-difluoro-3-(3-(4,5,6,7-tetrahydro-2-methyl-1-indole-1-yl)propyl)phenyl]titanium, bis(cyclopentadienyl)-bis[2,6-difluoro-3-((acetylamino)methyl)phenyl]titanium, bis(cyclopentadienyl)-bis[2,6-difluoro-3-(2-(propionylamino)ethyl)phenyl]titanium, bis(cyclopentadienyl)-bis[2,6-difluoro-3-(4-(pivaloylamino)butyl)phenyl]titanium, bis(cyclopentadienyl)-bis[2,6-difluoro-3-(2-(2,2-dimethylpentanoylamino)ethyl)phenyl]titanium, bis(cyclopentadienyl)-bis[2,6-difluoro-3-(3-(benzoylamino)propyl)phenyl]titanium, bis(cyclopentadienyl)-bis[2,6-difluoro-3-(2-(N-allylmethylsufonylamino)ethyl)phenyl]titanium, and bis(cyclopentadienyl)-bis(2,6-difluoro-3-(1-pyl-1-yl)phenyl)titanium.

With respect to monoacylphosphine oxide, all of known monoacylphosphine oxides can be used. For example, there are monoacylphosphine oxide compounds described in JP60-8047B and JP63-4077B. Examples thereof are isobutyryl-ethylphosphinic acid methyl ester, isobutyryl-phenylphosphinic acid methyl ester, pivaloyl-phenylphosphinic acid methyl ester, 2-ethylhexanoyl-phenylphosphinic acid methyl ester, pivaloyl-phenylphosphinicacid isopropyl ester, p-toluyl-phenylphosphinic acid methyl ester, o-toluyl-phenylphosphinic acid methyl ester, 2,4-dimethylbenzoyl-phenylphosphinic acid methyl ester, p-tertiarybutylbenzoyl-phenylphosphinic acid isopropyl ester, acryloyl-phenylphosphinic acid methyl ester, isobutyryl-diphenylphosphine oxide, 2-ethylhexanoyl-diphenylphosphine oxide, o-toluyl-diphenylphosphine oxide, p-tertiarybutylbenzoyl-diphenylphosphine oxide, 3-pyridylcarbonyl-diphenylphosphine oxide, acryloyl-diphenylphosphine oxide, benzoyl-diphenylphosphine oxide, pivaloyl-phenylphosphinic acid vinyl ester, adipoyl-bis-diphenylphosphine oxide, pivaloyl-diphenylphosphine oxide, p-toluyl-diphenylphosphine oxide, 4-(tertiary butyl)-benzoyl-diphenylphosphine oxide, terephthaloyl-bis-diphenylphosphine oxide, 2-methylbenzoyl-diphenylphosphine oxide, versatoyl-diphenylphosphine oxide, 2-methyl-2-ethylhexanoyl-diphenylphosphine oxide, 1-methyl-cyclohexanoyl-diphenylphosphine oxide, pivaloyl-phenyl phosphinic acid methyl ester, pivaloyl-phenyl phosphinic acid isopropyl ester and a photo-initiator SP-246 available from ADEKA. With respect to bisacylphosphine oxide, all of known bisacylphosphine oxides can be used. For example, there are bisacylphosphine oxide compounds described in JP3-101686A, JP5-345790A and JP6-298818A. Examples thereof are bis(2,6-dichlorobenzoyl)-phenyl phosphine oxide, bis(2,6-dichlorobenzoyl)-2,5-dimethylphenyl phosphine oxide, bis(2,6-dichlorobenzoyl)-4-ethoxylphenyl phosphine oxide, bis(2,6-dichlorobenzoyl)-4-propylphenyl phosphine oxide, bis(2,6-dichlorobenzoyl)-2-naphthyl phosphine oxide, bis(2,6-dichlorobenzoyl)-1-naphthyl phosphine oxide, bis(2,6-dichlorobenzoyl)-4-chlorophenyl phosphine oxide, bis(2,6-dichlorobenzoyl)-2,4-dimethoxyphenyl phosphine oxide, bis(2,6-dichlorobenzoyl)-decyl phosphine oxide, bis(2,6-dichlorobenzoyl)-4-octylphenyl phosphine oxide, bis(2,4,6-trimethylbenzoyl)phenyl phosphine oxide, bis(2,4,6-trimethylbenzoyl)-2,5-dimethylphenyl phosphine oxide, bis(2,6-dichloro-3,4,5-trimethoxybenzoyl)-2,5-dimethylphenyl phosphine oxide, bis(2,6-dichloro-3,4,5-trimethoxybenzoyl)-4-ethoxylphenyl phosphine oxide, bis(2-methyl-1-naphthoyl)-2,5-dimethylphenyl phosphine oxide, bis(2-methyl-1-naphthoyl)-4-ethoxylphenyl phosphine oxide, bis(2-methyl-1-naphthoyl)-2-naphthyl phosphine oxide, bis(2-methyl-1-naphthoyl)-4-propylphenyl phosphine oxide, bis(2-methyl-1-naphthoyl)-2,5-dimethylphenyl phosphine oxide, bis(2-methoxy-1-naphthoyl)-4-ethoxyphenyl phosphine oxide, bis(2-chloro-1-naphthoyl)-2,5-dimethylphenyl phosphine oxide, bis(2,6-dimethoxybenzoyl)-2,4, 4-trimethylpenthyl phosphine oxide and 2,4,6-trimethylbenzoyl-diphenyl phosphine oxide.

Examples of α-hydroxy-ketone are 1-[4-(2-hydroxyethoxy)-phenyl]-2-hydroxy-2-methyl-1-propan-1-one, 2-hydroxy-2-methyl-1-phenyl-propan-1-one and 1-hydroxy-cyclohexyl-phenyl-ketone.

Examples of iron arene complex are chloride, bromide, sulfonate, tetrafluoroborate, hexafluorophosphate, hexafluoroarsenate, hexafluoroantimonate and trifluoromethanesulfonate of ferrocene, ($\eta^6$-benzene)($\eta^5$-cyclopentadienyl)iron(II)$^-$, ($\eta^6$-toluene)($\eta^5$-cyclopentadienyl)iron(II)$^-$, ($\eta^6$-cumene)($\eta^5$-cyclopentadienyl)iron(II)$^-$, ($\eta^6$-naphthalene)($\eta^5$-cyclopentadienyl)iron(II)$^-$, ($\eta^6$-anthracene)($\eta^5$cyclopentadienyl)iron(II)$^-$ and ($\eta^6$-pyrene)($\eta^5$-cyclopentadienyl)iron(II)$^-$, and derivatives of these compounds having one or more substituents on a ligand thereof. Other examples are N-1919 and N-1717 which are photo-initiators available from ADEKA. In addition, there are 2,4-diethyl thioxanthone, tetrabutylammonium butyltri-4-tert-butylphenylborate, and the like.

In the composition for fluorine-containing volume holographic data recording material of the present invention, the amount of photo-initiator (c) is preferably from 5 to 90% by weight (especially from 8 to 80% by weight). Depending on an exposure step for forming interference fringes, the photo-initiator (c) may comprise either (c-1) a photoradical polymerization initiator or (c-2) a photocationic polymerization initiator, or a photo-initiator comprising the both may be used to act as an initiator for the post-exposure step to be carried out as case demands. Further, a compound acting as both of (c-1) photoradical polymerization initiator and (c-2) photocationic polymerization initiator may be used as the photo-initiator (c). In the case of using different compounds as (c-1) photoradical polymerization initiator and (c-2) photocationic polymerization initiator together, it is preferable to use a photo-initiator comprising 5 to 70% by weight (especially 8 to 40% by weight) of (c-1) photoradical polymerization initiator and 5 to 70% by weight (especially 8 to 40% by weight) of (c-2) photocationic polymerization initiator based on the total amount of photo-initiators.

The dye sensitizer (e) is generally a component absorbing light, and a combination of the above-mentioned photo-initiator (c) and the dye sensitizer (e) is preferably used for increasing sensitivity of the photo-initiator (c). Compounds which do not substantially absorb light having a wavelength of light source to be used for the pre-exposure, or compounds absorbing only small amount of this light are used as the dye sensitizer (e). In many cases, colored compounds like a die are used as the dye sensitizer (e) in order to absorb visible laser beam.

The dye sensitizer (e) is a compound undergoing absorption of light of visible region. In addition to the above-mentioned compounds, there can be used, for example, cyanine derivative, merocyanine derivative, phthalocyanine derivative, xanthine derivative, thioxanthene derivative, acridine derivative, porphyrin derivative, coumaran derivative, base styryl derivative, ketocoumaran derivative, quinolone derivative, stilbene derivative, oxazine derivative, thiazine dye, squarylium derivative and metal-containing squarylium derivative, and further, there can be used photo-sensitizers described in "Dye Handbook" (edited by Shin Ogahara, et al., Kodansha Ltd., 1986), "Chemistry of Functional Dyes" (Shin Ogahara, et al., CMC, 1983) and "Special Functional Materials" (edited by Chuzaburo Ikemori, et al., CMC, 1986). When a colorless transparent volume hologram recording layer is finally required, it is preferable to use, as the dye-sensitizer, cyanine dyes described in JP58-29803A and JP1-287105A. Since cyanine dyes are generally decomposed easily by light, the dye in the volume hologram is decomposed when subjected to the post-exposure in the present invention or left under room light or sun light for several hours to several days. As a result, no absorption of visible light is exhibited, and thus a colorless transparent volume hologram can be obtained.

Examples of cyanine dyes are anhydro-3,3'-dicarboxymethyl-9-ethyl-2,2'-thiacarbocyaninebetaine, anhydro-3-carboxymethyl-3',9-diethyl-2,2'-thiacarbocyaninebetaine, 3,3', 9-triethyl-2,2'-thiacarbocyanine.iodine salt, 3,9-diethyl-3'-carboxymethyl-2,2'-thiacarbocyanine.iodine salt, 3,3',9-triethyl-2,2'-(4,5,4',5'-dibenzo)thiacarbocyanine.iodine salt, 2-[3-(3-ethyl-2-benzothiazolidene)-1-propenyl]-6-[2-(3-ethyl-2-benzothiazolidene)ethylideneimino]-3-ethyl-1,3,5-thiadiazolium.iodine salt, 2-[[3-allyl-4-oxo-5-(3-n-propyl-5, 6-dimethyl-2-benzothiazolilydene)-ethylidene-2-thiazolinilydene]methyl]-3-ethyl-4,5-diphenylthiazolinium-iodine salt, 1,1',3,3,3',3'-hexamethyl-2,2'-indotricarbocyanine.iodine salt, 3,3'-diethyl-2,2'-thiatricarbocyanine.perchlorate, anhydro-1-ethyl-4-methoxy-3'-carboxymethyl-5'-chloro-2,2'-quinothiacyaninebetaine, anhydro-5,5'-diphenyl-9-ethyl-3, 3'-disulfopropyloxacarbocyanine hydroxide.triethylamine salt, and photo-sensitizers YT-245, GPX-102 and TY-235 available from ADEKA, and one or more thereof may be used.

When a finally obtained volume hologram is not required to be colorless and transparent, it is possible to use gambir-catechu dyes described in JP6-184311A, JP6-317907A and JP2000-511302A and coumaran dyes described in JP63-180946A.

Examples of gambir-catechu dyes are anthracene, 9-anthracenemethanol, 1,4-dimethoxyanthracene, 9,10-dimethoxyanthracene, 9,10-dimethylanthracene, 9-phenoxymethylanthracene, 9,10-bis(n-butylethynyl)anthracene, 9,10-bis(n-trimethylsilylethynyl)anthracene, 1,8-dimethoxy-9,10-bis(phenylethynyl)anthracene and 5,12-bis(phenylethynyl)-naphthacene. These compounds have an effect of sensitizing the photo-initiator to light of 514 nm from argon ion laser and light of 532 nm from frequency-doubled YAG laser. 1,8-dimethoxy-9,10-bis(phenylethynyl) anthracene and 5,12-bis(phenylethynyl)-naphthacene can be preferably used as a sensitizer.

Examples of coumaran dyes and ketocoumaran dyes are 7-dimethylamino-3-(2-thenoyl)coumaran, 7-diethylamino-3-(2-furoyl)coumaran, 7-diethylamino-3-(2-thenoyl)coumaran, 7-pyrrolidinyl-3-(2-thenoyl)coumaran, 7-pyrrolidinyl-3-(2-benzofuroyl)coumaran, 7-diethylamino-3-(4-dimethylaminocinnamoyl)coumaran, 7-diethylamino-3-(4-diethylaminocinnamoyl)coumaran, 7-diethylamino-3-(4-diphenylaminocinnamoyl)coumaran, 7-diethylamino-3-(4-dimethylaminocinnamylideneacetyl)coumaran, 7-diethylamino-3-(4-diethylaminocinnamylideneacetyl)coumaran, 7-diethylamino-3-(4-diphenylaminocinnamylideneacetyl)coumaran, 7-diethylamino-3-(2-benzofuroyl)coumaran, 7-diethylamino-3-[3-(9-julolidyl)acryloyl] coumaran, 3,3'-carbonylbis(7-methoxycoumaran), 3,3'-carbonylbis(5,7-dimethoxycoumaran), 3,3'-carbonylbis(6-methoxycoumaran), 3,3'-carbonylbis(7-dimethylaminocoumaran), 3,3'-carbonylbis(7-diethylaminocoumaran), 3,3'-carbonylbis-7-diethylaminocoumaran-7'-bis(buthoxyethyl)aminocoumaran, 3,3'-carbonylbis(7-dibutylaminocoumaran), 3-carbethoxy-7-(diethylamino) coumaran, 3-(2-benzothiazolyl)-7-diethylamino)coumaran, 3-(2-benzothiazolyl)-7-dibutylamino)coumaran, 3-(2-benzothiazolyl)-7-dioctylamino)coumaran, 3-(2-benzimidazolyl)-7-diethylamino)coumaran, and 10[3-[4-(dimethylamino)phenyl]-1-oxo-2-propenyl]-2,3,6,7-tetrahydro-1,1,7,7-tetramethyl-1H,5H,11H-[1]benzopyrano[6,7,8-ij]quinolizin-11-one.

Examples of base styryl derivative are 2-[p-(dimethylamino)styryl]benzothiazole, 2-[p-(dimethylamino)styryl]naphtho[1,2-d]thiazole and 2-[(m-hydroxy-p-methoxy)styryl]benzothiazole.

Examples of merocyanine derivatives are 3-ethyl-5-[(3-ethyl-2-(3H)-benzothiazolylidene)ethylidene]-2-thioxo-4-oxazolidinone-5-[(1,3-dihydro-1,3,3-trimethyl-2H-indole-2-ylidene)ethylidene]-3-ethyl-2-thioxo-4-oxazolidinone, and the like.

Further, squarylium derivative and metal-containing squarylium derivative have an optical constant suitable for recording and reconstruction by laser beam in a short wavelength region of from 300 to 530 nm, and therefore, are very useful as a dye sensitizer to be used on the optical data recording medium for recording and reconstruction by short wavelength laser beam.

For example, a maximum absorption wavelength (hereinafter abbreviated into "λmax") of a squarylium compound, 3-hydroxy-4-(4-methoxy-2-methyl-phenyl)-cyclobut-3-ene-1,2-dion measured (with U-3500 available from Hitachi High Technology Co., Ltd.) in methanol is 330 nm, and its mass absorption coefficient at λmax is $75.41 \cdot g^{-1} cm^{-1}$.

As a result of differential thermal analysis (TG/DTA6300 available from Seiko Instruments), a decomposition point is 430° C. Further, this obtained squarylium compound was dissolved in tetrafluoropropanol in a concentration of 2% by weight, and the solution was coated on a flat polycarbonate disc by a spin coat method to form a thin film. As a result, absorption spectrum λmax of this coating film was 350 nm (transmission method).

This squarylium compound and its nickel complex, i.e. metal squarylium compound is subject to light absorption in a wavelength region of from 300 to 530 nm and has a high mass absorption coefficient.

Examples of a squarylium compound are 3-hydroxy-4-(4-methoxy-2-methyl-phenyl)-cyclobut-3-ene-1,2-dion, 3-amino-4-[2,6-dimethyl-3-(2-phenyl-propoxy)-phenyl]-cyclobut-3-ene-1,2-dion, and N-[2-(3-ethoxy-5-fluoro-phenyl)3,4-dioxo-cyclobut-1-enyl]-C,C,C-trifluoro-methanesulfonamide, and examples of a metal squarylium compound are 3-hydroxy-4-(4-methoxy-2-methyl-phenyl)cyclobut-3-ene-1,2-dion/nickel complex (metal-containing squarylium compound), 3-amino-4-[2,6-dimethyl-3-(2-phenyl-propoxy)-phenyl]-cyclobut-3-ene-1,2-dion/zinc complex, and N-[2-(3-ethoxy-5-fluoro-phenyl)3,4-dioxo-cyclobut-1-enyl]-C,C,C-trifluoro-methanesulfonamide/cobalt complex.

Preferred examples of a combination of organic peroxide and a dye sensitizer are combinations of 3,3',4,4'-tetra(tert-butyl peroxycarbonyl)benzophenone, a mixture of "3,3-bismethoxycarbonyl-4,4-bis-tert-butyl peroxycarbonyl benzophenone, 3,4-bismethoxycarbonyl-4,3-bis-tert-butyl peroxycarbonyl benzophenone and 4,4-bismethoxycarbonyl-3,3-bis-tert-butyl peroxycarbonyl benzophenone" or di-tert-butyl peroxyisophthalate with a photo-sensitizer (dye sensitizer) available from Nippon Kanko Shikiso Kenkyuusho such as NKX653, NKX3883, NKX188150, NKX1253, NKX1595, NKX1658, NKX1695, NK4256, NK1886, NK1473, NK1474, NK4795, NK4276, NK4278, NK91, NK1046, NK1237, NK1420, NK1538 or NK3590.

Preferred examples of a combination of 2,4,6-substituted-1,3,5-triazine with a dye sensitizer are combinations of 2,4,6-tris(trichloromethyl)-1,3,5-triazine, 2-phenyl-4,6-bis(trichloromethyl)-1,3,5-triazine or 2,4-bis(trichloromethyl)-6-(p-methoxy phenyl vinyl)-1,3,5-triazine with a photo-sensitizer (dye sensitizer) available from Nippon Kanko Shikiso Kenkyuusho such as NKX653, NKX3883, NKX188150, NKX1253, NKX1595, NKX1658, NKX1695, NK4256, NK1886, NK1473, NK1474, NK4795, NK4276, NK4278, NK91, NK1046, NK1237, NK1420, NK1538 or NK3590.

In addition, there can be suitably used a combination of "B-CIM" available from HODOGAYA CHEMICAL CO., LTD. as a bisimidazole derivative, a chain transfer agent such as 2-mercaptobenzoxazole or 2-mercaptobenzothiazole, and the above-mentioned dye sensitizers.

Examples of a combination of a carbonyl compound with a dye sensitizer are benzyl/Michler's ketone, benzyl/Acridine Yellow, and the like. In addition, a dye sensitizer to be used in combination with an amine compound is preferably decarboxylated Rose Bengale. Examples of a preferred dye sensitizer to be used in combination with borate compounds are cyanine dyes such as cyanines, isocyanines and pseudocyanines.

In the composition for fluorine-containing volume holographic data recording material of the present invention, the content of dye sensitizer (e) is preferably 0.01 to 15% by weight (especially 0.03 to 10% by weight) from the viewpoint of recording sensitivity, dynamic range and shrinkage percentage.

Further, a photo-sensitizer may be used for the composition used on the recording layer of the volume holographic data recording medium of the present invention.

Examples of a photo-sensitizer which are suitably used are Michler's ketone, Acridine Yellow, merocyanine, Methylene Blue, camphorquinone, Eosine, 2,5-bis[(4-diethylamino)-2-methylbenzylidene]cyclopentanone and decarboxylated Rose Bengale.

In addition, it is preferable to add additives, for example, a plasticizer, a thermal stabilizer, a brightening agent, an ultraviolet absorber, a polymerization inhibitor, a chain transfer agent, a bleaching agent, and if necessary, ultrafine particles, to the composition for the volume holographic data recording material of the present invention and medium obtained therefrom.

Nonlimiting examples of usable ultrafine particles are fine particles of inorganic compounds and colloid sol, and inorganic oxides having a refractive index of not more than 1.70 are preferred.

Specifically, ultrafine particles and colloid sol such as colloidal silica (refractive index: 1.45) and colloidal zirconia (refractive index: 1.55) are desirable. It is desirable that a particle size (volume average particle size) of ultrafine particles and colloid sol is sufficiently small as compared with a wavelength of visible light in order to secure transparency of low refractive index material. The particle size is specifically not more than 100 nm, especially preferably not more than 10 nm.

The volume average particle size of fine particles is measured at room temperature with a particle size distribution measuring equipment (for example, 9320HRA available from MICRO TRACK CO., LTD.) using a laser diffraction scattering method by dispersing the fine particles in an organic solvent such as ethanol.

When using fine particles of an inorganic compound, it is desirable to use the fine particles in the form of organic sol by previously dispersing the fine particles in an organic dispersion medium in order not to lower dispersion stability in the composition and hologram recording stability in the material. Further, in order to improve dispersion stability of the fine particles of an inorganic compound in the composition, surfaces of the fine particles of an inorganic compound can be previously decorated with various coupling agents. Examples of coupling agents are, for instance, silicon compounds subjected to organic substitution; metal alkoxides such as aluminum, titanium, zirconium, antimony and mixtures thereof; salts of organic acids; coordination compounds bonded to coordination compound, and the like.

Further, additives, for example, a material without volume shrinkage by polymerization, an inflating material, an organometallic compound, an antioxidant, fillers such as extender and resin for increase in weight and for prevention of blocking, a surfactant, a defoaming agent, a leveling agent and a thixotropy-imparting agent may be optionally added at need to the composition for the fluorine-containing volume holographic data recording material of the present invention and the medium thereof.

Examples of a non-shrinkable material and an inflating material are those exemplified below.

In preparing the composition for the fluorine-containing volume holographic data recording material of the present invention and the medium thereof, a volumetric shrinkage percentage at curing is not more than 15%. Here, the "volumetric shrinkage percentage at curing" is a value obtained by the following equation provided that the specific gravity of the liquid of the composition for the fluorine-containing volume holographic data recording material of the present invention comprising a polymerizable liquid monomer before the curing is assumed to be D1 and the specific gravity of the solid after the curing is assumed to be D2.

$$[(D2-D1)/D2] \times 100$$

It is generally known that when subjected to polymerization by radical polymerization reaction or cationic polymerization reaction or curing, many of polymerizable monomers undergo volumetric shrinkage because a distance between molecules is shortened.

On the contrary, cyclic ethers can be preferably used in the present invention since a volumetric shrinkage resulting from curing in ring-opening polymerization thereof is relatively small.

Among compounds having plural cyclic ether structures in one molecule thereof, there are some compounds undergoing volumetric inflation due to polymerization, and these compounds can also be used in the present invention. For example, it is known that spiro-orthoester of an epoxy compound has a high density because of large interaction between the molecules thereof before polymerization, and therefore, a change in a distance between the molecules is small or inflation occurs even after curing through ring-opening polymerization (for example, refer to "JP61-38931B", "Precise Polymer Design by Ring-opening Polymerization", Toshikazu Takata, Nobuhiro Kihara, Polymer Processing, Vol. 47, No. 11 (1998), p.p. 482 to 488; and "Synthesis of Functional Polymer using Spiro Compound", Tsuyoshi Endo, Toshikazu Takata, Bulletin of the Petroleum Society, Vol. 32, No. 5 (1989), p.p. 237 to 247.).

In the present invention, since spiro-orthoester of an epoxy compound is used as a material for the matrix of the recording layer, a volumetric change at polymerization thereof can be inhibited, and warpage of a substrate and separation of the recording layer can be prevented.

Also, compounds synthesized by reaction of an epoxy compound and lactone can be suitably used as spiro-orthoester of an epoxy compound. Synthesis of these compounds is relatively easy.

Examples of an epoxy compound are phenyl glycidyl ether, allyl glycidyl ether, 2-ethylhexyl glycidyl ether, p-tert-butylphenyl glycidyl ether, 2,3-epoxy-1-propanol, styrene oxide, 1,2:8,9-diepoxylimonene, 1,4-butanediol diglycidyl ether, 1,6-hexanediol diglycidyl ether, ethylene glycol diglycidyl ether, diethylene glycol diglycidyl ether, polyethylene glycol diglycidyl ether, propylene glycol diglycidyl ether, polypropylene glycol diglycidyl ether, neopentyl glycol diglycidyl ether, 1,2,7,8-diepoxyoctane, hydroquinone diglycidyl ether, diglycidyl terephthalate, N-glycidyl phthalimide, resorcinol diglycidyl ether, diglycidyl ether of bisphenol A, diglycidyl ether of bisphenol F, diglycidyl ether of hydrogenated bisphenol A, 3,4-epoxycylohexenylmethyl-3',4'-epoxycyclohexene carboxylate, tetraglycidyl diaminodiphenylmethane, triglycidyl-p-aminophenol, diglycidyl aniline, diglycidyl toluidine, tetraglycidyl meta-xylylenediamine, tetraglycidyl bisaminomethylcyclohexane and polydimethylsiloxane terminated with epoxypropoxypropyl.

Examples of lactone are γ-butyrolactone, γ-valerolactone, γ-caprolactone, γ-caprylolactone, γ-laurolactone, γ-palmitolactone, γ-stearolactone, crotonolactone, α-angelica lactone, β-angelica lactone, δ-valerolactone, δ-caprolactone, ∈-caprolactone, coumaran, and large ring lactone represented by the following general formula (1).

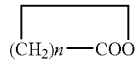

(n is an integer of 8 to 16)

Spiro-orthoester of an epoxy compound is prepared by dissolving lactone and a catalyst such as $BF_3OEt_3$ in methylene chloride or carbon tetrachloride and, while controlling a reaction speed, adding thereto dropwise a solution prepared by dissolving an epoxy compound in a proper solvent, thus continuing the reaction. In this case, a reaction temperature is generally from 0° C. to 30° C. A ratio of lactone to epoxy compound is usually 1 or more equivalent of lactone to 1 equivalent of epoxy compound.

Examples of spiro-orthoester obtained by allowing an epoxy compound to react with lactone are the following compounds. The compound (2) is prepared by allowing glycidyl ether of bisphenol A to react with γ-butyrolactone. The compound (3) is prepared by allowing alicyclic epoxy to react with ∈-caprolactone.

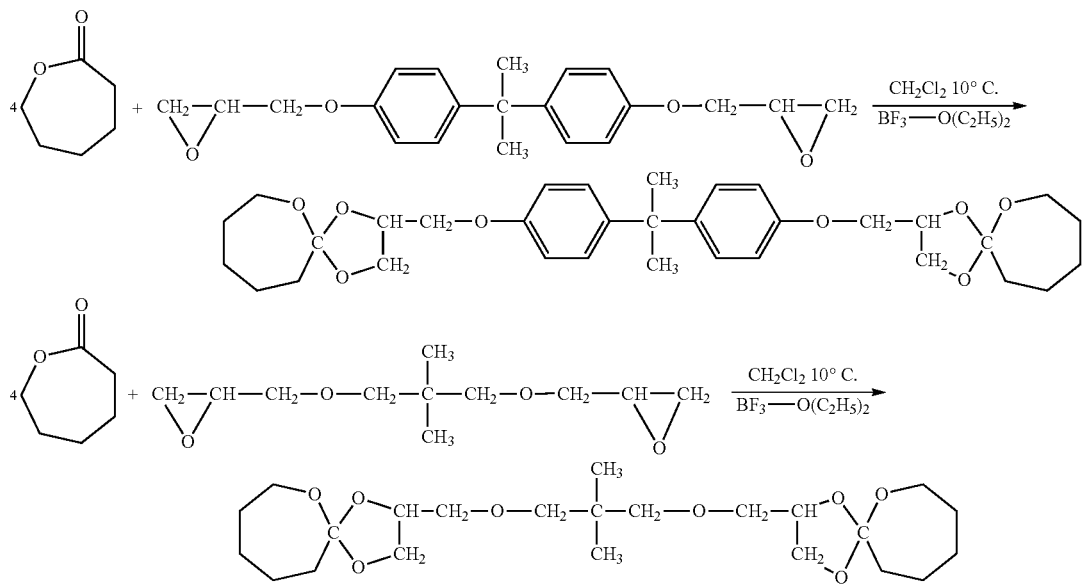

It is preferable to add a cationic polymerization accelerator in order to accelerate ring-opening polymerization reaction of spiro-orthoester. Examples of a cationic polymerization accelerator are known onium salts such as sulfonium salt, ammonium salt and phosphonium salt and aluminum silanol complex.

As disclosed in JP62-15083B, spiro-orthoester synthesized from an epoxy compound and lactone undergoes ring-opening polymerization even with an organic acid curing agent, and therefore, matrix may be formed using spiro-orthoester and an organic acid curing agent together. Examples of an organic acid curing agent are phthalic anhydride, trimellitic acid anhydride, pyromellitic anhydride, benzophenone tetracarboxylic anhydride, ethylene glycol bis(anhydrotrimellitate), glycerol tris(anhydrotrimellitate), maleic anhydride, succinic anhydride, tetrahydrophthalic anhydride, methyltetrahydrophthalic anhydride, methylnudic anhydride, dodecenyl succinic anhydride, hexahydrophthalic anhydride, hexahydro anhydride phthalic anhydride, methyl-cyclohexenetetracarboxylic anhydride, polyadipic anhydride, polyazelaic anhydride and polysebacic anhydride.

A curing accelerator may be added as case demands in order to shorten curing time. Examples of a curing accelerator are tertiary amine, organic phosphine compound, imidazole compound and derivatives thereof. Specific examples thereof are triethanolamine, piperidine, N,N'-dimethylpiperazine, 1,4-diazadicyclo[2.2.2]octance, pyridine, picoline, dimethylcyclohexylamine, dimethylhexylamine, benzyldimethylamine, 2-(dimethylaminomethyl)phenol, 2,4,6-tris(dimethylaminomethyl)phenol, 1,8-diazabicyclo[5.4.0] undecene-7 (DBU), phenol salt of DBU, trimethylphosphine, triethylphosphine, tributylphosphine, triphenylphosphine, tri(p-methylphenyl)phosphine, 2-methylimidazole, 2,4-dimethylimidazole, 2-ethyl-4-methylimidazole, 2-phenylimidazole, 2-phenyl-4-methylimidazole and 2-heptaimidazole. Catalysts such as boron trifluoride amine complex, dicyandiamide, organic acid hydrazide, diaminomaleonitrile, derivatives thereof, melamine and its derivative and amine imide may be used.

The above-mentioned organometallic compounds are in the form of gel or sol, and the liquid monomer (a) of liquid phase or the base polymer (b) is dispersed uniformly in the organometallic compound in good compatibility with each other.

The above-mentioned organometallic compound at least has at least two metals (M), oxygen and aromatic groups (Ar), and has an organometallic unit (Ar-M-Ar) having two aromatic groups (Ar) directly bonded to one metal (M). The metals (M) are bonded via an oxygen atom. Here, two or more metals (M) are optionally selected from the group consisting of Si, Ti, Zr, Ge, Sn, Al and Zn. Out of the selected two or more metals, only one metal may constitute the above-mentioned organometallic unit and other metals may constitute other organometallic units. Since two or more metals are contained as component metals in the organometallic compound, properties such as a refractive index is easily controlled and designing of the recording material becomes easy. The above-mentioned organometallic compound is prepared by hydrolysis and polymerization reaction, so-called sol/gel reaction by using alkoxide compounds of corresponding two or more metals (M) and diaryl alkoxide compound of the metal constituting the organometallic unit.

First, the above-mentioned organometallic compound is prepared by hydrolysis and polymerization reaction such as a sol/gel method. For example, starting materials, i.e. a diphenyl alkoxide compound of Si and an alkoxide compound of Ti are subjected to hydrolysis and polymerization reaction to obtain a composition comprising the above-mentioned organometallic compounds having various molecular weights, comprising component metals Si and Ti and containing a diphenylsilane unit.

The hydrolysis and polymerization reaction can be conducted by the same procedures under the same conditions as in a known sol/gel method. For example, the reaction is carried out by dissolving metal alkoxide compounds (a diphenyl alkoxide compound of Si and an alkoxide compound of Ti) in a proper good solvent in a specific ratio to make a uniform solution, adding a proper acid catalyst dropwise to the solution and then stirring the solution in the presence of water.

Examples of such a solvent are water; alcohols such as methanol, ethanol, propanol, isopropanol and butanol; ethers such as diethyl ether, dioxane, dimethoxyethane and tetrahydrofuran; N-methylpyrrolidone, acetonitrile, dimethylformamide, dimethylacetamide, dimethyl sulfoxide, acetone and benzene. The solvent may be optionally selected from them. Or, a mixture of these solvents can be used. The amount of the solvent is not limited, and is desirably 10 to 1,000 parts by weight based on 100 parts by weight of the whole metal alkoxide compounds.

Examples of an acid catalyst are inorganic acids such as hydrochloric acid, sulfuric acid, nitric acid and phosphoric acid; and organic acids such as formic acid, acetic acid, trichloroacetic acid, trifluoroacetic acid, propionic acid, methanesulfonic acid, ethanesulfonic acid and p-toluenesulfonic acid.

The hydrolysis polymerization reaction can be generally carried out even at room temperature though it depends on reactivity of the metal alkoxide compound, and can be carried out at a temperature of from about 0° C. to about 150° C., preferably at a temperature of from room temperature to about 50° C. The reaction time may be properly determined in view of a reaction temperature and is from about 0.1 hour to about 240 hours. The reaction may be carried out in inert atmosphere gas such as nitrogen gas or may be carried out under reduced pressure of from about 0.5 atm to about 1 atm while removing alcohol to be generated due to the polymerization reaction.

The metal alkoxide compound is mixed with the liquid monomer (a) or the base polymer (b), and with a mixture of the liquid monomer (a) and the base polymer (b) before or after the above-mentioned hydrolysis. The liquid monomer (a) or the base polymer (b) may be mixed with the metal alkoxide compound before or after the hydrolysis. When mixing after the hydrolysis, in order to make uniform mixing, it is preferable to admix the liquid monomer (a) or the base polymer (b) in a state that the sol/gel reaction system containing the organometallic compound is in the form of sol. Also, the photo-initiator (c) can be mixed before or after the above-mentioned hydrolysis.

Thus, the composition for fluorine-containing volume holographic data recording material comprising the uniform mixture of the liquid monomer (a) or the base polymer (b) and the organometallic compound in a state of sol can be obtained.

One preferred embodiment of a preparation process of the fluorine-containing volume holographic data recording medium is a method of pouring the composition for the fluorine-containing volume holographic data recording material of the present invention between transparent substrates. Specific examples of a method of pouring the composition between the transparent substrates are a method of arranging a pair of transparent substrates (first substrate and second substrate) so that the transparent substrates are positioned at both sides of the obtained recording layer and then pouring the composition for the fluorine-containing volume holographic data recording material between the two transparent substrates, a method of previously making a filling hole on a box type transparent substrate and pouring the composition for the fluorine-containing volume holographic data recording material through the filling hole, and a method of leaving one surface of a box type transparent substrate (first substrate) open and, after pouring or adding dropwise the composition for the fluorine-containing volume holographic data recording material therein, covering a transparent substrate (second substrate) over the open surface for sealing.

Then, an optical disc (an example of the holographic data recording medium) in relation to the present invention is explained below by means of drawings. FIG. 1 is a cross-sectional view diagrammatically showing the optical disc according to the first embodiment. Digital data is recorded on the optical disc 1 by holography. The optical disc 1 is in the form of disc, and a center hole 2 is formed at its center for fixing a spindle of a device for recording and reconstruction of the optical data. The optical disc 1 is formed by laminating a first substrate 3, a reflection layer 4, an oxygen barrier layer 5, a recording layer 6, an oxygen barrier layer 7 and a second substrate 8, and spacers 11 are provided at an inner circumference and an outer circumference of the first substrate 3.

The thickness of the first substrate 3 and the second substrate 8 is, for example, from 5 to 1,200 μm. The material of the first substrate 3 and the second substrate 8 is a plastic such as polycarbonate or transparent glass or quartz. Since laser beam L indicated in the diagrammatic view of the recording and read-out method in FIG. 3 explained later is emitted on the optical disc 1 from the side of the second substrate 8, a material of the second substrate 8 must be one transmitting laser beam L having a given wavelength, but a material of the first substrate 3 is not limited to such a material. However, when laser beam L is emitted on the optical disc 1 from the both sides of the first substrate 3 and the second substrate 8, the first substrate 3 also must have property of transmitting laser beam L substantially. The first substrate 3 and the second substrate 8 may be in the form of plate, film or transparent coating film.

Figure 2:
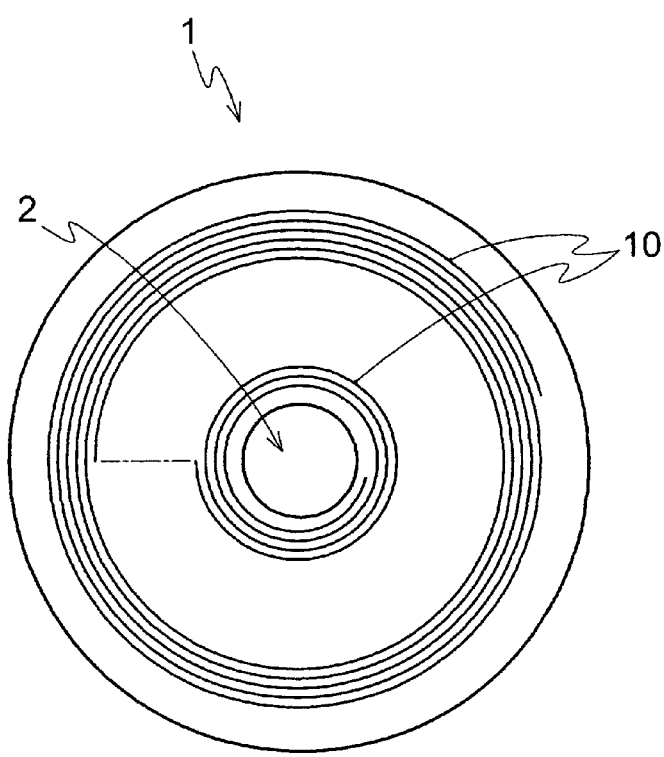
FIG. 2 is a plan view of the optical disc according to the first embodiment of the present invention.

On the surface of the first substrate 3 are formed pits 9. The optical disc 1 has a pre-format region 12 provided with physical pre-formats by means of the pits 9 and a recording region 13 provided with no pre-format as shown in the diagrammatic views of the recording and reconstruction method of FIGS. 3 to 5 explained later. These regions are explained below. FIG. 2 is a plan view of the optical disc 1. On the optical disc 1, a continuous spiral track 10 is formed from its inner circumference toward its outer circumference. The track 10 may be in the form of concentric circle. The track 10 is comprised of the pre-format regions 12 and the recording regions 13 arranged alternately in a row. The digital data is recorded in the form of hologram in the recording region. Servo data and address data are recorded previously in the pre-format region 12 by the use of pits 9 (FIG. 1) during production of the optical disc 1. A pre-format layer having the pits 9 may be formed on the first substrate 3 by using a resin without forming pits directly on the first substrate 3.

The reflection layer 4 is arranged on the first substrate 3 so as to cover the pits 9. The reflection layer 4 is made of a metal having property of reflecting the laser beam L, and specifically the metal is aluminum, silver, gold or silicon. The thickness of the reflection layer 4 is, for example 30 to 1,000 nm.

The oxygen barrier layers 5 and 7 (an example of a pair of oxygen barrier layers) are provided on and under the recording layer 6 so as to sandwich the recording layer 6 between them. Since the recording layer 6 is covered with the oxygen barrier layers 5 and 7, oxygen hardly invades into the recording layer 6 from the outside of the optical disc 1. The material of the oxygen barrier layers 5 and 7 is an ethylene-vinyl alcohol copolymer, and the thickness thereof is, for example, from 20 to 100 μm. The ethylene-vinyl alcohol copolymer is transparent, and therefore, laser beam L can pass through it.

At an inner circumference and an outer circumference of the first substrate 3 are provided the respective ring spacers 11 via the oxygen barrier layer 5. A material of the spacers 11 is, for example, stainless steel or ceramic, and by use of them, oxygen is prevented from invading into the recording layer 6 from the side surface of the optical disc 1. The thickness of the spacers 11 is equal to the thickness of the recording layer 6.

The thickness of the recording layer 6 is, for example, from 188 to 1,500 μm. The material of the recording layer 6 is a radically polymerizable hologram recording material. The hologram recording material has characteristics that as shown in the diagrammatic FIG. 3 for explaining the recording and read-out method, when laser beam L such as signal beam and reference beam are emitted on the recording layer 6 for a given period of time, optical properties (refractive index, absorptivity, transmittance, fluorescence emitting property and reflectance) of the emitted portion are changed according to intensity of the laser beam L. The hologram recording material comprises a photo-sensitive material. The material of the recording layer is, for example, the composition for fluorine-containing volume holographic data recording material of the present invention which is polymerizable by laser beam L.

The second substrate 8 is provided on the recording layer 6 via the oxygen barrier layer 7, and the recording layer 6 is supported by the second substrate 8 and the first substrate 3. The recording layer 6 may be supported by either the first substrate 3 or the second substrate 8. Mentioned above is the first embodiment of the optical disc.

Figure 3:
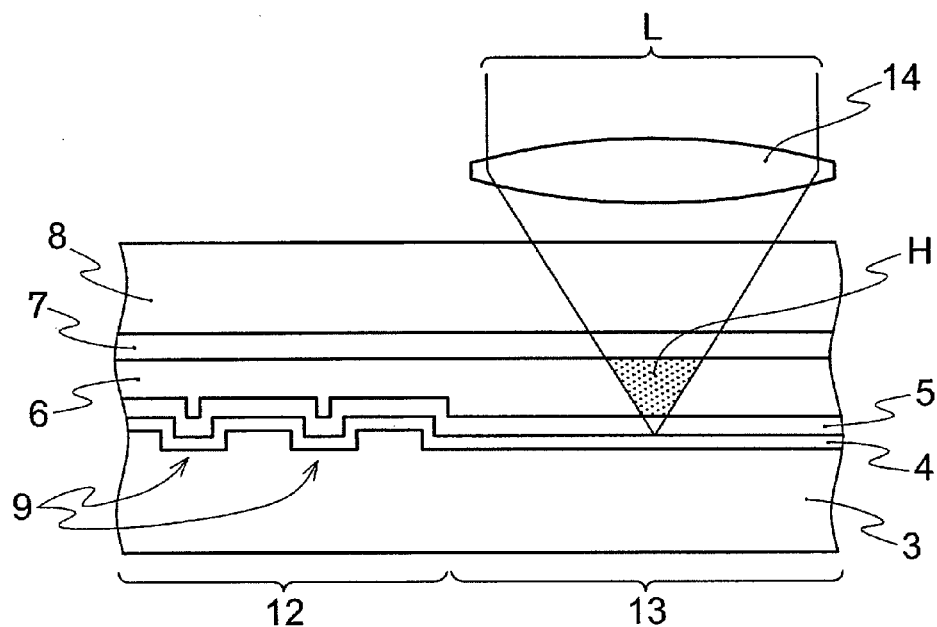
FIG. 3 is a partly enlarged diagrammatic view of the optical disc of FIG. 1 for explaining the first method of recording and reconstruction of the optical disc according to the first embodiment of the present invention.
Figure 4:
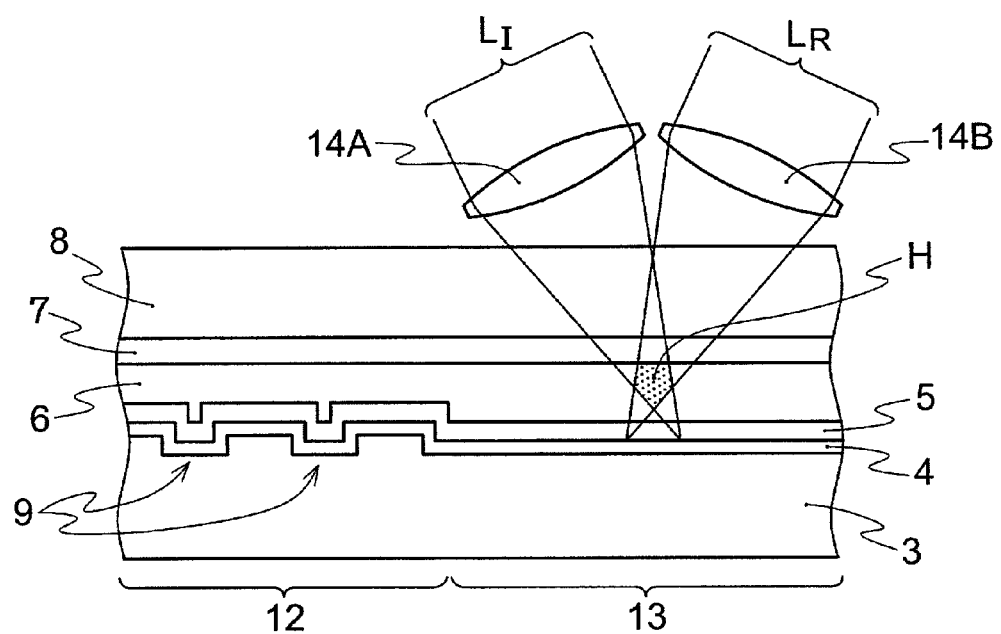
FIG. 4 is a partly enlarged diagrammatic view of the optical disc of FIG. 1 for explaining the second method of recording and reconstruction of the optical disc according to the first embodiment of the present invention.
Figure 5:
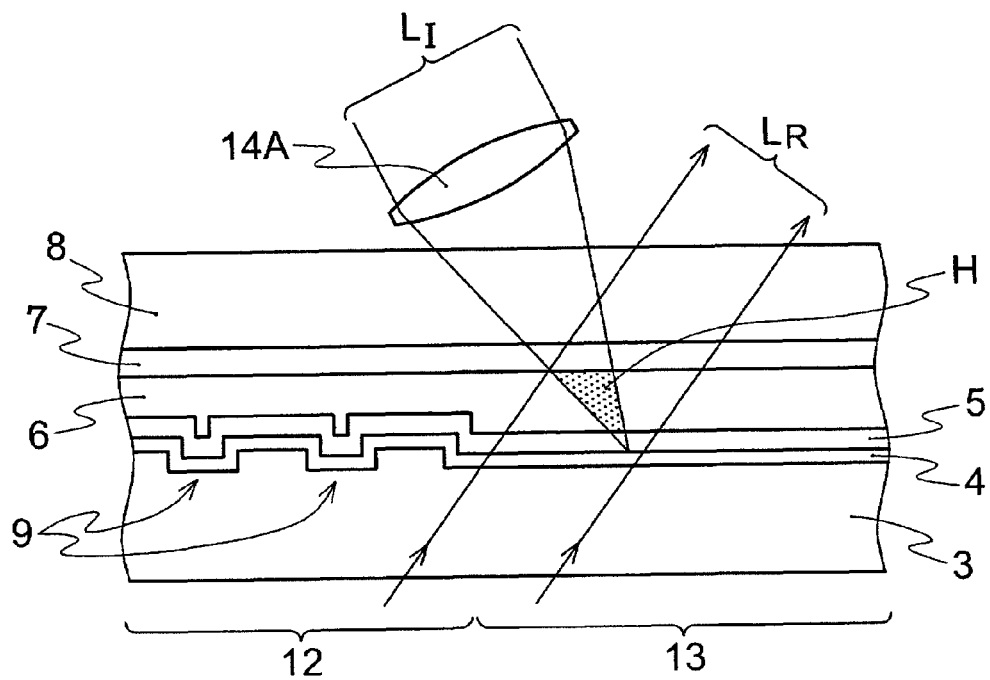
FIG. 5 is a partly enlarged diagrammatic view of the optical disc of FIG. 1 for explaining the third method of recording and reconstruction of the optical disc according to the first embodiment of the present invention.

For recording and reconstruction of data on and from the optical disc 1 by means of volume holography as one of embodiments of holography, there are, for example, the following three methods. FIG. 3 is for explaining the first method, FIG. 4 is for explaining the second method and FIG. 5 is for explaining the third method. FIG. 3 to FIG. 5 are views showing the optical disc partly enlarged. In FIG. 3 to FIG. 5, the same symbols as in FIG. 1 are used for the same elements. In the above-mentioned recording, interference fringes can be wrote in the recording layer 6 of the optical disc 1 in three-dimensional manner, and recording density can be increased.

The first method is a so-called reflection type method. As shown in FIG. 3, the laser beam L focused with a lens 14 of an optical head contains signal beam and reference beam for recording, and the reference beam for recording is subjected to interference, in the recording layer 6, with the signal beam reflected by the reflection layer 4, thereby recording the generated interference fringe in the recording layer 6. In the recording layer 6, a portion subjected to recording of interference fringe is called hologram H. By slightly rotating the optical disc 1, a new hologram H partly overlapping with the formed hologram H on the same plane is formed in the recording layer 6. By repeating this, multiple recording of holograms can be carried out on the recording layer 6.

On the other hand, by emitting laser beam L, which is reference beam for reconstruction, to the recorded hologram H through a lens 14, this beam is subject to diffraction by the hologram H, and signal beam is produced. Image data is reconstructed with the signal beam detected by an optical head through the lens 14.

The second method is a method of a so-called transmission type. As shown in FIG. 4, lens 14A and lens 14B of the optical head are arranged at the side of the second substrate 8. The signal beam $L_I$ focused with the lens 14A and the reference beam $L_R$ for recording focused with the lens 14B are crossed on the recording layer 6, and an interference fringe formed there is recorded as hologram H on the recording layer 6. In this method, the reflection layer 4 is not used for the formation of the interference fringe. The reflection layer 4 is used for focusing, tracking and addressing. By emitting reference beam for reconstruction to the hologram H through the lens 14B, signal beam is formed.

The third method is also a method of a so-called transmission type. In this method, the lens 14B of FIG. 4 is not provided, and as shown in FIG. 5, parallel beams of light formed by a lens system which is arranged at the side of the first substrate 3 but is not shown in FIG. 5 are so designed as to be emitted to the recording layer 6. The signal beam $L_I$ focused with the lens 14A and the parallel reference beams $L_R$ for recording focused with the above-mentioned lens system are crossed on the recording layer 6, and an interference fringe formed there is recorded as hologram H on the recording layer 6. Signal beam is formed by emitting parallel reference beams for reconstruction focused with the above-mentioned lens system to the hologram H. In this method, the reference beams $L_R$ for recording and reference beams for reconstruction must pass through the reflection layer 4, and therefore, the reflection layer 4 is made of, for example, gold or silicon and its light reflectance is adjusted to about 15 percent. In this method, too, the reflection layer 4 is not used for the formation of the interference fringe pattern, and is used for focusing, tracking and addressing.

The signal beam $L_I$ may be emitted from the side of the first substrate 3, and the reference beam $L_R$ for recording and reference beam for reconstruction may be emitted from the side of the second substrate 8.

Examples of a hologram recording method are a polarization collinear hologram recording (including coaxial recording) method and a reference beam incidence angle-multiplex hologram recording (including polytopic multiplexing) method. In the case of using the fluorine-containing volume holographic data recording material as a recording medium, a polarization collinear hologram recording (including coaxial recording) method is preferred since optical axes of the reference beam and the signal beam are in a coaxial line, thereby enabling highly accurate positioning and making it easy to take a measure for oscillation.

Also, in the case of a novel polytopic multiplexing method (IWHM'07/We-J-P01) recently developed for damping this external oscillation other than a polarization collinear hologram recording (including coaxial recording) method, two beams of a reference beam and a signal beam are subjected to interference on a Fourier lens. The fluorine-containing volume holographic recording material is also useful on this method.

The composition for fluorine-containing volume holographic data recording of the present invention is a composition for fluorine-containing volume holographic data recording medium having a recording layer for recording interference fringes generated due to interference of light being excellent in coherence as fringes having different refractive indexes, and an amount of spatial shift distance recorded on the recording layer is not more than 3 μm.

The spatial shift distance means the shortest distance (displacement) enabling each of multiple-recorded holographic data to be reconstructed to such an extent as to be identifiable. Therefore, when a distance between the recorded data is less than a spatial shift distance, reconstruction of the data becomes difficult.

On the contrary, when the data is recorded in a spatial shift distance or more, there is no problem with reconstruction but recording density is decreased.

The spatial shift distance is not more than 3 μm, preferably less than 3 μm from the viewpoint of improvement in recording density. Also, a smaller spatial shift distance is preferred from the viewpoint of increase in recording density, and specifically a spatial shift distance is preferably not more than 1 μm. From the viewpoint of limitation of laser beam wavelength, material and process, it can be considered that a lower limit is about 0.3 μm. The spatial shift distance is greatly affected by a material for forming the recording layer.

The above-mentioned recording pitch is preferably a minimum distance, namely, an amount of spatial shift distance where the neighboring second recording is not reacted by the signal beam when the signal beam is emitted to the first recording.

In the case of collinear holography where the above-mentioned signal beam and reference beam are emitted so that their axes of light coincide with each other, the distance between the neighboring recordings should be the above-mentioned spatial shift distance or more. For example, when the amount of spatial shift distance is 0.3 µm, the distance between the neighboring recordings is 0.3 µm or more, and when the amount of spatial shift distance is 3 µm, the distance between the neighboring recordings is 3 µm or more. When the distance between the neighboring recordings is within the range mentioned above, no response occurs on the neighboring recording. However, if the distance is too large, recording density is decreased, and therefore, the distance is preferably up to 10 µm.

A shifting method of the recording is not limited particularly, and can be optionally selected depending on purpose. For example, there is a method of shifting a disc-like optical recording medium in a direction being parallel to the disc plane toward a rotating direction of the optical recording medium (circumferential direction).

Also, an optical recording medium in the form of card can be used.

In addition, the composition for fluorine-containing volume hologram recording material can be coated on proper substrates with a spin coater, a gravure coater, a Comma Coater or a bar coater.

In the fluorine-containing volume hologram recording medium, the thickness of the optical data recording layer formed using the composition for fluorine-containing volume hologram recording material is preferably 188 to 1,500 µm, more preferably 200 to 1,000 µm from the viewpoint of multiplexed hologram storage capacity and dynamic range M/#.

The substrate for the fluorine-containing volume holographic data recording medium is one having transparency, and examples thereof are glass, quartz and resins such as polycarbonate, polyethylene, polypropylene, amorphous polyolefin, polyethylene fluoride, polyvinylidene fluoride, polyvinyl chloride, polyvinylidene chloride, ethylene-vinyl alcohol copolymer, polyvinyl alcohol, polymethyl methacrylate, polyether sulfone, polyether ether ketone, polyamide, tetrafluoroethylene-perfluoro(alkyl vinyl ether) copolymer, polyester such as polyethylene terephthalate and polyimide.

There are used, as light source for recording of holograms, visible laser beams, for example, laser beams from AlGaN or InGaN (wavelength: 405±5 nm) single mode laser comprising bluish purple LD having a center wavelength of 407 nm and equipped with an outer resonator, frequency-tripled Nd:YAG lasers (wavelength: 355 nm), He—Cd (wavelength: 442 nm), argon ion laser (458 nm, 488 nm, 515 nm), YAG or Nd:YVO4 laser (532 nm), and hologram data is recorded in the optical data recording layer by usual process. These light sources have the coherent length as long as 10 m or more (at single mode) and are very stable. In order to mainly measure a servo (addressing) of a material in a hologram forming process during the recording, He—Ne laser (wavelength: 633 nm) is used as light source which does not sensitize the recording material.

Figure 6:
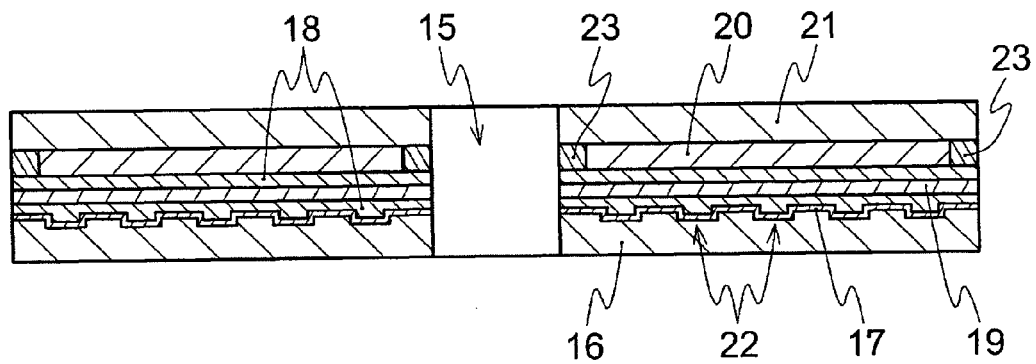
FIG. 6 is a cross-sectional view diagrammatically illustrating the optical disc according to the second embodiment of the present invention.

FIG. 6 is a cross-sectional view diagrammatically illustrating the second embodiment of the optical disc. In FIG. 6, the optical disc has a structure formed by laminating a first substrate 16, a reflection layer 17, a gap layer 18, a wavelength selecting layer 19, a gap layer 18, a recording layer 20 and a second substrate 21, and spacers 23 are provided at an inner circumference and an outer circumference of the first substrate 16.

The optical disc is in the form of disc, and a center hole 15 is formed at its center for fixing a spindle of a device for recording and read-out of the optical disc. On the surface of the first substrate 16 are formed pits 22.

The gap layers 18 are provided on and under the wavelength selecting layer 19 so as to sandwich the wavelength selecting layer 19 between them, and examples of a material of the gap layers 18 are glass, quartz and resins such as polycarbonate, polyethylene, polypropylene, amorphous polyolefin, polyethylene fluoride, polyvinylidene fluoride, polyvinyl chloride, polyvinylidene chloride, ethylene-vinyl alcohol copolymer, polyvinyl alcohol, polymethyl methacrylate, polyether sulfone, polyether ether ketone, polyamide, tetrafluoroethylene-perfluoro(alkyl vinyl ether) copolymer, polyester such as polyethylene terephthalate and polyimide, and non-fluorine-containing hard coating agents. The wavelength selecting layer 19 can be formed on the transparent supporting substrate by film formation using a plurality of film forming materials by electron beam evaporation (EB evaporation), sputtering or the like. The above-mentioned film forming materials may be formed into organic multilayer films having different refractive indexes, organic multilayer films comprising inorganic substance, or inorganic multilayer films, and example of an inorganic multilayer film is a to dichroic mirror layer. In this case, those films can be formed at lower cost by coating, laminating or the like. Examples of dichroic mirror layer are multilayer films comprising $TiO_2$/$SiO_2$, for example, multilayer films of 29-layer structure comprising $TiO_2$/$SiO_2$ - - - $SiO_2$/$TiO_2$, and it is preferable to optionally select the dichroic mirror layer depending on a wavelength of light to be used.

For visible light and infrared light, for example, there are preferably exemplified:

$TiO_2$, $CeO_2$, $Ta_2O_5$, $ZrO_2$, $Sb_2O_3$, $HfO_2$, $La_2O_3$, $NdO_3$, $Y_2O_3$, ZnO and $Nb_2O_5$ as materials having a high refractive index (materials having a refractive index of about not less than 1.8)

MgO, $Al_2O_3$, $CeF_3$, $LaF_3$ and $NdF_3$ as materials having a relatively high refractive index (materials having a refractive index of about 1.6 to 1.8), and $SiO_2$, $AlF_3$, $MgF_2$, $Na_3AlF_6$, NaF, LiF, $CaF_2$ and BaF2 as materials having a low refractive index (materials having a refractive index of about not more than 1.5).

For ultraviolet light, there are exemplified:

$ZrO_2$, $HfO_2$, $La_2O_3$, $NdO_3$, $Y_2O_3$, $TiO_2$, $Ta_2O_5$ and $ZrO_2$ as materials having a high refractive index (materials having a refractive index of about not less than 1.8) (however, a wavelength of light is about 360 nm to about 400 nm)

MgO, $Al_2O_3$, $LaF_3$ and $NdF_3$ as materials having a relatively high refractive index (materials having a refractive index of about 1.6 to 1.8), and $SiO_2$, $AlF_3$, $MgF_2$, $Na_3AlF_6$, NaF, LiF and $CaF_2$ as materials having a low refractive index (materials having a refractive index of about not more than 1.5).

In addition, the wavelength selecting reflection layer may be one having a coloring agent-containing layer comprising at least either a pigment or a dye. Further, the wavelength selecting reflection layer may be a laminated article made by laminating two or more cholesteric liquid crystal layers. With respect to the coloring agent-containing layer, the cholesteric liquid crystal layers and the wavelength selecting layer comprising a photo-reactive chiral compound, the wavelength selecting reflection layer may comprise a photo-reactive chiral compound, the photo-reactive chiral compound may have a chiral structure and a photo-reactive group, and the chiral structure may be one selected from an isosorbide compound, an isomannide compound and a bi-naphthol compound. The layers are not specifically limited, and can be optionally selected depending on purposes. For example, the wavelength selecting layer is formed by using a laminated article comprising a dichloric mirror layer, a single layer or two or more layers of cholesteric liquid crystal layers, and further, other layer if necessary. The wavelength selecting layer may have a coloring agent-containing layer. The dichloric mirror layer is made by laminating a plurality of dielectric thin films having different refractive indexes, and in order to make a wavelength selecting reflection layer, it is preferable to laminate plural layers comprising dielectric thin films having a high refractive index and dielectric thin films having a low refractive index alternately. The thin films are not limited to two kinds of films, and more than two kinds of films may be used. In addition, when a coloring agent-containing layer is provided, it is desirable to form the layer under the dichloric mirror layer.

In an interface between the second substrate 21 and the recording layer 20, corrosion and deterioration of the second substrate by the recording layer can be prevented by coating the surface of the second substrate with a material for the gap layer 18 or providing a film prepared using the same material between them.

The thickness of the first substrate 16 of the optical disc in FIG. 6 is, for example, from 1,100 to 1,200 μm. For the first substrate 16, the second substrate 21 and the reflection layer 17, the same materials and shapes as those mentioned in the first embodiment can be used.

The thickness of the recording layer 20 of the optical disc in FIG. 6 is, for example, from 400 to 1,500 μm. For the recording layer 20, the same materials as those mentioned in the first embodiment can be used.

The thickness of the whole optical disc in FIG. 6 is, for example, from 2,300 to 3,500 μm.

In the optical disc of FIG. 6, oxygen barrier layers may be arranged on and under the recording layer 20 so as to sandwich the recording layer 20 between them. With respect to the oxygen barrier layers, the same layers as explained in the first embodiment can be used.

As mentioned above, the optical disc having the layer structure shown in FIG. 6 is suitable for focusing, tracking and addressing.

The optical discs shown in FIG. 1 and FIG. 6 can be formed into cartridge by packaging them with a case for shielding them from outside light.

Examples of uses and applications of the fluorine-containing volume holographic data recording material other than fluorine-containing volume holographic data recording media are optical element, impartation of property for improving display or decoration pattern, interference measurement, optical data processing and optical data recording.

Examples of optical element are diffraction grating, scanner for POS, optical head for CD•DVD player, beam splitter, interference filter, head-up display for plane and automobile, optical switching, waveguide, and the like.

Examples of impartation of property for improving display or decoration pattern are three-dimensional display, hologram art, interior and exterior decoration, recording of artistic handicrafts, educational materials, cover and illustration of book and magazine, decoration and prevention of forgery of securities, ID card, credit card, cash card and telephone card, stereoscopic vision of CT image, and the like.

Examples of interference measurement are measurement of displacement and deformation of an object, measurement of oscillation of an object, measurement of accuracy of optical display (computer-generated holography) and the like.

Examples of optical data processing are pattern recognition and verification of fingerprints using holographic matched filter.

Examples of optical data recording are (high grade or digital) television broadcasting, image recording of video camera and monitoring camera, data retrieval recording, figures and letters input device, holographic associative memory, and the like.

EXAMPLE

The present invention is then explained by means of Examples, but is not limited to them.

Example 1

(1) Preparation of Composition for Fluorine-Containing Volume Holographic Data Recording Material To 2 g of a fluorine-containing polymer (number average molecular weight measured by GPC analysis using tetrahydrofuran (THF) as a solvent: 70,000, weight average molecular weight: 150,000, fluorine content: 60.1%) having hydroxyl at an end of its side chain and comprising, as a base polymer, only a homopolymer comprising perfluoro-(1,1,9,9-tetrahydro-2,5-bistrifluoromethyl-3,6-dioxanonenol) ($CH_2$=$CFCF_2OCF(CF_3)CF_2OCF(CF_3)CH_2OH$) as a structural unit were added 2 g of ethylene oxide bisphenol A diacrylate, 1 g of N-acryloyl morpholine and 2 g of propoxylated ethoxylated dimethacrylate as liquid monomers, 0.1405 g of 2,4,6-tris(trichloromethyl)-1,3,5-triazine as a photo-initiator, and 0.00441 g of 10[3-[4-(dimethylamino)phenyl]-1-oxo-2-propenyl]-2,3,6,7-tetrahydro-1,1,7,7-tetramethyl-1H,5H,11H-[1]benzopyrano[6,7,8ij]quinolizin-11-one as a dye sensitizer. Thus a uniform composition for fluorine-containing volume holographic data recording material was prepared. With respect to the refractive indexes of the liquid monomers, the refractive index of ethylene oxide bisphenol A diacrylate was 1.519, the refractive index of N-acryloyl morpholine was 1.506 and the refractive index of propoxylated ethoxylated dimethacrylate was 1.456, and the average refractive index of the mixture of base polymer and photo-initiator was 1.373.

(2) Preparation of Fluorine-Containing Volume Holographic Data Recording Medium

The composition for fluorine-containing volume holographic data recording material prepared in (1) above was put between 1.2 mm thick glass substrates (30×30 mm square) subjected to antireflection treatment against 532 nm light and 405 nm light, using PET spacers of 188 μm to prepare a fluorine-containing volume holographic data recording medium.

Figure 7:
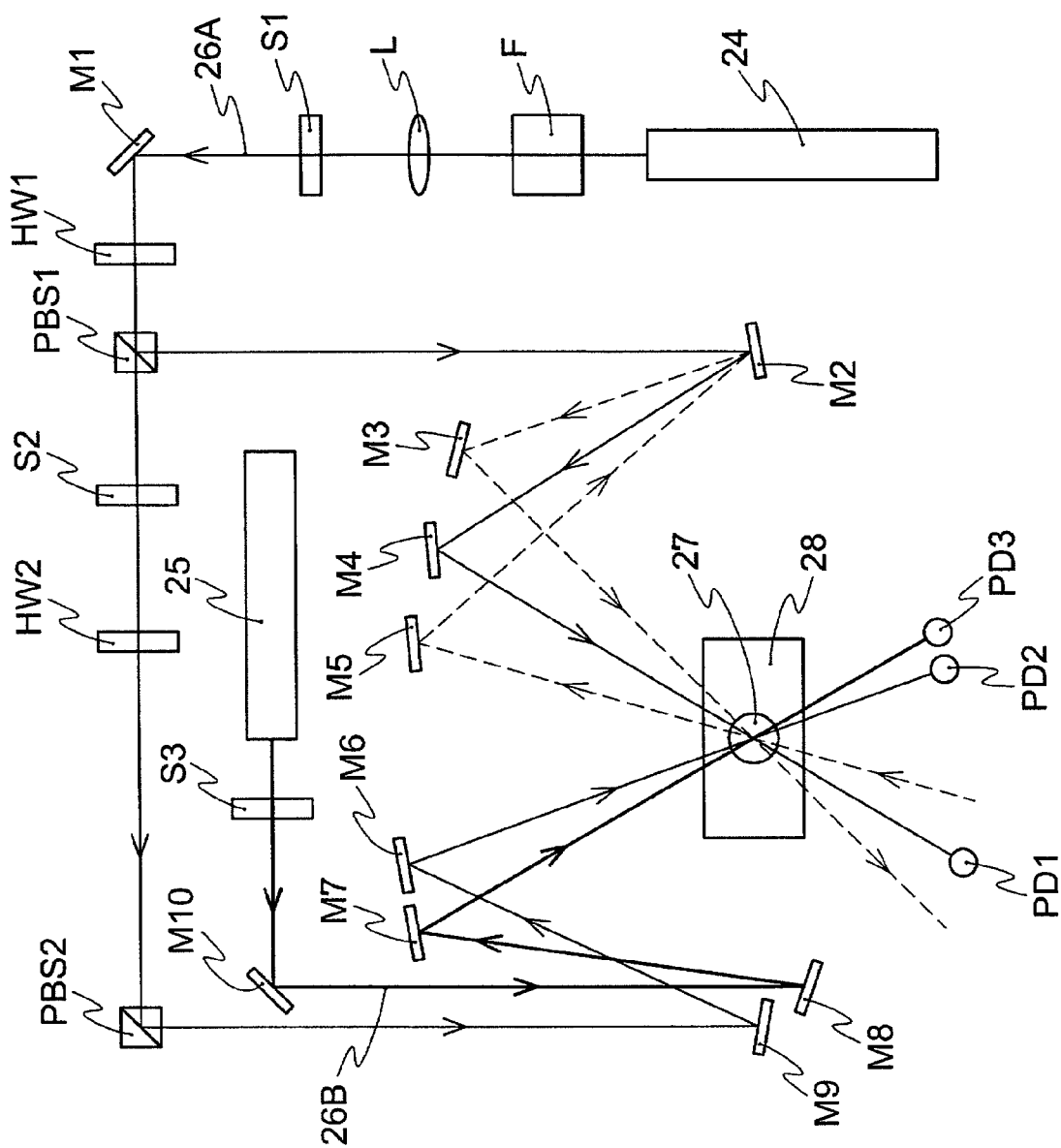
FIG. 7 is a diagrammatic view for explaining an optical system of optical plane wave tester for preparing the volume holographic data recording medium of Example.

(3) Measurement of Hologram Characteristics of Fluorine-Containing Volume Holographic Data Recording Medium The fluorine-containing volume holographic data recording medium obtained in (2) above was subjected to recording of transmission type hologram at 25° C. with optical plane wave testers (SHOT-500G and SHOT-500B available from PULSTEC INDUSTRIAL CO., LTD.) diagrammatically shown in FIG. 7, and a dynamic range and shrinkage percentage of the recording medium were determined from the results of multiple recording. The recording conditions are as shown below.

Light source for recording: Nd:YVO4 CW laser (532 nm±1 nm)

AlGaN or InGaN CW laser (405 nm±5 nm)

Light source for measuring: He Ne CW laser (632.8 nm±1 nm)
Light intensity: 4 mW/cm$^2$
Optimum light exposure: 1 to 5,000 mJ/cm$^2$ In the optical plane wave tester shown diagrammatically in FIG. 7, numeral 24 represents laser light source (Nd:YVO4 CW laser, and AlGaN or InGaN CW laser), numeral 25 represents laser light source (He—Ne CW laser), numerals 26A and 26B represent laser beams, numeral 27 represents a sample, numeral 28 represents a sample stage, PBS1 and PBS2 represent beam splitters, HW1 and HW2 represent ½ wavelength plates, S1 to S3 represent optical shutters, M1 to M10 represent mirrors, PD1 to PD3 represent detectors, L represents a lens and F represents a spatial filter.

(Film Thickness)

The thickness of the fluorine-containing volume holographic data recording medium depends on the thickness of the PET film spacer to be sandwiched together with the composition for the recording material, and therefore, is determined according to the thickness of the PET film spacer.

(Optimum Light Exposure)

A relation between the product (exposure) of incident optical power and time and the diffraction efficiency is determined. A basic embodiment for characteristic evaluation of optimum light exposure is conducted by incidence of laser beam having a wavelength different from a wavelength for the recording to the hologram in consideration of photo-sensitization of the material. The optimum light exposure at the time when the diffraction efficiency indicates a maximum value is measured by monitoring diffracted light of laser for measuring from the hologram formed with recording laser beam (single analysis).

(Dynamic Range (M/#))

Next, incidence of only one recording beam is carried out, and diffraction efficiency is determined from intensity of diffracted light. After the single analysis, for recording of hologram, angle-multiplex recording is employed, and M/# is determined from a relation between the exposure to the material and the diffraction efficiency.

<Calculation Method of M/#>

$$M/\# = \Sigma \sqrt{\eta_i}$$

M: Number of multiplexed recordings of hologram
$\eta_i$: Diffraction efficiency The obtained M/# shows an index for evaluating allowable recording amount of the recording material.

<Calculation Method of Diffraction Efficiency>

Internal diffraction efficiency $\eta_1$(%)=Intensity $Pd$ of diffracted light/(Intensity $Pt$ of transmitted light+ Intensity $Pd$ of diffracted light)×100

The obtained internal diffraction efficiency indicates a ratio of the transmitted light to the diffracted light at reconstruction of the hologram.

On the other hand, the obtained external diffraction efficiency indicates a ratio of the intensity (Pr) of incident light to the hologram medium to the intensity (Pd) of diffracted light of the medium.

External diffraction efficiency $\eta_2$(%)=(Intensity $Pr$ of incident light/intensity $Pd$ of diffracted light)×100

(Shrinkage Percentage)

Figure 8:
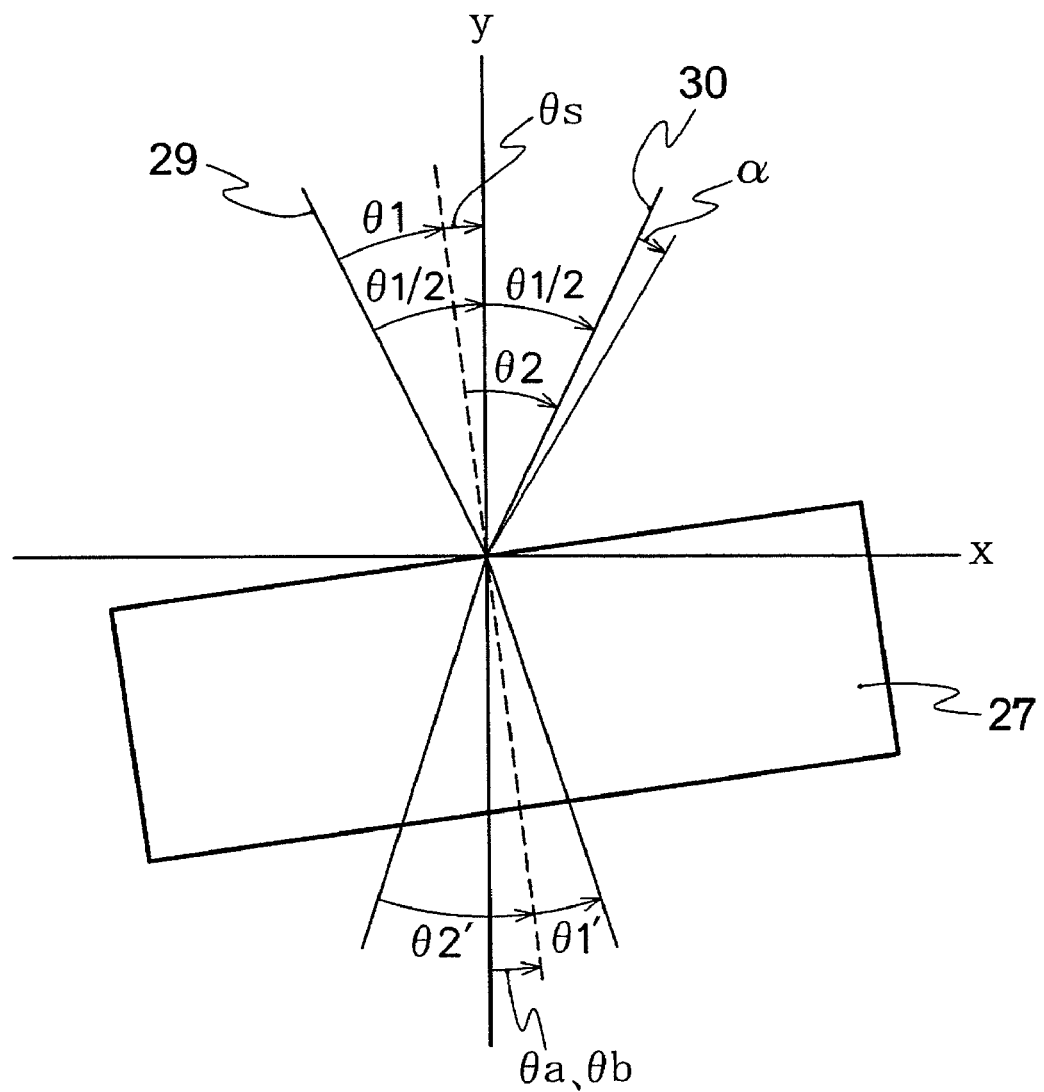
FIG. 8 is a diagrammatic view for explaining a difference (de-tune angle) between the angle at hologram recording and the angle at reconstruction in Example.
Figure 9:
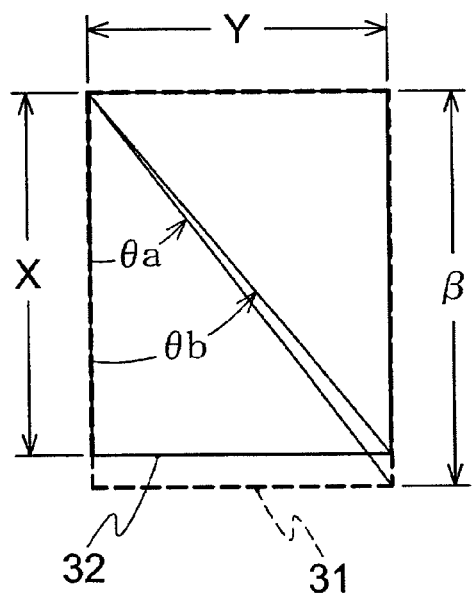
FIG. 9 is another diagrammatic view for explaining shrinkage percentage at hologram recording in Example.

A shrinkage percentage is calculated from a difference between the incidence angle at recording and the angle when the diffraction efficiency reaches a peak. Related equations are shown below. FIG. 8 is a diagrammatic view for explaining a difference (de-tune angle) between the angle at hologram recording and the angle at reconstruction, and FIG. 9 is a diagrammatic view for explaining a calculation method of shrinkage percentage.

$$\theta'_1 = \sin^{-1}\left(\frac{\sin\theta_1}{n}\right)$$

$$\theta'_2 = \sin^{-1}\left(\frac{\sin\theta_2}{n}\right)$$

$$\theta a = \frac{\theta'_2(\alpha = 0) - \theta'_1}{2}$$

$$\theta b = \frac{\theta'_2(\alpha = De\text{-tune angle}) - \theta'_1}{2}$$

$$\tan\theta a = Y$$

$$\tan\theta b = \frac{Y}{X}$$

$$\frac{\tan\theta a}{\tan\theta b} = X$$

Shrinkage percentage = $\beta - 1 (\beta = 1)$
$$= 1 - \frac{\tan\theta a}{\tan\theta b}$$

In the equations and diagrammatic views of FIG. 8 and FIG. 9, numeral 31 represents a sample before shrinkage, numeral 32 represents a sample after shrinkage, numeral 27 represents a sample, $\theta_{1/2}$ represents an angle of reference beam and an angle of light from an object (25 deg. in this device), $\alpha$ represents a de-tune angle, $\theta$s represents an angle of a sample, n represents a refractive index, numeral 29 represents light from an object, numeral 30 represents a reference beam, $\beta$ represents a length of a sample before shrinkage, X represents a length of a sample after shrinkage and Y represents a width of a sample.

In several seconds to several tens minutes after the above-mentioned operation, interference pattern could be recorded by photo-polymerization with good repeatability. When this medium for recording is used, developing and fixing operations are not required, and generated holograms are stably maintained. This recording medium had the same performance even after being left for one week at room temperature (25° C.). The recording of the holograms could be easily fixed by overall exposure with natural light, UV light or LED light (532 nm and 405 nm) and maintained stably. There is no problem with the use of these light sources.

(4) Recording of Hologram Digital Data on the Fluorine-Containing Volume Holographic Data Recording Medium A fluorine-containing volume holographic data recording medium for hologram digital data recording was prepared by sandwiching the composition for fluorine-containing volume holographic data recording prepared in (1) above between a 0.5 mm thick glass substrate (50×50 mm square) subjected to aluminum deposition treatment and a 0.5 mm thick glass substrate subjected to antireflection treatment as a cover glass by using PET spacers of 188 µm. The hologram digital data (page data) was recorded at 25° C. with a polarization collinear system [trade name SHOT-1000G available from PULSTEC INDUSTRIAL CO., LTD.), and recording sensitivity, an amount of spatial shift distance, SN ratio (SNR) and Bit Error Rate (BER) were measured. The recording conditions are as mentioned below.

(Recording Conditions)

Light source for recording: Nd: YVO4 (532 nm±1 nm)
Focus servo light source: He—Ne CW laser (632.8 nm±1 nm)
Light intensity: 6 mW/cm$^2$ DMD is used on spatial light modulator element.
High performance CMOS sensor is used on a detector.
Page data: Area of 192×192 pixels (1.6 KB/page data)

Figure 10:
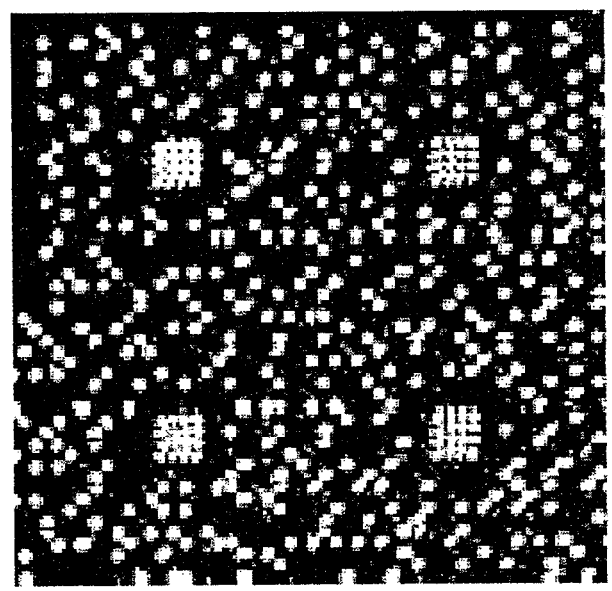
FIG. 10 shows the volume holographic data recording medium subjected to recording of hologram digital data in Example 1.

The results are shown in Table 1, and FIG. 10 shows the volume holographic data recording medium subjected to recording of hologram digital data.

Example 2

A composition for fluorine-containing volume holographic data recording material was prepared in the same manner as in Example 1 except that 1 g of propylene glycol 400 dimethacrylate was used instead of ethylene oxide bisphenol A diacrylate and propoxylated ethoxylated dimethacrylate as a liquid monomer. With respect to the refractive indexes of the liquid monomers, the refractive index of propylene glycol 400 dimethacrylate was 1.450 and the refractive index of N-acryloyl morpholine was 1.506, and the average refractive index of the mixture of base polymer and photo-initiator was 1.373. Then, (2) preparation of fluorine-containing volume holographic data recording medium, (3) measurement of hologram characteristics of fluorine-containing volume holographic data recording medium and (4) recording of hologram digital data on the fluorine-containing volume holographic data recording medium were carried out in the same manner as in Example 1. The results are shown in Table 1.

Comparative Example 1

A composition for fluorine-containing volume holographic data recording material was prepared in the same manner as in Example 2 except that 1 g of polystyrene (weight average molecular weight measured by GPC analysis using tetrahydrofuran (THF) as a solvent: 230,000) was used instead of the base polymer prepared in Example 2 and 2.5 g of a plasticizer, i.e., diethyl sebacate was used. With respect to the refractive indexes of the liquid monomers, the refractive index of ethylene oxide bisphenol A diacrylate was 1.519, the refractive index of N-acryloyl morpholine was 1.506, the refractive index of propoxylated ethoxylated dimethacrylate was 1.456, and the average refractive index of the mixture of base polymer and photo-initiator was 1.373. Then, (2) preparation of fluorine-containing volume holographic data recording medium and (3) comparative measurement of hologram characteristics of fluorine-containing volume holographic data recording medium were carried out in the same manner as in Example 1. The results are shown in Table 1.

Comparative Example 2

Recording of hologram was carried out in the same manner as in Example 1 except that the fluorine-containing holographic data recording medium used in Example 1 was changed to a standard medium (Aprilis: Product No. HMC-050-G-12-D-400), and the results of measurement were studied. The results are shown in Table 1.

TABLE 1

|  | Ex. 1 | Ex. 2 | Com. Ex. 1 | Com. Ex. 2 |
| --- | --- | --- | --- | --- |
| Substrate | Glass | Glass | Glass | Glass |
| Base polymer (a) |  |  |  |  |
| Kind of cure site | Hydroxyl group | Hydroxyl group | — | — |
| Fluorine content (%) | 60.1 | 60.1 | 0 | 0 |

TABLE 1-continued

|  | Ex. 1 | Ex. 2 | Com. Ex. 1 | Com. Ex. 2 |
| --- | --- | --- | --- | --- |
| Film thickness (μm) | 188 | 188 | 188 | 400 |
| Optimum exposure (mJ/cm$^2$) | 110 | 170 | 169 | 150 |
| Light source wavelength (nm) | 532 | 532 | 532 | 532 |
| M/# | 17.4 | 11.0 | 0.3 | 4.5 |
| Number of multiple recordings (times) | 119 | 119 | 119 | 119 |
| Shrink percentage (%) | 0.23 | 3 | 15 | 0.3 |
| Recording sensitivity (mJ/cm$^2$) | 0.00125 | — | — | 1.4 |
| Amount of spatial shift distance (μm) | 0.3 | — | — | 3 |
| SNR | 6.286 | — | — | — |
| BER | $7.65 \times 10^{-5}$ | — | — | $3.90 \times 10^{-3}$ |

Example 3

A composition for fluorine-containing volume holographic data recording material was prepared in the same manner as in Example 1 except that a base polymer having a number average molecular weight of 33,000 and a weight average molecular weight of 75,000 was used instead of the base polymer having a number average molecular weight of 70,000 and a weight average molecular weight of 150,000. With respect to the refractive indexes of the liquid monomers, the refractive index of ethylene oxide bisphenol A diacrylate was 1.519, the refractive index of N-acryloyl morpholine was 1.506, the refractive index of propoxylated ethoxylated dimethacrylate was 1.456, and the average refractive index of the mixture of base polymer and photo-initiator was 1.373. Then, (2) preparation of fluorine-containing volume holographic data recording medium, (3) measurement of hologram characteristics of fluorine-containing volume holographic data recording medium and (4) recording of hologram digital data on the fluorine-containing volume holographic data recording medium were carried out in the same manner as in Example 1. The results are shown in Table 2.

Example 4

A composition for fluorine-containing volume holographic data recording material was prepared in the same manner as in Example 1 except that a base polymer having a number average molecular weight of 10,500 and a weight average molecular weight of 15,000 was used instead of the base polymer having a number average molecular weight of 70,000 and a weight average molecular weight of 150,000. With respect to the refractive indexes of the liquid monomers, the refractive index of ethylene oxide bisphenol A diacrylate was 1.519, the refractive index of N-acryloyl morpholine was 1.506, the refractive index of propoxylated ethoxylated dimethacrylate was 1.456, and the average refractive index of the mixture of base polymer and photo-initiator was 1.373. Then, (2) preparation of fluorine-containing volume holographic data recording medium, (3) measurement of hologram characteristics of fluorine-containing volume holographic data recording medium and (4) recording of hologram digital data on the fluorine-containing volume holographic data recording medium were carried out in the same manner as in Example 1. The results are shown in Table 2.

Example 5

To the composition for fluorine-containing volume holographic data recording material of Example 1 were further added 6 g of trimethylolpropane diallyl ether, 1.6 g of trimethylolpropane tris-3-mercaptopropionate as a crosslinking agent, 0.3 g of 2,4,6-tris(trichloromethyl)-1,3,5-triazine as a photo-initiator and 0.0441 g of 10[3-[4-(dimethylamino)phenyl]-1-oxo-2-propenyl]-2,3,6,7-tetrahydro-1,1,7,7-tetramethyl-1H,5H,11H-[1]benzopyrano[6,7,8-ij]quinolizin-11-one as a dye sensitizer, followed by allowing to stand at room temperature for two days.

As a result, a uniform transparent curable composition for fluorine-containing volume holographic data recording material was prepared. With respect to the refractive index of the liquid monomer other than those used in Example 1, the refractive index of trimethylolpropane diallyl ether was 1.451, and the average refractive index of the mixture of base polymer and photo-initiator was 1.373. Then, (2) preparation of fluorine-containing volume holographic data recording medium, (3) measurement of hologram characteristics of fluorine-containing volume holographic data recording medium and (4) recording of hologram digital data on the fluorine-containing volume holographic data recording medium were carried out in the same manner as in Example 1. The results are shown in Table 2.

Example 6

To the composition for fluorine-containing volume holographic data recording material of Example 1 were further added 6.7 g of pentaerythritol triallyl ether, 0.9 g of trimethylolpropane tris-3-mercaptopropionate as a crosslinking agent, 0.3 g of 2,4,6-tris(trichloromethyl)-1,3,5-triazine as a photo-initiator and 0.0441 g of 10[3-[4-(dimethylamino)phenyl]-1-oxo-2-propenyl]-2,3,6,7-tetrahydro-1,1,7,7-tetramethyl-1H,5H,11H-[1]benzopyrano[6,7,8-ij]quinolizin-11-one as a dye sensitizer, followed by allowing to stand at room temperature for two days.

As a result, a uniform transparent curable composition for fluorine-containing volume holographic data recording material was prepared. With respect to the refractive index of the liquid monomer other than those used in Example 1, the refractive index of pentaerythritol triallyl ether was 1.454, and the average refractive index of the mixture of base polymer and photo-initiator was 1.373. Then, (2) preparation of fluorine-containing volume holographic data recording medium, (3) measurement of hologram characteristics of fluorine-containing volume holographic data recording medium and (4) recording of hologram digital data on the fluorine-containing volume holographic data recording medium were carried out in the same manner as in Example 1. The results are shown in Table 2.

Example 7

To 3.5 g of a base polymer, i.e., a fluorine-containing polymer (number average molecular weight measured by GPC analysis using tetrahydrofuran (THF) as a solvent: 70,000, weight average molecular weight: 150,000, fluorine content: 60.1%) having hydroxy group at an end of its side chain and consisting of a homopolymer comprising perfluoro-(1,1,9,9-tetrahydro-2,5-bistrifluoromethyl-3,6-dioxanonenol)($CH_2$=$CFCF_2OCF(CF_3)CF_2OCF(CF_3)CH_2OH$) as a structural unit were added 2 g of ethylene oxide bisphenol A diacrylate, 2 g of propylene oxide (PO)-modified trimethylolpropane triacrylate and 2 g of propoxylated ethoxylated bisphenol A diacrylate as liquid monomers, 3 g of trimethylolpropane polyglycidyl ether and 3.5 g of EPOLIGHT 1500NP (available from KYOEISHA CHEMICAL CO., LTD.) as crosslinking agents, 0.1 g of San-Aid SI-60 (available from SANSHIN CHEMICAL INDUSTRY CO., LTD.) as a curing catalyst, 0.3 g of 2,4,6-tris(trichloromethyl)-1,3,5-triazine as a photo-initiator and 0.0441 g of 10[3-[4-(dimethylamino)phenyl]-1-oxo-2-propenyl]-2,3,6,7-tetrahydro-1,1,7,7-tetramethyl-1H,5H,11H-[1]benzopyrano[6,7,8-ij]quinolizin-11-one as a dye sensitizer, followed by allowing to stand at 60° C. for six hours.

As a result, a uniform transparent curable composition for fluorine-containing volume holographic data recording material was prepared. With respect to the refractive index of the liquid monomers other than those used in Example 1, the refractive index of PO-modified trimethylolpropane triacrylate was 1.459, the refractive index of propoxylated ethoxylated bisphenol A diacrylate was 1.461, and the average refractive index of the mixture of base polymer and photo-initiator was 1.373. Then, (2) preparation of fluorine-containing volume holographic data recording medium, (3) measurement of hologram characteristics of fluorine-containing volume holographic data recording medium and (4) recording of hologram digital data on the fluorine-containing volume holographic data recording medium were carried out in the same manner as in Example 1. The results are shown in Table 2.

Example 8

Preparation was carried out in the same manner as in Example 7 except that ethoxylated bisphenol A dimethacrylate was used instead of 2 g of ethylene oxide bisphenol A diacrylate.

As a result, a uniform transparent curable composition for fluorine-containing volume holographic data recording material was prepared. With respect to the refractive index of the liquid monomer other than those used in Example 7, the refractive index of ethoxylated bisphenol A dimethacrylate was 1.501, and the average refractive index of the mixture of base polymer and photo-initiator was 1.373. Then, (2) preparation of fluorine-containing volume holographic data recording medium, (3) measurement of hologram characteristics of fluorine-containing volume holographic data recording medium and (4) recording of hologram digital data on the fluorine-containing volume holographic data recording medium were carried out in the same manner as in Example 1. The results are shown in Table 3.

Example 9

In Example 7, to 3.8 g of a base polymer, i.e., a fluorine-containing polymer (number average molecular weight measured by GPC analysis using tetrahydrofuran (THF) as a solvent: 70,000, weight average molecular weight: 150,000, fluorine content: 60.1%) having hydroxy group at an end of its side chain and consisting of a homopolymer comprising perfluoro-(1,1,9,9-tetrahydro-2,5-bistrifluoromethyl-3,6-dioxanonenol)($CH_2$=$CFCF_2OCF(CF_3)CF_2OCF(CF_3)CH_2OH$) as a structural unit were added 2 g of ethylene oxide bisphenol A diacrylate, 0.8 g of PO-modified trimethylolpropane triacrylate, 3.3 g of propoxylated ethoxylated bisphenol A diacrylate and 1.7 g of propoxylated ethoxylated dimethacrylate as liquid monomers, 5.3 g of trimethylolpropane polyglycidyl ether, 2.5 g of EPOLIGHT 1600 (available from KYOEISHA CHEMICAL CO., LTD.) and 1.3 g of trimethylolpropane tris-3-mercaptopropionate as crosslinking agents, 0.1 g of tetraethylammonium chloride as a curing catalyst, 0.3 g of 2,4,6-tris(trichloromethyl)-1,3,5-triazine as a photo-initiator and 0.0441 g of 10[3-[4-(dimethylamino)phenyl]-1-oxo-2-propenyl]-2,3,6,7-tetrahydro-1,1,7,7-tetramethyl-1H,5H, 11H-[1]benzopyrano[6,7,8-ij]quinolizin-11-one 11-one as a dye sensitizer, followed by allowing to stand at room temperature for five days.

As a result, a uniform transparent curable composition for fluorine-containing volume holographic data recording material was prepared. With respect to the refractive index of the liquid monomer other than those used in Example 7, the refractive index of propoxylated ethoxylated dimethacrylate was 1.456, and the average refractive index of the mixture of base polymer and photo-initiator was 1.373. Then, (2) preparation of fluorine-containing volume holographic data recording medium, (3) measurement of hologram characteristics of fluorine-containing volume holographic data recording medium and (4) recording of hologram digital data on the fluorine-containing volume holographic data recording medium were carried out in the same manner as in Example 1. The results are shown in Table 3.

Example 10

Preparation was carried out in the same manner as in Example 9 except that 1.3 g of N-acryloyl morpholine was used instead of 2 g of ethylene oxide bisphenol A diacrylate and 3 g of ethoxylated bisphenol A dimethacrylate was used instead of 1.7 g of propoxylated ethoxylated dimethacrylate.

As a result, a uniform transparent curable composition for fluorine-containing volume holographic data recording material was prepared. With respect to the refractive index of the liquid monomers other than those used in Example 9, the refractive index of N-acryloyl morpholine was 1.510, the refractive index of ethoxylated bisphenol A dimethacrylate was 1.501, and the average refractive index of the mixture of base polymer and photo-initiator was 1.373. Then, (2) preparation of fluorine-containing volume holographic data recording medium, (3) measurement of hologram characteristics of fluorine-containing volume holographic data recording medium and (4) recording of hologram digital data on the fluorine-containing volume holographic data recording medium were carried out in the same manner as in Example 1. The results are shown in Table 3.

Example 11

Preparation was carried out in the same manner as in Example 1 except that 0.05 g of dicyclohexylmethane diisocyanate was used as a crosslinking agent and 0.0001 g of dibutyltin was used as a curing catalyst, followed by allowing to stand at room temperature for five days.

As a result, a uniform transparent curable composition for fluorine-containing volume holographic data recording material was prepared. Then, (2) preparation of fluorine-containing volume holographic data recording medium, (3) measurement of hologram characteristics of fluorine-containing volume holographic data recording medium and (4) recording of hologram digital data on the fluorine-containing volume holographic data recording medium were carried out in the same manner as in Example 1. The results are shown in Table 3.

Example 12

In Example 11, before adding 0.05 g of dicyclohexylmethane diisocyanate as a crosslinking agent and 0.0001 g of dibutyltin as a curing catalyst, 4.2 g of acryloyl isocyanate ($NCO-CH_2CH_2OCOCH=CH_2$) as a crosslinking agent and 0.0017 g of dibutyltin as a reaction catalyst were added to 2.5 g of a base polymer, i.e., a fluorine-containing polymer (number average molecular weight measured by GPC analysis using tetrahydrofuran (THF) as a solvent: 70,000, weight average molecular weight: 150,000, fluorine content: 60.1%) having hydroxy group at an end of its side chain and consisting of a homopolymer comprising perfluoro-(1,1,9,9-tetrahydro-2,5-bistrifluoromethyl-3,6-dioxanonenol) ($CH_2=CFCF_2OCF(CF_3)CF_2OCF(CF_3)CH_2OH$) as a structural unit, thereby converting the end of its side chain to acryloyl.

Preparation was carried out in the same manner as in Example 11 except the above-mentioned procedures, followed by allowing to stand at room temperature for two days. The average refractive index of the mixture of base polymer and photo-initiator was 1.383. Then, (2) preparation of fluorine-containing volume holographic data recording medium, (3) measurement of hologram characteristics of fluorine-containing volume holographic data recording medium and (4) recording of hologram digital data on the fluorine-containing volume holographic data recording medium were carried out in the same manner as in Example 1. The results are shown in Table 3.

As a result, a uniform transparent curable composition for fluorine-containing volume holographic data recording material was prepared. As compared with Example 11, a wave form in the single analysis illustrated a smooth curve, and scattering had been inhibited.

Example 13

Preparation was carried out in the same manner as in Example 1 except that the end of the side chain of the base polymer, perfluoro-(1,1,9,9-tetrahydro-2,5-bistrifluoromethyl-3,6-dioxanonenol)($CH_2=CFCF_2OCF(CF_3)CF_2OCF(CF_3)CH_2OH$) was modified to ester derivative ($CH_2=CFCF_2OCF(CF_3)CF_2OCF(CF_3)CH_2COOCH_3$). As a result, a uniform transparent composition for fluorine-containing volume holographic data recording material was prepared. The average refractive index of the mixture of base polymer and photo-initiator was 1.385. Then, (2) preparation of fluorine-containing volume holographic data recording medium, (3) measurement of hologram characteristics of fluorine-containing volume holographic data recording medium and (4) recording of hologram digital data on the fluorine-containing volume holographic data recording medium were carried out in the same manner as in Example 1. The results are shown in Table 4.

Example 14

Preparation was carried out in the same manner as in Example 1 except that the end of the side chain of the base polymer, perfluoro-(1,1,9,9-tetrahydro-2,5-bistrifluoromethyl-3,6-dioxanonenol)($CH_2=CFCF_2OCF(CF_3)CF_2OCF(CF_3)CH_2OH$) was modified to fluorinated derivative ($CH_2=CFCF_2OCF(CF_3)CF_2OCF(CF_3)H$). As a result, a uniform transparent composition for fluorine-containing volume holographic data recording material was prepared. The average refractive index of the mixture of base polymer and photo-initiator was 1.384. Then, (2) preparation of fluorine-containing volume holographic data recording medium, (3) measurement of hologram characteristics of fluorine-containing volume holographic data recording medium and (4) recording of hologram digital data on the fluorine-containing volume holographic data recording medium were carried out in the same manner as in Example 1. The results are shown in Table 4.

Example 15

Preparation was carried out in the same manner as in Example 1 except that the end of the side chain of the base polymer, perfluoro-(1,1,9,9-tetrahydro-2,5-bistrifluoromethyl-3,6-dioxanonenol)($CH_2$=$CFCF_2OCF(CF_3)CF_2OCF$ ($CF_3$)$CH_2OH$) was modified to cyano derivative ($CH_2$=$CFCF_2OCF(CF_3)CF_2OCF(CF_3)CN$). As a result, a uniform transparent composition for fluorine-containing volume holographic data recording material was prepared. The average refractive index of the mixture of base polymer and photo-initiator was 1.387. Then, (2) preparation of fluorine-containing volume holographic data recording medium, (3) measurement of hologram characteristics of fluorine-containing volume holographic data recording medium and (4) recording of hologram digital data on the fluorine-containing volume holographic data recording medium were carried out in the same manner as in Example 1. The results are shown in Table 4.

Example 16

Preparation was carried out in the same manner as in Example 1 except that the end of the side chain of the base polymer, perfluoro-(1,1,9,9-tetrahydro-2,5-bistrifluoromethyl-3,6-dioxanonenol)($CH_2$=$CFCF_2OCF(CF_3)CF_2OCF$ ($CF_3$)$CH_2OH$) was modified to carboxylic acid derivative ($CH_2$=$CFCF_2OCF(CF_3)CF_2OCF(CF_3)COOH$). As a result, a uniform transparent composition for fluorine-containing volume holographic data recording material was prepared. The average refractive index of the mixture of base polymer and photo-initiator was 1.381. Then, (2) preparation of fluorine-containing volume holographic data recording medium, (3) measurement of hologram characteristics of fluorine-containing volume holographic data recording medium and (4) recording of hologram digital data on the fluorine-containing volume holographic data recording medium were carried out in the same manner as in Example 1. The results are shown in Table 4.

Examples 17 to 21

Preparation was carried out in the same manner as in Examples 1, 3, 4, 11 and 12 except that 1 g of Spiro ester derivative:

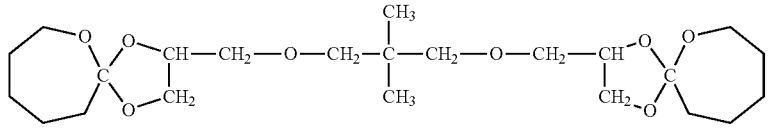

was added in the respective examples. As a result, uniform transparent compositions for fluorine-containing volume holographic data recording material were prepared. Then, (2) preparation of fluorine-containing volume holographic data recording medium, (3) measurement of hologram characteristics of fluorine-containing volume holographic data recording medium and (4) recording of hologram digital data on the fluorine-containing volume holographic data recording medium were carried out in the same manner as in Example 1. The results are shown in Table 4 and 5.

Examples 22 to 26

Preparation was carried out in the same manner as in Examples 1, 3, 4, 11 and 12 except that 1 g of spiro ester derivative:

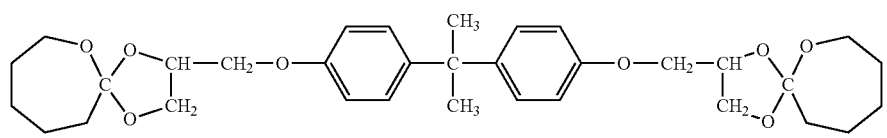

was added in the respective examples. As a result, uniform transparent compositions for fluorine-containing volume holographic data recording material were prepared. Then, (2) preparation of fluorine-containing volume holographic data recording medium, (3) measurement of hologram characteristics of fluorine-containing volume holographic data recording medium and (4) recording of hologram digital data on the fluorine-containing volume holographic data recording medium were carried out in the same manner as in Example 1. The results are shown in Table 5 and 6.

Examples 27 to 31

Preparation was carried out in the same manner as in Examples 17 to 21 except that $CH_2$=$CFCF_2OCF(CF_3)$ $CF_2OCF(CF_3)CH_2OCH_2CHOCH_2$ was used instead of the base polymer, perfluoro-(1,1,9,9-tetrahydro-2,5-bistrifluoromethyl-3,6-dioxanonenol)($CH_2$=$CFCF_2OCF(CF_3)$ $CF_2OCF(CF_3)CH_2OH$). As a result, uniform transparent compositions for fluorine-containing volume holographic data recording material were prepared. The average refractive index of the mixture of base polymer and photo-initiator was 1.383. Then, (2) preparation of fluorine-containing volume holographic data recording medium, (3) measurement of hologram characteristics of fluorine-containing volume holographic data recording medium and (4) recording of hologram digital data on the fluorine-containing volume holographic data recording medium were carried out in the same manner as in Example 1. The results are shown in Table 7.

TABLE 2

|  | Ex. 3 | Ex. 4 | Ex. 5 | Ex. 6 | Ex. 7 |
|---|---|---|---|---|---|
| Substrate | Glass | Glass | Glass | Glass | Glass |
| Base polymer (a) | | | | | |
| Kind of cure site | Hydroxyl group | Hydroxyl group | Hydroxyl group | Hydroxyl group | Hydroxyl group |
| Fluorine content (%) | 60.1 | 60.1 | 60.1 | 60.1 | 60.1 |
| Film thickness (μm) | 188 | 188 | 188 | 188 | 188 |
| Optimum exposure (mJ/cm$^2$) | 200 | 220 | 300 | 300 | 220 |
| Light source wavelength (nm) | 532 | 532 | 532 | 532 | 532 |
| M/# | 9.1 | 8.0 | 7.1 | 7.1 | 6.1 |
| Number of multiple recordings (times) | 119 | 119 | 119 | 119 | 119 |
| Shrink percentage (%) | 0.13 | 0.11 | 0.10 | 0.10 | 0.10 |
| Recording sensitivity (mJ/cm$^2$) | 0.00255 | 0.00325 | 0.00625 | 0.00655 | 0.00925 |
| Amount of spatial shift distance (μm) | 0.3 | 0.3 | 0.3 | 0.3 | 0.3 |
| SNR | 6.879 | 6.241 | 6.234 | 6.279 | 6.041 |
| BER | $7.12 \times 10^{-5}$ | $6.72 \times 10^{-4}$ | $6.83 \times 10^{-4}$ | $6.62 \times 10^{-4}$ | $6.92 \times 10^{-4}$ |

TABLE 3

|  | Ex. 8 | Ex. 9 | Ex. 10 | Ex. 11 | Ex. 12 |
|---|---|---|---|---|---|
| Substrate | Glass | Glass | Glass | Glass | Glass |
| Base polymer (a) | | | | | |
| Kind of cure site | Hydroxyl group | Hydroxyl group | Hydroxyl group | Hydroxyl group | Hydroxyl group |
| Fluorine content (%) | 60.1 | 60.1 | 60.1 | 60.1 | 60.1 |
| Film thickness (μm) | 188 | 188 | 188 | 188 | 188 |
| Optimum exposure (mJ/cm$^2$) | 300 | 350 | 360 | 320 | 350 |
| Light source wavelength (nm) | 532 | 532 | 532 | 532 | 532 |
| M/# | 6.1 | 6.0 | 5.7 | 7.1 | 6.0 |
| Number of multiple recordings (times) | 119 | 119 | 119 | 119 | 119 |
| Shrink percentage (%) | 0.10 | 0.10 | 0.10 | 0.15 | 0.10 |
| Recording sensitivity (mJ/cm$^2$) | 0.0102 | 0.0106 | 0.0125 | 0.0080 | 0.0116 |
| Amount of spatial shift distance (μm) | 0.3 | 0.3 | 0.3 | 0.3 | 0.3 |
| SNR | 6.034 | 6.094 | 6.121 | 6.734 | 6.023 |
| BER | $6.93 \times 10^{-4}$ | $6.92 \times 10^{-4}$ | $7.32 \times 10^{-4}$ | $6.13 \times 10^{-4}$ | $7.92 \times 10^{-4}$ |

TABLE 4

|  | Ex. 13 | Ex. 14 | Ex. 15 | Ex. 16 | Ex. 17 |
|---|---|---|---|---|---|
| Substrate | Glass | Glass | Glass | Glass | Glass |
| Base polymer (a) | | | | | |
| Kind of cure site | — | — | — | Carboxyl group | Hydroxyl group |
| Fluorine content (%) | 60.1 | 60.1 | 60.1 | 60.1 | 60.1 |
| Film thickness (μm) | 188 | 188 | 188 | 188 | 188 |
| Optimum exposure (mJ/cm$^2$) | 160 | 170 | 150 | 160 | 170 |
| Light source wavelength (nm) | 532 | 532 | 532 | 532 | 532 |
| M/# | 11.7 | 12.1 | 12.0 | 12.7 | 15.1 |
| Number of multiple recordings (times) | 119 | 119 | 119 | 119 | 119 |
| Shrink percentage (%) | 0.23 | 0.23 | 0.23 | 0.23 | 0.05 |
| Recording sensitivity (mJ/cm$^2$) | 0.00325 | 0.00334 | 0.00316 | 0.00325 | 0.00134 |
| Amount of spatial shift distance (μm) | 0.3 | 0.3 | 0.3 | 0.3 | 0.3 |
| SNR | 6.121 | 6.234 | 6.123 | 6.141 | 6.234 |
| BER | $7.91 \times 10^{-5}$ | $7.73 \times 10^{-5}$ | $7.92 \times 10^{-5}$ | $7.71 \times 10^{-5}$ | $7.73 \times 10^{-5}$ |

TABLE 5

|  | Ex. 18 | Ex. 19 | Ex. 20 | Ex. 21 | Ex. 22 |
|---|---|---|---|---|---|
| Substrate | Glass | Glass | Glass | Glass | Glass |
| Base polymer (a) | | | | | |
| Kind of cure site | Hydroxyl group | Hydroxyl group | Hydroxyl group | Hydroxyl group | Hydroxyl group |
| Fluorine content (%) | 60.1 | 60.1 | 60.1 | 60.1 | 60.1 |
| Film thickness (μm) | 188 | 188 | 188 | 188 | 188 |
| Optimum exposure (mJ/cm$^2$) | 190 | 200 | 720 | 700 | 170 |
| Light source wavelength (nm) | 532 | 532 | 405 | 405 | 532 |
| M/# | 13.0 | 12.1 | 10.1 | 12.1 | 15.5 |
| Number of multiple recordings (times) | 119 | 119 | 221 | 221 | 119 |
| Shrink percentage (%) | 0.05 | 0.05 | 0.05 | 0.05 | 0.05 |
| Recording sensitivity (mJ/cm$^2$) | 0.00136 | 0.00128 | 0.00134 | 0.00128 | 0.00134 |
| Amount of spatial shift distance (μm) | 0.3 | 0.3 | 0.3 | 0.3 | 0.3 |
| SNR | 6.223 | 6.241 | 6.034 | 6.241 | 6.234 |
| BER | $7.82 \times 10^{-5}$ | $7.81 \times 10^{-5}$ | $6.23 \times 10^{-4}$ | $7.81 \times 10^{-5}$ | $7.73 \times 10^{-5}$ |

TABLE 6

|  | Ex. 23 | Ex. 24 | Ex. 25 | Ex. 26 |
|---|---|---|---|---|
| Substrate | Glass | Glass | Glass | Glass |
| Base polymer (a) | | | | |
| Kind of cure site | Hydroxyl group | Hydroxyl group | Hydroxyl group | Hydroxyl group |
| Fluorine content (%) | 60.1 | 60.1 | 60.1 | 60.1 |
| Film thickness (μm) | 188 | 188 | 188 | 188 |
| Optimum exposure (mJ/cm$^2$) | 190 | 200 | 720 | 700 |
| Light source wavelength (nm) | 532 | 532 | 405 | 405 |
| M/# | 13.5 | 12.5 | 10.5 | 12.5 |
| Number of multiple recordings (times) | 119 | 119 | 221 | 221 |
| Shrink percentage (%) | 0.05 | 0.05 | 0.05 | 0.05 |
| Recording sensitivity (mJ/cm$^2$) | 0.00136 | 0.00128 | 0.00134 | 0.00128 |
| Amount of spatial shift distance (μm) | 0.3 | 0.3 | 0.3 | 0.3 |
| SNR | 6.223 | 6.241 | 6.034 | 6.241 |
| BER | $7.82 \times 10^{-5}$ | $7.81 \times 10^{-5}$ | $6.23 \times 10^{-4}$ | $7.81 \times 10^{-5}$ |

TABLE 7

|  | Ex. 27 | Ex. 28 | Ex. 29 |
|---|---|---|---|
| Substrate | Glass | Glass | Glass |
| Base polymer (a) | | | |
| Kind of cure site | Glycidyl group | Glycidyl group | Glycidyl group |
| Fluorine content (%) | 60.1 | 60.1 | 60.1 |
| Film thickness (μm) | 188 | 188 | 188 |
| Optimum exposure (mJ/cm$^2$) | 170 | 190 | 240 |
| Light source wavelength (nm) | 532 | 532 | 532 |
| M/# | 10.1 | 9.0 | 8.1 |
| Number of multiple recordings (times) | 119 | 119 | 119 |
| Shrink percentage (%) | 0.05 | 0.05 | 0.05 |
| Recording sensitivity (mJ/cm$^2$) | 0.0134 | 0.0145 | 0.0128 |
| Amount of spatial shift distance (μm) | 0.3 | 0.3 | 0.3 |
| SNR | 6.034 | 5.623 | 6.241 |
| BER | $6.23 \times 10^{-4}$ | $6.82 \times 10^{-4}$ | $6.81 \times 10^{-4}$ |

TABLE 8

|  | Ex. 30 | Ex. 31 |
|---|---|---|
| Substrate | Glass | Glass |
| Base polymer (a) | | |
| Kind of cure site | Glycidyl group | Glycidyl group |
| Fluorine content (%) | 60.1 | 60.1 |
| Film thickness (μm) | 188 | 188 |
| Optimum exposure (mJ/cm$^2$) | 370 | 400 |
| Light source wavelength (nm) | 532 | 532 |
| M/# | 8.1 | 8.0 |
| Shrink percentage (%) | 0.05 | 0.05 |
| Recording sensitivity (mJ/cm$^2$) | 0.0134 | 0.0128 |
| Amount of spatial shift distance (μm) | 0.3 | 0.3 |
| SNR | 5.734 | 5.241 |
| BER | $9.23 \times 10^{-4}$ | $8.81 \times 10^{-4}$ |

Example 32

Preparation was carried out in the same manner as in Examples 26 except that bis(2,4,6-trimethylbenzoyl)-phenylphosphine oxide was used as a visible light initiator instead of the use of 2,4,6-tris(trichloromethyl)-1,3,5-triazine as a photo-initiator and 10[3-[4-(dimethylamino)phenyl]-1-oxo-2-propenyl]-2,3,6,7-tetrahydro-1,1,7,7-tetramethyl-1H,5H,11H-[1]benzopyrano[6,7,8-ij]quinolizin-11-one as a dye sensitizer. As a result, a uniform transparent composition for fluorine-containing volume holographic data recording material was prepared. The average refractive index of the mixture of base polymer and visible light initiator was 1.383. Then, (2) preparation of fluorine-containing volume holographic data recording medium, (3) measurement of hologram characteristics of fluorine-containing volume holographic data recording medium and (4) recording of hologram digital data on the fluorine-containing volume holographic data recording medium were carried out in the same manner as in Example 1. The results are shown in Table 9.

Example 33

Preparation was carried out in the same manner as in Examples 26 except that 2,4,6-trimethylbenzoyl-diphenylphosphine oxide was used as a visible light initiator instead of the use of 2,4,6-tris(trichloromethyl)-1,3,5-triazine as a photo-initiator and 10[3-[4-(dimethylamino)phenyl]-1-oxo-2-propenyl]-2,3,6,7-tetrahydro-1,1,7,7-tetramethyl-1H,5H,11H-[1]benzopyrano[6,7,8-ij]quinolizin-11-one as a dye sensitizer. As a result, a uniform transparent composition for fluorine-containing volume holographic data recording material was prepared. The average refractive index of the mixture of base polymer and visible light initiator was 1.383. Then, (2) preparation of fluorine-containing volume holographic data recording medium, (3) measurement of hologram characteristics of fluorine-containing volume holographic data recording medium and (4) recording of hologram digital data on the fluorine-containing volume holographic data recording medium were carried out in the same manner as in Example 1. The results are shown in Table 9.

Example 34

Preparation was carried out in the same manner as in Examples 26 except that 2,4-diethylthioxanthone was used as a visible light initiator instead of the use of 2,4,6-tris(trichloromethyl)-1,3,5-triazine as a photo-initiator and 10[3-[4-(dimethylamino)phenyl]-1-oxo-2-propenyl]-2,3,6,7-tetrahydro-1,1,7,7-tetramethyl-1H,5H,11H-[1]benzopyrano[6,7,8-ij]quinolizin-11-one as a dye sensitizer. As a result, a uniform transparent composition for fluorine-containing volume holographic data recording material was prepared. The average refractive index of the mixture of base polymer and visible light initiator was 1.383. Then, (2) preparation of fluorine-containing volume holographic data recording medium, (3) measurement of hologram characteristics of fluorine-containing volume holographic data recording medium and (4) recording of hologram digital data on the fluorine-containing volume holographic data recording medium were carried out in the same manner as in Example 1. The results are shown in Table 9.

Example 35

Preparation was carried out in the same manner as in Examples 26 except that tetrabutylammoniumbutyltri-4-tert-butylphenylborate was used as a photo-initiator instead of 2,4,6-tris(trichloromethyl)-1,3,5-triazine and 2-[2-(2,4-dimethoxylanilino)vinyl]-1,3,3-trimethyl-3H-indoliumtetrafluoroborate was used as a dye sensitizer instead of 10[3-[4-(dimethylamino)phenyl]-1-oxo-2-propenyl]-2,3,6,7-tetrahydro-1,1,7,7-tetramethyl-1H,5H,11H-[1]benzopyrano[6,7,8-ij]quinolizin-11-one. As a result, a uniform transparent composition for fluorine-containing volume holographic data recording material was prepared. The average refractive index of the mixture of base polymer and visible light initiator was 1.383. Then, (2) preparation of fluorine-containing volume holographic data recording medium, (3) measurement of hologram characteristics of fluorine-containing volume holographic data recording medium and (4) recording of hologram digital data on the fluorine-containing volume holographic data recording medium were carried out in the same manner as in Example 1. The results are shown in Table 10.

Example 36

Preparation was carried out in the same manner as in Examples 26 except that a 25% by weight anisole solution of 3,3'-bismethoxycarbonyl-4,4'-bis-tert-butylperoxycarbonylbenzophenone, 3,4'-bismethoxycarbonyl-4,3'-bis-tert-butylperoxycarbonylbenzophenone and 4,4'-bismethoxycarbonyl-3,3'-bis-tert-butylperoxycarbonylbenzophenone was used as a photo-initiator instead of 2,4,6-tris(trichloromethyl)-1,3,5-triazine. As a result, a uniform transparent composition for fluorine-containing volume holographic data recording material was prepared. The average refractive index of the mixture of base polymer and visible light initiator was 1.383. Then, (2) preparation of fluorine-containing volume holographic data recording medium, (3) measurement of hologram characteristics of fluorine-containing volume holographic data recording medium and (4) recording of hologram digital data on the fluorine-containing volume holographic data recording medium were carried out in the same manner as in Example 1. The results are shown in Table 10.

Example 37

Preparation was carried out in the same manner as in Examples 26 except that tetrabutylammoniumbutyltri-4-tert-butylphenylborate was used as a photo-initiator instead of 2,4,6-tris(trichloromethyl)-1,3,5-triazine and 2-[2-(2-methyl-1-indolinyl)vinyl]-1,3,3-trimethyl-3H-indoliumtetrafluoroborate was used as a dye sensitizer instead of 10[3-[4-(dimethylamino)phenyl]-1-oxo-2-propenyl]-2,3,6,7-tetrahydro-1,1,7,7-tetramethyl-1H,5H,11H-[1]benzopyrano[6,7,8-ij]quinolizin-11-one. As a result, a uniform transparent composition for fluorine-containing volume holographic data recording material was prepared. The average refractive index of the mixture of base polymer and visible light initiator was 1.383. The light source wavelength of 532 nm was used for the measurement of hologram characteristics. Then, (2) preparation of fluorine-containing volume holographic data recording medium, (3) measurement of hologram characteristics of fluorine-containing volume holographic data recording medium and (4) recording of hologram digital data on the fluorine-containing volume holographic data recording medium were carried out in the same manner as in Example 1. The results are shown in Table 10.

Example 38

Preparation was carried out in the same manner as in Examples 26 except that a 25% by weight anisole solution of 3,3'-bismethoxycarbonyl-4,4'-bis-tert-butylperoxycarbonylbenzophenone, 3,4'-bismethoxycarbonyl-4,3'-bis-tert-butylperoxycarbonylbenzophenone and 4,4'-bismethoxycarbonyl-3,3'-bis-tert-butylperoxycarbonylbenzophenone was used as a photo-initiator instead of 2,4,6-tris(trichloromethyl)-1,3,5-triazine. As a result, a uniform transparent composition for fluorine-containing volume holographic data recording material was prepared. The average refractive index of the mixture of base polymer and visible light initiator was 1.383. The light source wavelength of 532 nm was used for the measurement of hologram characteristics. Then, (2) preparation of fluorine-containing volume holographic data recording medium, (3) measurement of hologram characteristics of fluorine-containing volume holographic data recording medium and (4) recording of hologram digital data on the fluorine-containing volume holographic data recording medium were carried out in the same manner as in Example 1. The results are shown in Table 11.

Example 39

Preparation was carried out in the same manner as in Examples 26 except that bis(2,4-cyclopentadien-1-yl)-bis-(2,4-difluoro-3-(1H-pyrrol-1-yl)-phenyl)titanium was used as a visible light initiator instead of the use of 2,4,6-tris(trichloromethyl)-1,3,5-triazine as a photo-initiator and 10[3-[4-(dimethylamino)phenyl]-1-oxo-2-propenyl]-2,3,6,7-tetrahydro-1,1,7,7-tetramethyl-1H,5H,11H-[1]benzopyrano[6,7,8-ij]quinolizin-11-one as a dye sensitizer. As a result, a uniform transparent composition for fluorine-containing volume holographic data recording material was prepared. The average refractive index of the mixture of base polymer and visible light initiator was 1.383. The light source wavelength of 532 nm was used for the measurement of hologram characteristics. Then, (2) preparation of fluorine-containing volume holographic data recording medium, (3) measurement of hologram characteristics of fluorine-containing volume holographic data recording medium and (4) recording of hologram digital data on the fluorine-containing volume holographic data recording medium were carried out in the same manner as in Example 1. The results are shown in Table 11.

TABLE 9

| | Ex. 32 | Ex. 33 | Ex. 34 |
|---|---|---|---|
| Substrate | Glass | Glass | Glass |
| Base polymer (a) | | | |
| Kind of cure site | Hydroxyl group | Hydroxyl group | Hydroxyl group |
| Fluorine content (%) | 60.1 | 60.1 | 60.1 |
| Film thickness (nm) | 188 | 188 | 188 |
| Optimum exposure (mJ/cm$^2$) | 100 | 120 | 90 |
| Light source wavelength (nm) | 405 | 405 | 532 |
| M/# | 12.1 | 11.2 | 10.3 |
| Number of multiple recordings (times) | 221 | 221 | 221 |
| Shrink percentage (%) | 0.05 | 0.05 | 0.05 |
| Recording sensitivity (mJ/cm$^2$) | 0.00255 | 0.00335 | 0.00225 |
| Amount of spatial shift distance (μm) | 0.3 | 0.3 | 0.3 |
| SNR | 6.321 | 6.041 | 6.243 |
| BER | $7.11 \times 10^{-5}$ | $6.92 \times 10^{-4}$ | $6.83 \times 10^{-4}$ |

TABLE 10

| | Ex. 35 | Ex. 36 | Ex. 37 |
|---|---|---|---|
| Substrate | Glass | Glass | Glass |
| Base polymer (a) | | | |
| Kind of cure site | Hydroxyl group | Hydroxyl group | Hydroxyl group |
| Fluorine content (%) | 60.1 | 60.1 | 60.1 |
| Film thickness (μm) | 188 | 188 | 188 |
| Optimum exposure (mJ/cm$^2$) | 100 | 90 | 120 |
| Light source wavelength (nm) | 405 | 405 | 532 |
| M/# | 10.5 | 11.3 | 9.1 |
| Number of multiple recordings (times) | 221 | 221 | 119 |
| Shrink percentage (%) | 0.05 | 0.05 | 0.05 |
| Recording sensitivity (mJ/cm$^2$) | 0.00675 | 0.00825 | 0.0112 |
| Amount of spatial shift distance (μm) | 0.3 | 0.3 | 0.3 |
| SNR | 6.729 | 6.541 | 6.534 |
| BER | $6.26 \times 10^{-4}$ | $6.95 \times 10^{-4}$ | $6.90 \times 10^{-4}$ |

TABLE 11

| | Ex. 38 | Ex. 39 |
|---|---|---|
| Substrate | Glass | Glass |
| Base polymer (a) | | |
| Kind of cure site | Hydroxyl group | Hydroxyl group |
| Fluorine content (%) | 60.1 | 60.1 |
| Film thickness (μm) | 188 | 188 |
| Optimum exposure (mJ/cm$^2$) | 150 | 160 |
| Light source wavelength (nm) | 532 | 532 |
| M/#, Number of multiple recordings (times) | 8.9, 119 | 8.1, 119 |
| Shrink percentage (%) | 0.05 | 0.05 |
| Recording sensitivity (mJ/cm$^2$) | 0.0136 | 0.0125 |
| Amount of spatial shift distance (μm) | 0.3 | 0.3 |
| SNR | 6.594 | 6.621 |
| BER | $6.97 \times 10^{-4}$ | $7.21 \times 10^{-4}$ |

INDUSTRIAL APPLICABILITY

According to the present invention, there can be obtained an ideal composition for fluorine-containing volume holographic data recording material being compatible with each component even without using a solvent, assuring increased fluorine content, having high recording sensitivity without becoming opaque even if a refractive index of the base polymer is lowered, and enabling high density recording.

A photo-sensitive composition can be prepared without using a specific solvent, and by using proper components in proper amounts and adjusting viscosity of the composition suitably, a composition for fluorine-containing volume holographic data recording material and a fluorine-containing volume holographic data recording medium having high hologram characteristics and good dynamic range can be obtained only by coating a thin film or a thick film on substrates or by interposing it between the substrates without a step of removing a specific solvent.

Further, with respect to the monomers, at the time of exposure of interference light, monomers diffused and transferred to a light portion exclude not-polymerized substances being present there. Namely, when plural monomers having different polymerization rates exist, monomers having a higher polymerization rate undergo reaction preferentially at a light portion in the exposure of interference light, thereby increasing concentration thereof, and on the contrary, concentration of monomers having a lower polymerization rate is increased at a dark portion.

For that reason, when selecting monomers having high refractive index as monomers having a higher polymerization rate and monomers having low refractive index as monomers having a lower polymerization rate, a difference in monomer density is generated depending on light intensity, resulting in a difference in refractive index, and thus, hologram interference fringes are recorded and formed. In this case, when monomers having higher solubility and compatibility are selected as monomers having a lower polymerization rate, they act as a solvent before the exposure, thereby making it possible to prepare the photo-sensitive solution without using a specific solvent.

In addition, by selecting kind of a viscous monomer, further thicker recording film can be formed. Also during the exposure, many monomers having a lower polymerization rate are present in a state of unreacted liquid monomer, and during polymerization of monomers having a higher polymerization rate, play the role of aiding them in the diffusion and transfer.

Also, after the exposure, the monomers having a lower polymerization rate function as a crosslinking agent. As a result, a hologram recording film having high sensitivity to the exposure, enabling high density recording and having satisfactory light fastness, heat resistance, storage stability of recording and mechanical properties after hologram recording is obtained, and a very highly practicable volume holographic data recording material and data recording medium can be obtained.

The invention claimed is:

1. Fluorine-containing volume holographic data recording media having an optical data recording layer interposed between a first substrate and a second substrate, wherein said optical data recording layer has a thickness of not less than 188 μm and is formed using a composition for fluorine-containing volume holographic data recording material to record interference fringes generated by interference of light having excellent coherence as fringes having different refractive indexes, wherein the composition comprises a base polymer (a), a liquid monomer (b) and a photo-initiator (c), said base polymer (a) is an amorphous polymer comprising a fluorine-containing monomer as a structural unit and having a fluorine content of 26 to 80% by mass, said liquid monomer (b) comprises at least one liquid monomer not containing a fluorine containing alkyl moiety (b1) initiating polymerization by means of activated species generated from the photo-initiator (c), said photo-initiator (c) is a compound causing the liquid monomer (b1) to initiate polymerization by exposure to light having excellent coherence, and a refractive index of said liquid monomer (b) is higher than an average refractive index of a mixture of the base polymer (a) and the photo-initiator (c).

2. The fluorine-containing volume holographic data recording media of claim 1, wherein the base polymer (a) is a polymer having cure site.

3. The fluorine-containing volume holographic data recording media of claim 2, wherein the liquid monomer (b) comprises two or more monomers and at least one of them is a polyfunctional monomer.

4. The fluorine-containing volume holographic data recording media of claim 1, wherein the base polymer (a) comprises a curable fluorine-containing polymer represented by the formula (1):

in which the structural unit M1 is a structural unit derived from a fluorine-containing ethylenic monomer and represented by the formula (2):

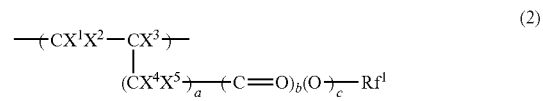

wherein $X^1$ and $X^2$ are the same or different and each is H or F; $X^3$ is H, F, $CH_3$ or $CF_3$; $X^4$ and $X^5$ are the same or different and each is H, F or $CF_3$; $Rf^1$ is an organic group in which 1 to 3 $Y^1$s ($Y^1$ is a monovalent organic group having 0 to 10 carbon atoms and hydroxyl group at its end, a monovalent organic group having 2 to 10 carbon atoms and an ethylenic carbon-carbon double bond at its end or a monovalent organic group having 2 to 100 carbon atoms and 1 to 5 crosslinkable cyclic ether structures in which hydrogen atom is replaced by fluorine atom) are bonded to a fluorine-containing alkyl group having 1 to 40 carbon atoms or a fluorine-containing alkyl group having 2 to 100 carbon atoms and ether bond; a is 0 or an integer of from 1 to 3; b and c are the same or different and each is 0 or 1, the structural unit A1 is a structural unit derived from a monomer copolymerizable with the fluorine-containing ethylenic monomer represented by the formula (2), the structural unit M1 is contained in an amount of from 0.1 to 100% by mole and the structural unit A1 is contained in an amount of from 0 to 99.9% by mole, and a number average molecular weight of the polymer is larger than 10,000 and not more than 1,000,000.

5. The fluorine-containing volume holographic data recording media of claim 1, wherein the base polymer (a) comprises a curable fluorine-containing polymer represented by the formula (3):

in which the structural unit M1 is a structural unit derived from a fluorine-containing ethylenic monomer and represented by the formula (2):

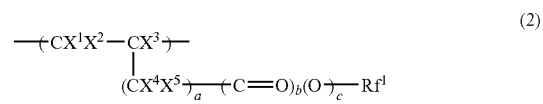

wherein $X^1$ and $X^2$ are the same or different and each is H or F; $X^3$ is H, F, $CH_3$ or $CF_3$; $X^4$ and $X^5$ are the same or different and each is H, F or $CF_3$; $Rf^1$ is an organic group in which 1 to 3 $Y^1$s ($Y^1$ is a monovalent organic group having 0 to 10 carbon atoms and hydroxyl group at its end, a monovalent organic group having 2 to 10 carbon atoms and an ethylenic carbon-carbon double bond at its end or a monovalent organic group having 2 to 100 carbon atoms and 1 to 5 crosslinkable cyclic ether structures in which hydrogen atom is replaced by fluorine atom) are bonded to a fluorine-containing alkyl group having 1 to 40 carbon atoms or a fluorine-containing alkyl group having 2 to 100 carbon atoms and ether bond; a is 0 or an integer of from 1 to 3; b and c are the same or different and each is 0 or 1, the structural unit A2 is a structural unit represented by the formula (4):

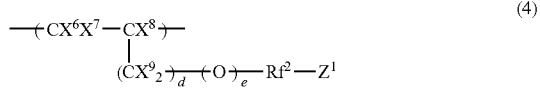

(4)

wherein $X^6$, $X^7$ and $X^8$ are the same or different and each is H or F; $X^9$ is H, F or $CF_3$; d is 0 or an integer of 1 to 2; e is 0 or 1; $Rf^2$ is a fluorine-containing alkylene group having 1 to 40 carbon atoms or a fluorine-containing alkylene group having 2 to 100 carbon atoms and ether bond; $Z^1$ is —OH, —$CH_2OH$, —COOH, carboxylic acid derivative, —$SO_3H$, sulfonic acid derivative, epoxy group, cyano group, oxetanyl group, unsaturated ester group or amino group, the structural unit A3 is a structural unit represented by the formula (5):

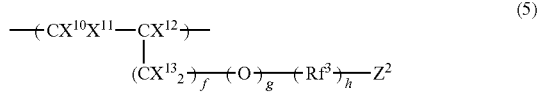

(5)

wherein $X^{10}$, $X^{11}$ and $X^{13}$ are the same or different and each is H or F; $X^{12}$ is H, F or $CF_3$; f, g and h are the same or different and each is 0 or 1; $Z^2$ is H, F or Cl; $Rf^3$ is a fluorine-containing alkylene group having 1 to 20 carbon atoms or a fluorine-containing alkylene group having 2 to 100 carbon atoms and ether bond, the structural unit M1 is contained in an amount of from 0 to 90% by mole, the structural unit A2 is contained in an amount of from 0 to 100% by mole and the structural unit A3 is contained in an amount of from 0 to 99.9% by mole, the total amount of the structural unit M1 and the structural unit A2 is from 0.1 to 100% by mole, and a number average molecular weight of the polymer is larger than 10,000 and not more than 1,000,000.

6. The fluorine-containing volume holographic data recording media of claim 1, wherein the base polymer (a) comprises a curable fluorine-containing polymer represented by the formula (6):

(6)

in which the structural unit M2 is a structural unit derived from a fluorine-containing ethylenic monomer and represented by the formula (7):

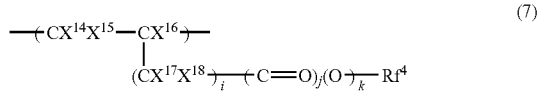

(7)

wherein $X^{14}$ and $X^{15}$ are the same or different and each is H or F; $X^{16}$ is H, F, $CH_3$ or $CF_3$; $X^{17}$ and $X^{18}$ are the same or different and each is H, F or $CF_3$; $Rf^4$ is an organic group in which 1 to 3 $Y^2$s ($Y^2$ is an organic group having 3 to 10 carbon atoms and represented by the formula (8):

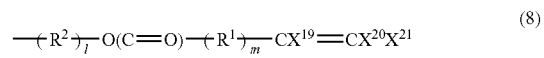

(8)

wherein $R^1$ and $R^2$ are the same or different and each is a divalent organic group which has 1 to 7 carbon atoms and may be replaced by fluorine atom; $X^{19}$ is H, F, $CH_3$ or $CF_3$; $X^{20}$ and $X^{21}$ are the same or different and each is H or F; l and m are the same or different and each is 0 or 1, an organic group having 2 to 100 carbon atoms and 1 to 5 crosslinkable cyclic ether structures represented by the formula (9):

(9)

wherein $X^{22}$ and $X^{23}$ are the same or different and each is H, F, an alkyl group having 1 to 6 carbon atoms or a fluorine-containing alkyl group having 1 to 6 carbon atoms, an organic group having 3 to 100 carbon atoms and 1 to 5 crosslinkable cyclic ether structures represented by the formula (10):

(10)

wherein Q is a monovalent or divalent organic group of monocyclic, polycyclic or heterocyclic structure having 3 to 100 carbon atoms, in which hydrogen atoms may be replaced by the above-mentioned $X^{22}$ or $X^{23}$, an organic group having 3 to 100 carbon atoms and 1 to 5 crosslinkable cyclic ether structures represented by the formula (11):

(11)

wherein $X^{24}$ to $X^{28}$ are the same or different and each is H, F, an alkyl group having 1 to 6 carbon atoms or a fluorine-containing alkyl group having 1 to 6 carbon atoms, or an organic group having 3 to 100 carbon atoms and 1 to 5 crosslinkable cyclic ether structures represented by the formula (12):

(12)

wherein $X^{29}$ to $X^{32}$ are the same or different and each is H, F, an alkyl group having 1 to 6 carbon atoms or a fluorine-containing alkyl group having 1 to 6 carbon atoms) are bonded to a fluorine-containing alkyl group having 1 to 40 carbon atoms or a fluorine-containing alkyl group having 2 to 100 carbon atoms and ether bond; i is 0 or an integer of 1 to 3; j and k are the same or different and each is 0 or 1, the structural unit A4 is a structural unit derived from a monomer copolymerizable with the fluorine-containing ethylenic monomer represented by the formula (7), the structural unit M2 is contained in an amount of from 0.1 to 100% by mole and the structural unit A4 is contained in an amount of from 0 to 99.9% by mole, and a number average molecular weight of the polymer is larger than 10,000 and not more than 1,000,000.

7. The fluorine-containing volume holographic data recording media of claim 1, wherein the liquid monomer (b) comprises two or more monomers and at least one of them is a liquid monomer having a polyether structure.

8. The fluorine-containing volume holographic data recording media of claim 1, wherein the base polymer (a) is a polymer having cure site in its side chain and the composition further comprises a polyfunctional unsaturated compound (d) undergoing crosslinking reaction with said cure site by means of heat.

9. The fluorine-containing volume holographic data recording media of claim 1, wherein the composition further comprises a dye sensitizer (e).

\* \* \* \* \*